US012775829B2

(12) United States Patent
Kim et al.

(10) Patent No.: US 12,775,829 B2
(45) Date of Patent: Oct. 27, 2026

(54) ELECTRONIC DEVICE AND METHOD OF OPERATING THE SAME

(71) Applicant: SK hynix Inc., Icheon (KR)

(72) Inventors: Ki Young Kim, Icheon (KR); Sang Eun Je, Icheon (KR)

(73) Assignee: SK hynix Inc., Icheon (KR)

( * ) Notice: Subject to any disclaimer, the term of this patent is extended or adjusted under 35 U.S.C. 154(b) by 1252 days.

(21) Appl. No.: 17/703,873

(22) Filed: Mar. 24, 2022

(65) Prior Publication Data

US 2023/0113627 A1 Apr. 13, 2023

(30) Foreign Application Priority Data

Oct. 7, 2021 (KR) ........................ 10-2021-0133461

(51) Int. Cl.

| | |
|---|---|
| ***G06N 3/065*** | (2023.01) |
| ***G06F 7/544*** | (2006.01) |
| ***G11C 11/54*** | (2006.01) |
| ***G11C 13/00*** | (2006.01) |

(Continued)

(52) U.S. Cl.

CPC ........... *G06N 3/065* (2023.01); *G06F 7/5443* (2013.01); *G11C 11/54* (2013.01); *G11C 13/0004* (2013.01); *H03M 1/36* (2013.01); *G11C 2213/15* (2013.01); *H10B 63/84* (2023.02)

(58) Field of Classification Search

CPC ...... G06N 3/065; G06N 3/0464; G11C 11/54; G11C 11/4099; G11C 2013/0054; G11C 2013/57; G11C 16/28; G11C 2211/5634; H10B 63/84; G06F 7/5443; G10B 63/00–84

See application file for complete search history.

(56) References Cited

U.S. PATENT DOCUMENTS

| | | | |
|---|---|---|---|
| 4,926,180 | A | 5/1990 | Anastassiou |
| 10,380,386 | B1 | 8/2019 | Strachan et al. |
| 10,452,472 | B1 | 10/2019 | Graves et al. |
| 10,706,922 | B2 | 7/2020 | Buchanan et al. |
| 10,802,994 | B1 | 10/2020 | Ge |

(Continued)

FOREIGN PATENT DOCUMENTS

| | | | |
|---|---|---|---|
| CN | 110649062 | A | 1/2020 |
| CN | 111478703 | A | 7/2020 |

(Continued)

OTHER PUBLICATIONS

Operational amplifier, comparator (tutorial). (Mar. 2018). https://www.mouser.com/pdfDocs/opamp_comparator_tutorial_appli-e-2.pdf (Year: 2018).*

(Continued)

*Primary Examiner* — Emily E Larocque
*Assistant Examiner* — Jerome Anthony Klosterman, II

(57) ABSTRACT

Provided herein may be an electronic device. The electronic device may include a crossbar array including a plurality of first memory cells, a plurality of second memory cells, a plurality of row lines, a plurality of first column lines and a second column line, and a plurality of analog-to-digital converters respectively coupled to the plurality of first column lines, each of the plurality of analog-to-digital converters receiving a reference voltage. Each of the plurality of analog-to-digital converters determines a maximum value allowed to the analog signal voltage based on the reference voltage.

22 Claims, 49 Drawing Sheets

(51) Int. Cl.
*H03M 1/36* (2006.01)
*H10B 63/00* (2023.01)

(56) References Cited

U.S. PATENT DOCUMENTS

| | | | |
|---|---|---|---|
| 10,970,441 | B1 | 4/2021 | Zhang et al. |
| 2012/0068872 | A1 | 3/2012 | Baker |
| 2018/0253643 | A1 | 9/2018 | Buchanan et al. |
| 2020/0218963 | A1 | 7/2020 | Yasuda et al. |
| 2020/0356847 | A1 | 11/2020 | Yi et al. |
| 2021/0365764 | A1* | 11/2021 | Eyole ..................... G06N 3/063 |
| 2022/0351032 | A1* | 11/2022 | Chou ....................... G11C 5/02 |
| 2023/0041759 | A1* | 2/2023 | Noack ................... G11C 11/221 |

FOREIGN PATENT DOCUMENTS

| | | | |
|---|---|---|---|
| CN | 111860794 | A | 10/2020 |
| CN | 112070204 | A | 12/2020 |
| CN | 112152619 | A | 12/2020 |
| CN | 113377687 | A | 9/2021 |
| KR | 1020180004026 | A | 1/2018 |
| KR | 10-2021-0000987 | A | 1/2021 |
| KR | 10-2021-0050243 | A | 5/2021 |
| KR | 10-2021-0114898 | A | 9/2021 |
| WO | 2021/140193 | A1 | 7/2021 |

OTHER PUBLICATIONS

Leibin Ni et al., "An Energy-efficient Matrix Multiplication Accelerator by Distributed In-memory Computing on Binary RRAM Crossbar," Asia and South Pacific Design Automation Conference (ASP-DAC), IEEE, Jan. 2016, pp. 280-285.

Wantong Li et al., "A 40nm RRAM Compute-in-Memory Macro Featuring On-Chip Write-Verify and Offset-Cancelling ADC References," ESSCIRC 2021—IEEE 47th European Solid State Circuits Conference (ESSCIRC), 2021.

* cited by examiner $$\begin{pmatrix} I1 \\ I2 \\ I3 \end{pmatrix} = \begin{pmatrix} G11 & G21 & G31 \\ G12 & G22 & G32 \\ G13 & G23 & G33 \end{pmatrix} \begin{pmatrix} V1 \\ V2 \\ V3 \end{pmatrix}$$

ELECTRONIC DEVICE AND METHOD OF OPERATING THE SAME

CROSS-REFERENCE TO RELATED APPLICATION

The present application claims priority under 35 U.S.C. § 119 (a) to Korean patent application number 10-2021-0133461 filed on Oct. 7, 2021, in the Korean Intellectual Property Office, the entire disclosure of which is incorporated by reference herein.

BACKGROUND

1. Technical Field

Various embodiments of the present disclosure generally relate to an electronic device, and more particularly to an electronic device and a method of operating the electronic device.

2. Related Art

In a neural network, artificial neurons obtained by simplifying functions of biological neurons may be used, and such artificial neurons may be coupled to each other through connection lines having connection weights. The connection weights are parameters of the neural network. The connection weights may be specific values of the connection lines, and may indicate connection strengths. The neural network may perform a human cognitive action or a learning process through the use of the artificial neurons. An artificial neuron may also be referred to as a node.

A neural network may include a plurality of layers. For example, the neural network may include an input layer, a hidden layer, and an output layer. The input layer may receive input data for performing learning and transfer learning data to the hidden layer, and the output layer may generate output data of the neural network based on signals received from nodes in the hidden layer. The hidden layer may be disposed between the input layer and the output layer, and may change the learning data transferred from the input layer to an easily predictable value. Nodes included in the input layer and nodes included in the hidden layer may be coupled to each other through connection lines having connection weights, and the nodes included in the hidden layer and nodes included in the output layer may be coupled to each other through connection lines having connection weights. Each of the input layer, the hidden layer, and the output layer may include a plurality of nodes.

A neural network may include a plurality of hidden layers. The neural network including the plurality of hidden layers is referred to as a deep neural network, and training the deep neural network is referred to as deep learning. A node included in a hidden layer is referred to as a hidden node. Hereinafter, it may be understood that training the neural network is to allow the neural network to learn parameters of the neural network. Further, a trained neural network may be understood to be a neural network to which learned parameters have been applied.

Here, the neural network may be trained using a preset loss function as an index. The loss function may be an index for allowing the neural network to determine an optimal weight parameter through learning. The neural network may be trained to minimize a resulting value obtained using the preset loss function.

Such a neural network refers to a computational architecture in which a biological brain is modeled. Recently, with the development of neural network technology, research into technology for extracting valid information from input data based on one or more neural network models in various types of electronic systems has been actively conducted. A convolution operation occupies a considerable part of operations required in the neural network models.

Meanwhile, an analog-to-digital converter (ADC) may be a device for converting an analog signal into a digital signal. Such an ADC may be used to implement a neural network model. For example, a neural network model may perform a multiply-accumulate (MAC) operation between a matrix and a vector through an analog signal processing scheme. In this case, the ADC may be used to convert a result of the MAC operation into a digital signal.

SUMMARY

Various embodiments of the present disclosure are directed to an electronic device and a method of operating the electronic device, which can reduce error occurring in a quantization operation of an analog-to-digital converter by adjusting an input range of the analog-to-digital converter depending on input data.

An embodiment of the present disclosure may provide for an electronic device. The electronic device may include a crossbar array including a plurality of first memory cells respectively storing a plurality of conductance values, a plurality of second memory cells each storing a maximum conductance value determined among the plurality of conductance values, a plurality of row lines coupled to the plurality of first memory cells and the plurality of second memory cells and supplying a plurality of input voltages to the plurality of first memory cells and the plurality of second memory cells, a plurality of first column lines coupled to the plurality of first memory cells and configured to respectively output a plurality of output currents generated using the plurality of input voltages and the plurality of conductance values and a second column line coupled to the plurality of second memory cells and configured to output a maximum output current generated using the plurality of input voltages and the maximum conductance value stored in each of the plurality of second memory cells. The electronic device may include a plurality of analog-to-digital converters respectively coupled to the plurality of first column lines, each of the plurality of analog-to-digital converters receiving a reference voltage and an analog signal voltage corresponding to each of the plurality of output currents and configured to generate a digital signal corresponding to the analog signal voltage based on the reference voltage, the reference voltage being generated from the maximum output current. Each of the plurality of analog-to-digital converters determines a maximum value allowed to the analog signal voltage based on the reference voltage.

An embodiment of the present disclosure may provide for an electronic device. The electronic device may include a crossbar array including a plurality of first memory cells respectively storing a plurality of conductance values, a plurality of second memory cells each storing a maximum conductance value among the plurality of conductance values, a plurality of row lines coupled to the plurality of first memory cells and the plurality of second memory cells and supplying a plurality of input voltages to the plurality of first memory cells and the second plurality of memory cells, a plurality of first column lines coupled to the plurality of first memory cells and configured to respectively output a plurality of output currents generated using the plurality of input voltages and the plurality of conductance values and a second column line coupled to the plurality of second memory cells and configured to output a maximum output current generated using the plurality of input voltages and the maximum conductance value stored in each of the plurality of second memory cells. The electronic device may include a plurality of analog-to-digital converters respectively coupled to the plurality of first column lines, each of the plurality of analog-to-digital converters receiving a reference voltage and an analog signal voltage corresponding to each of the plurality of output currents and configured to convert the analog signal voltage into a digital signal corresponding to the analog signal voltage by applying a gain corresponding to the reference voltage to the analog signal voltage, the reference voltage being generated from the maximum output current.

An embodiment of the present disclosure may provide for a method of operating an electronic device, the electronic device including a crossbar array including a plurality of row lines, a plurality of first column lines, a second column line, and a plurality of first memory cells coupled to the plurality of row lines and the plurality of first column lines, and a plurality of second memory cells coupled to the plurality of row lines and a second column line. The method may include receiving a plurality of input voltages through the plurality of row lines, generating a maximum output current based on a maximum conductance value, stored in each of the plurality of second memory cells, and the plurality of input voltages, the maximum conductance value corresponding to the largest one of a plurality of conductance values stored in the plurality of first memory cells, converting the maximum output current into a reference voltage and determining, based on the reference voltage, a maximum value allowed to an analog signal voltage that is input to each of a plurality of analog-to-digital converters respectively coupled to the plurality of first column lines.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

FIGS. 1A to 1D illustrate a neural network according to an embodiment of the present disclosure.

Figure 1A:
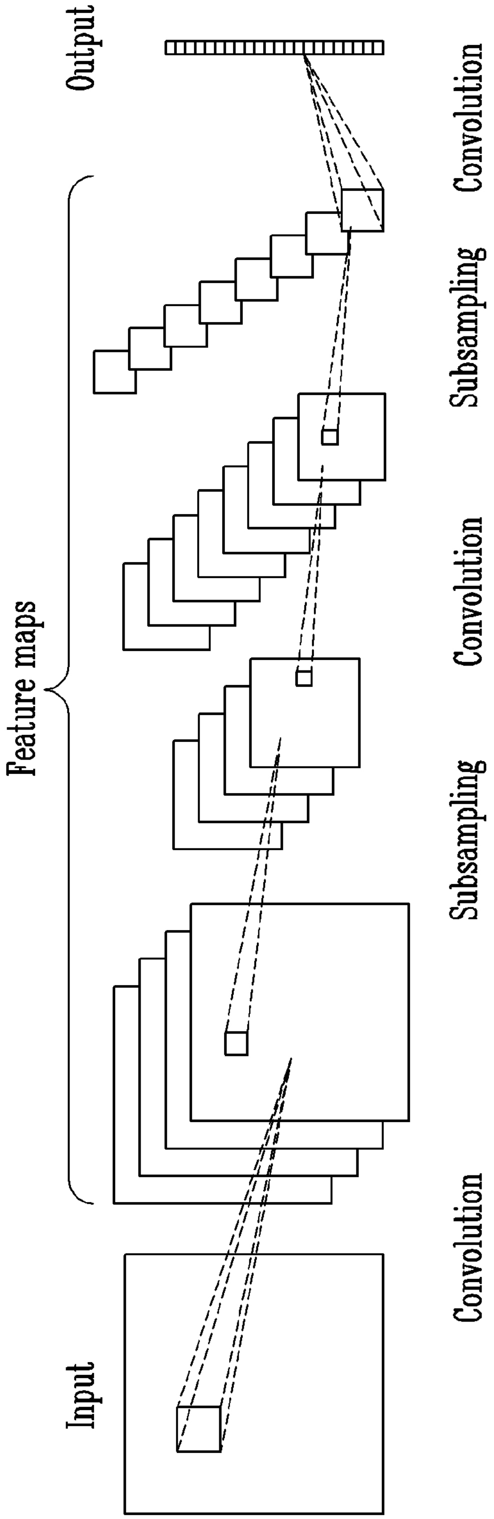
FIGS. 1A to 1D illustrate a neural network according to an embodiment of the present disclosure.

Referring to FIG. 1A, the neural network may be a Deep Neural Network (DNN) or an n-layer neural network. The Deep Neural Network (DNN) or the n-layer neural network may correspond to a Convolutional Neural Network (CNN), a Recurrent Neural Network (RNN), a Deep Belief Network (DBN), a Restricted Boltzman Machine (RBM), or the like. For example, in this embodiment, the neural network may be implemented as, but is not limited to, the Convolutional Neural Network (CNN).

Although FIG. 1A illustrates the Convolutional Neural Network (CNN) including a plurality of convolution layers, the Convolutional Neural Network (CNN) may further include a pooling layer, a fully connected layer, etc. in addition to the plurality of convolution layers.

The neural network may be implemented as an architecture having a plurality of layers including input data, feature maps, and output data. In the neural network, a first convolution operation is performed on the input data with a filter called a weight, and a feature map is output as a result of the first convolution operation. The output feature map generated at this time may be used, as an input feature map, to perform a second convolution operation with a weight, and thus a new feature map may be output as a result of the second convolution operation. As a result of repeatedly performing such a convolution operation, a result of finally recognizing features of the input data through the neural network may be output as the output data.

Figure 1B:
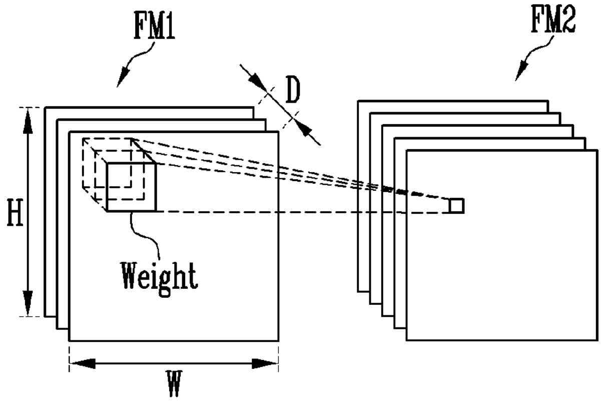

Referring to FIG. 1B, a relationship between an input feature map and an output feature map in the neural network may be explained.

In any layer of the neural network, a first feature map FM1 may correspond to the input feature map, and a second feature map FM2 may correspond to the output feature map. Each feature map may indicate a data set in which various features of the input data are represented. Each of the first and second feature maps FM1 and FM2 may have elements in the form of a two-dimensional (2D) matrix or elements in the form of a three-dimensional (3D) matrix, and a pixel value may be defined in each element. In the 3D matrix, each of the first and second feature maps FM1 and FM2 has a width W (or referred to as 'column'), a height H (or referred to as 'row'), and a depth D. Here, the depth D may correspond to the number of channels. Therefore, a plurality of rows, a plurality of columns, and a plurality of channels may form the 3D matrix of each of the first and second feature maps FM1 and FM2.

A convolution operation may be performed on the first feature map FM1 and a weight, and the second feature map FM2 may be generated as a result of the convolution operation. The weight may be used to perform the convolution operation with the first feature map FM1, and thus features included in the first feature map FM1 may be filtered. The weight may be used to perform the convolution operation with windows (or referred to as 'tiles') of the first feature map FM1 while shifting a sliding window along the first feature map FM1 in a sliding window manner. That is, the windows of the first feature map FM1 are generated by shifting the sliding window along the first features map FM1. The windows of the first feature map FM1 partially overlap each other, and thus the windows may be referred to as 'overlapping windows.' During each shift operation, the weight may be multiplied by and added to each of pixel values in each of the overlapping windows in the first feature map FM1. As the first feature map FM1 and the weight are convoluted, one channel of the second feature map FM2 may be generated. Although one weight is illustrated in FIG. 1B, a plurality of weights may be individually convoluted with the first feature map FM1 in practice, and, as a result, the second feature map FM2 having a plurality of channels may be generated.

Figure 1C:
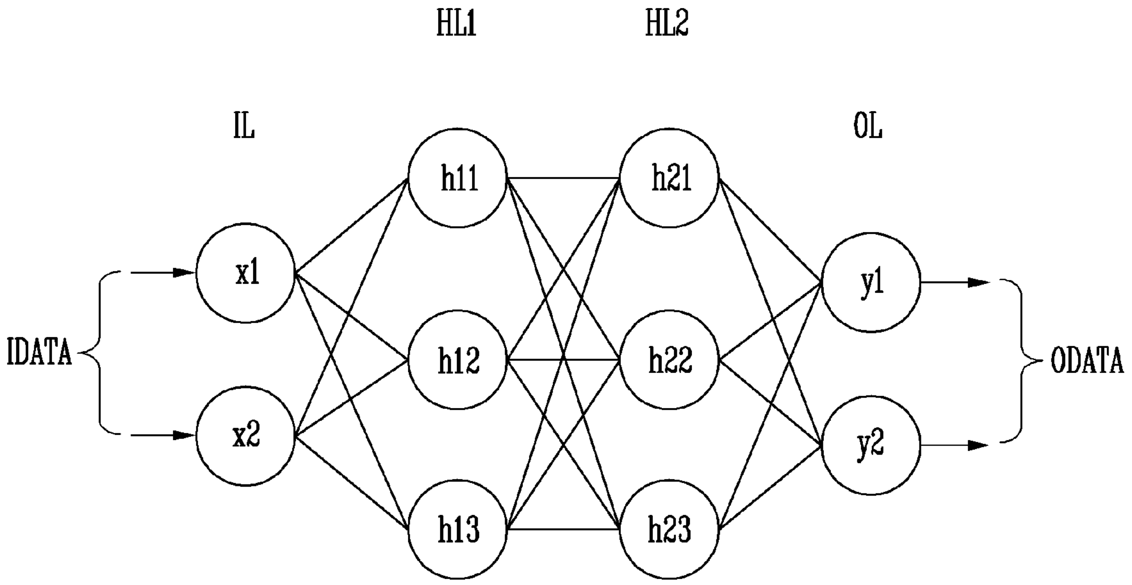

Meanwhile, the second feature map FM2 may correspond to an input feature map for a next layer. For example, the second feature map FM2 may be used as an input feature map for the next layer, e.g., a pooling (or subsampling) layer. Referring to FIG. 1C, the neural network may include an input layer IL, a plurality of hidden layers HL1 and HL2, and an output layer OL. Although two hidden layers are illustrated in FIG. 1C, the number of hidden layers may vary according to an embodiment. In FIG. 1C, the relationship between the layers, described with reference to FIGS. 1A and 1B, may be explained.

The input layer IL may include two input nodes x1 and x2, and input data IDATA may be input to each of the input nodes x1 and x2. Meanwhile, the number of input nodes included in the input layer IL may vary according to an embodiment.

The hidden layer HL1 may include three hidden nodes h11, h12, and h13, and the hidden layer HL2 may include three hidden nodes h21, h22, and h23. Meanwhile, the number of hidden layers included in each hidden layer may vary according to an embodiment, without being limited to 3.

The output layer OL may include two output nodes y1 and y2, and may output a result of processing the input data IDAT as output data ODATA. Meanwhile, the number of output nodes included in the output layer OL may vary according to an embodiment.

The architecture of the neural network illustrated in FIG. 1C may include connection lines (or branches) between nodes, each connection line being indicated by a straight line between two nodes respectively in two consecutive layers, and may include weights used in respective branches although not illustrated in the drawing. In this case, nodes in one layer may not be coupled to each other, and nodes included in two consecutive layers may be coupled to each other.

Referring to FIG. 1C, a node (e.g., h11) may receive an output of a previous node (e.g., x1), perform an operation on the output of the previous node (e.g., x1), and output a result of the operation to a subsequent node (e.g., h21). Here, the node (e.g., h11) may calculate a value to be output by applying an input value to a specific function, for example, a nonlinear function.

Generally, the architecture of the neural network is predetermined, and weights corresponding to connection lines (or branches) between nodes may be determined to have suitable values using data, a label (answer) of which is already known. Pieces of data, labels of which are already known in this way, are referred to as 'learning data,' and a process for determining the weights is referred to as 'learning.' Further, a set of an independently learnable structure and a weight may be assumed to be a 'model,' and a process for allowing the model, the weight of which is determined, to predict a class to which input data is to belong and to output a prediction value thereof may be referred to as a 'test' process.

Figure 1D:
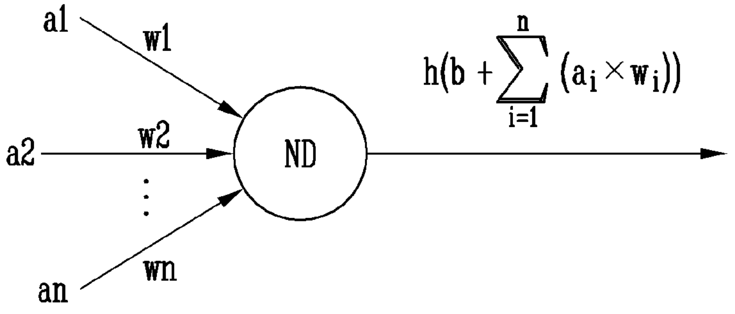

FIG. 1D illustrates an operation performed by one node ND among the nodes illustrated in FIG. 1C. It is assumed that n inputs a1, a2, . . . , an are provided to the node ND.

In an embodiment, the node ND may generate one output value by multiplying the n inputs a1, a2, . . . , an by n weights w1, w2, . . . , wn, respectively, summing up results of the multiplication, adding a bias b to a summed value, and applying the summed value to which the bias b is added to a specific function σ. Here, the specific function σ may be an activation function.

When one layer included in the neural network illustrated in FIG. 1C includes m nodes ND, output values of one layer may be acquired using the following Equation (1):

$$W*A=Z \tag{1}$$

In Equation (1), 'W' may denote weights for all connection lines included in one layer, and may be implemented in the form of an m*n matrix. 'A' may denote the n inputs a1, a2, . . . , an, received by the one layer, and may be implemented in the form of an n*1 matrix. 'Z' may denote m outputs, output from the one layer, and may be implemented in the form of an m*1 matrix.

In FIGS. 1A to 1D, only schematic architecture of the neural network is illustrated for convenience of description. However, it will be understood by those skilled in the art that, unlike the illustrated architecture, the neural network may be implemented using more or fewer layers, feature maps, or weights than those illustrated in the drawing, and the sizes thereof may be changed in various forms.

Figure 2A:
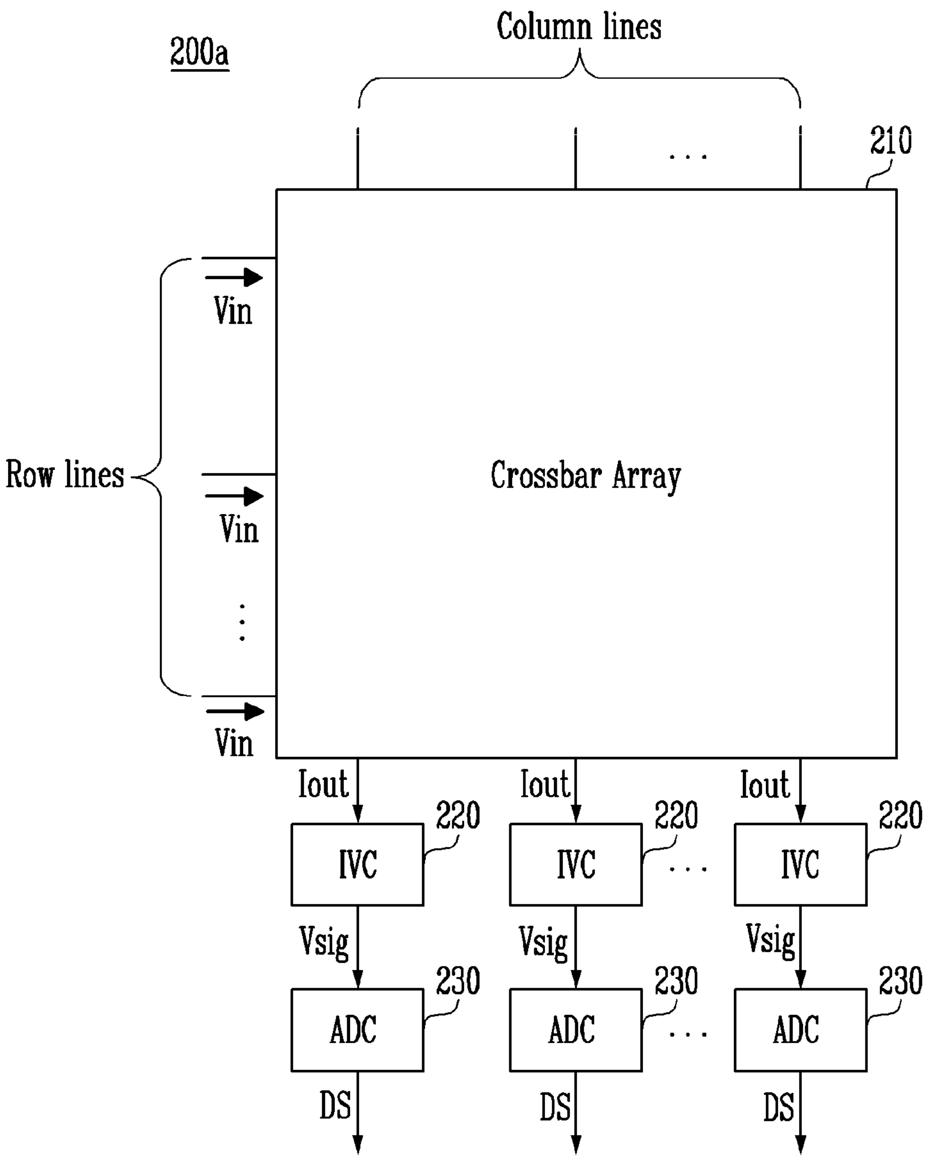
FIG. 2A illustrates an electronic device according to an embodiment of the present disclosure.

FIG. 2A illustrates an electronic device 200*a* according to an embodiment of the present disclosure.

The electronic device 200*a* may be a device for implementing the neural network described with reference to FIGS. 1A to 1D.

Referring to FIG. 2A, the electronic device 200*a* may include a crossbar array 210, a plurality of current-to-voltage converters (IVCs) 220, and a plurality of analog-to-digital converters (ADCs) 230.

The crossbar array 210 may include a plurality of memory cells arranged in a matrix form, each memory cell including a resistive element. Here, each memory cell may be a resistive memory cell. Each of the plurality of memory cells may be coupled to one of a plurality of row lines and one of a plurality of column lines. The detailed structure of the crossbar array 210 will be described later with reference to FIGS. 3 and 4.

The crossbar array 210 stores a plurality of weight data. For example, the plurality of weight data may be stored in the plurality of memory cells using a change in the resistance of a resistive element included in each of the plurality of memory cells. Further, the crossbar array 210 may generate a plurality of output currents Iout based on a plurality of input voltages Vin and the plurality of weight data.

For example, the plurality of input voltages Vin may be input to the crossbar array 210 through the plurality of row lines. The plurality of weight data may be provided and stored in the plurality of memory cells through the plurality of column lines.

In an embodiment, the electronic device 200*a* may be included in various types of electronic devices such as a personal computer (PC), a server device, a mobile device, and an embedded device. The electronic device 200*a* may correspond to a hardware component included in, for example, a smartphone, a tablet device, an Augmented Reality (AR) device, an Internet of Things (IoT) device, an autonomous vehicle, robotics, or a medical device. The electronic device 200*a* may perform speech recognition, image recognition, image classification, or the like using the neural network. That is, the electronic device 200*a* may correspond to a dedicated hardware (HW) accelerator installed in the above-described electronic device, and may be, but is not limited to, a hardware accelerator functioning as a neural processing unit (NPU), a tensor processing unit (TPU), a neural engine, TrueNorth, or Loihi, which is a dedicated module for driving the neural network.

In an embodiment, the electronic device 200*a* may be used to drive any neural network system, such as Artificial Neural Network (ANN) system, a Convolutional Neural Network (CNN) system, a Deep Neural Network (DNN) system, or a deep learning system, and/or a machine learning system.

For example, various types of services and applications, such as an image classification service, a user authentication service based on biometric information, an Advanced Driver Assistance System (ADAS) service, a voice assistant service, and an Automatic Speech Recognition (ASR) service, may be executed and processed by the electronic device 200*a*. In this case, data stored in the crossbar array 210 may be a plurality of weight data included in a plurality of layers constituting the neural network, and the plurality of output currents Iout and a plurality of signal voltages Vsig may denote results of multiply-accumulate (MAC) operations performed by the neural network. In other words, the electronic device 200*a* may perform a data storage operation and a computational operation at one time.

The multiply-accumulate operations may be used by a plurality of applications. For example, when an audio signal or a video signal is given, a user may require filtering of the audio signal or the video signal, performing of a Fast Fourier Transform (FFT) on the corresponding signal, or processing of an analog or digital signal in other schemes. In these examples, the multiply-accumulate operation may be used to perform such processing. In consideration of extensive usage of the multiply-accumulate operations in discrete-time or discrete-space signal processing, such process optimization may be a desired scheme for improving efficiency of digital signal processing.

Although not illustrated in detail, the crossbar array 210 may drive the plurality of row lines based on a row line select signal for selecting at least one of the plurality of row lines and a row line driving voltage for driving at least one of the plurality of row lines.

Although not illustrated in detail, the crossbar array 210 may drive the plurality of column lines based on a column line select signal for selecting at least one of the plurality of column lines and a column line driving voltage for driving at least one of the plurality of column lines.

Each memory cell included in the crossbar array 210 may correspond to a synapse or a connection line of the neural network, and may store one weight data. Therefore, m*n weight data stored in the crossbar array 210 may correspond to a weight matrix, i.e., W in the above-described Equation (1), implemented in the form of an m*n matrix included in one layer, described above with reference to FIGS. 1A to 1D.

The input voltages Vin applied through the plurality of row lines may correspond to the n inputs a1, a2, . . . , an received by the one layer, illustrated in FIGS. 1A to 1D, and may correspond to an input matrix implemented in the form of an n*1 matrix, that is, A in the above-described Equation (1).

The output currents Iout output from the plurality of column lines may correspond to the m outputs output from the one layer, illustrated in FIGS. 1A to 1D, and may correspond to an output matrix implemented in the form of an m*1 matrix, that is, Z in the above-described Equation (1).

In other words, in the state in which the plurality of weight data having the m*n matrix form are stored in the plurality of memory cells to implement the crossbar array 210, when the input voltages Vin corresponding to the input data are input through the plurality of row lines, the output currents Iout output through the plurality of column lines may be the results of multiply-accumulate operations performed in the neural network. When all of the plurality of layers of the neural network are implemented in this way, the electronic device 200*a* which performs the data storage operation and the computational operation at one time may be implemented.

The plurality of current-to-voltage converters (IVCs) 220 may be coupled between the crossbar array 210 and the plurality of analog-to-digital converters 230. The plurality of current-to-voltage converters 220 may convert the plurality of output currents Iout into the plurality of analog signal voltages Vsig. In other words, the electronic device 200*a* may perform multiply-accumulate operations on the plurality of input voltages Vin and the plurality of weight data using the crossbar array 210 and the plurality of current-to-voltage converters 220, and may generate the respective analog signal voltages Vsig to be input to the plurality of analog-to-digital converters 230, respectively, based on the results of the multiply-accumulate operations. Each of the plurality of current-to-voltage converters 220 may be implemented as a Trans-Impedance Amplifier (TIA).

The plurality of analog-to-digital converters 230 may receive the respective analog signal voltages Vsig, and may convert the analog signal voltages Vsig into a plurality of digital signals DS, respectively.

Figure 2B:
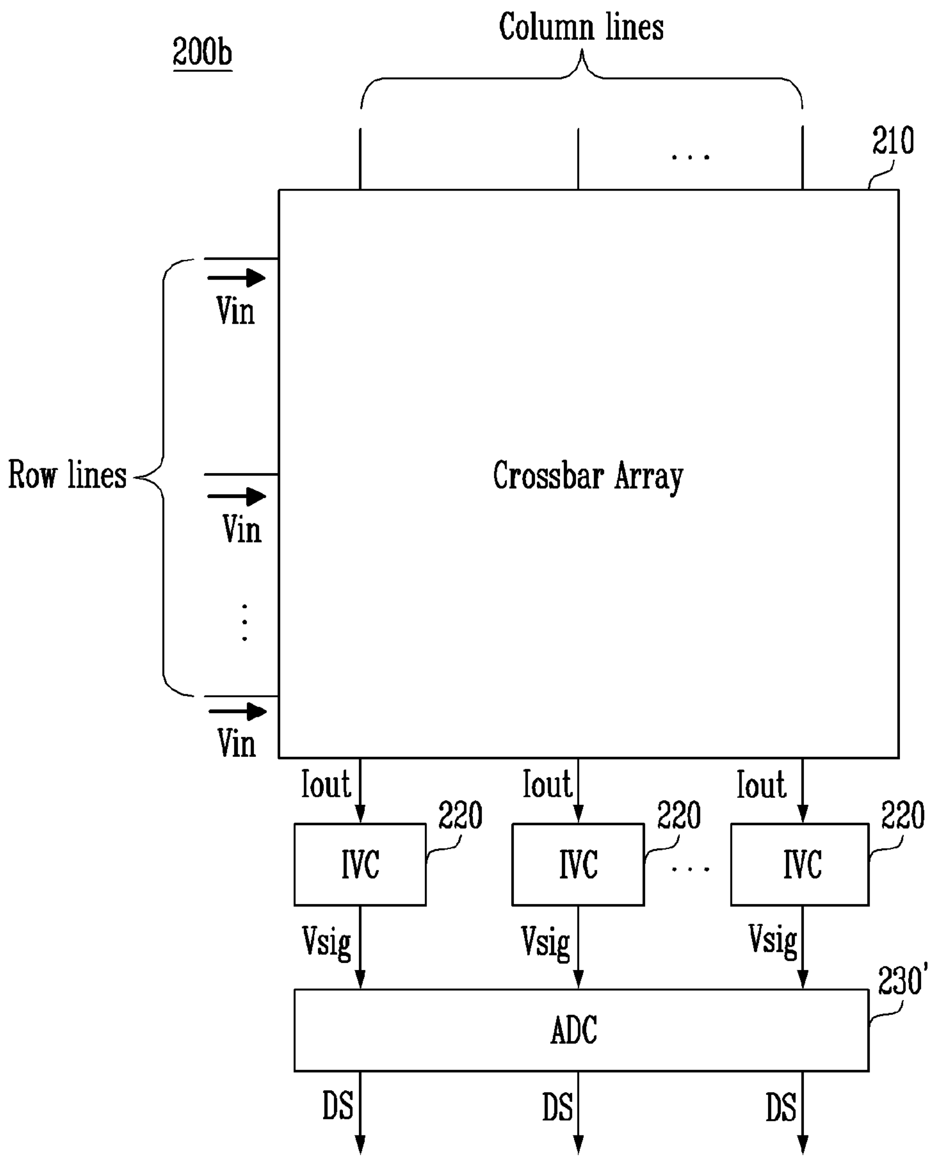
FIG. 2B illustrates an electronic device according to another embodiment of the present disclosure.

FIG. 2B illustrates an electronic device 200*b* according to another embodiment of the present disclosure.

Referring to FIG. 2B, the electronic device 200*b* may include a crossbar array 210, a plurality of current-to-voltage converters (IVCs) 220, and one analog-to-digital converter (ADC) 230'.

Since the crossbar array 210 and the plurality of current-to-voltage converters 220 of FIG. 2B have the same configurations as those of FIG. 2A, repeated descriptions thereof will be omitted.

In the embodiment illustrated in FIG. 2B, a plurality of column lines may share the one analog-to-digital converter 230'. In this case, there is an advantage in that the number of analog-to-digital converters may be reduced, and thus an area occupied by the analog-to-digital converter may be reduced compared to the embodiment in which the plurality of analog-to-digital converters are employed.

Hereinafter, for convenience of description, a description will be made on the assumption that an electronic device includes a plurality of analog-to-digital converters. However, this is only an example, and a configuration and operation of the electronic device, which will be described below, may be equally applied to the electronic device which shares one analog-to-digital converter.

Figure 3:
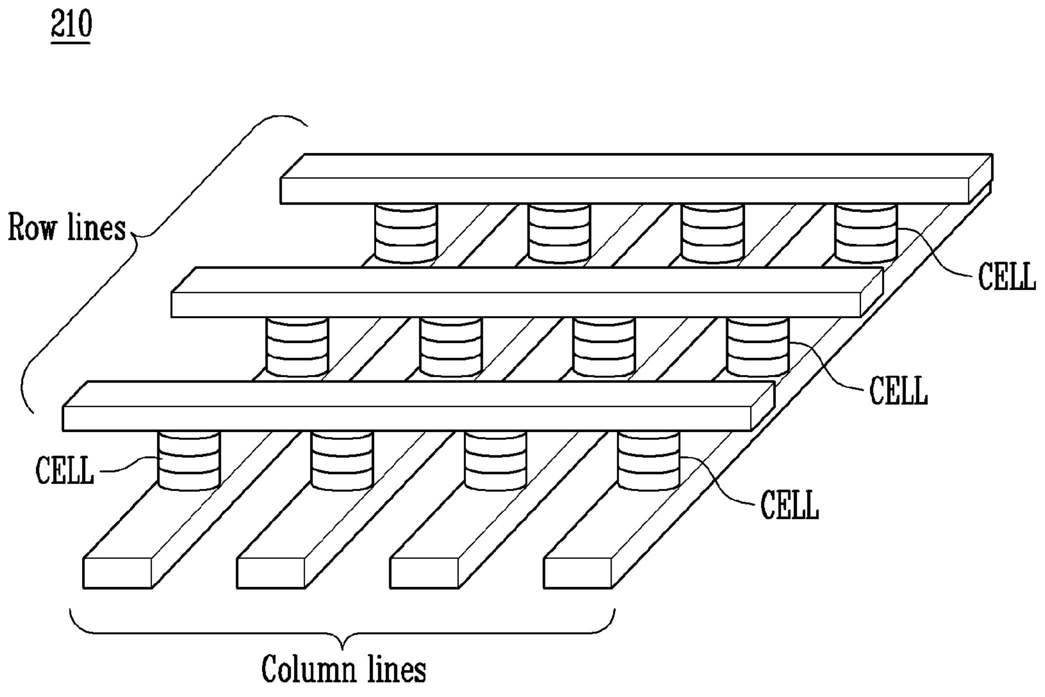
FIG. 3 illustrates a crossbar array according to an embodiment of the present disclosure.

FIG. 3 illustrates a crossbar array 210 according to an embodiment of the present disclosure. The crossbar array 210 shown in FIG. 3 may correspond to the crossbar array 210 of each of FIGS. 2A and 2B.

For convenience of description, FIG. 3 illustrates 4 column lines and 3 row lines, but the number of column lines and the number of row lines may not limited thereto.

Referring to FIG. 3, the crossbar array 210 may include the row lines successively arranged in a row direction. Also, the crossbar array 210 may include the column lines successively arranged in a column direction. Further, the crossbar array 210 may include a plurality of memory cells CELL disposed at intersections of the row lines and the column lines. The numbers, shapes, conductive materials, etc. of the row lines and the column lines may vary according to embodiments.

For example, the row lines may be arranged in a direction perpendicular to the column lines. The row lines and the column lines may form a lattice or a crossbar. At the intersections of the column lines and the row lines, the row lines may be disposed over the column lines and may be in close contact with the column lines. In embodiments, the row lines and the column lines may have a rectangular, square, circular, or elliptical section or a more complicated section at each of the intersections. Also, the column lines and the row lines may have different widths or diameters and different aspect ratios or eccentricities.

At the intersections, the memory cells CELL may be configured to couple the column lines and the row lines to each other. In an embodiment, the memory cells CELL may include physical contacts between the column lines and the row lines. In other embodiments, the memory cells CELL may not include physical contacts between the column lines and the row lines.

Furthermore, the crossbar array 210 may have a stacked structure in which the array illustrated in FIG. 3 is vertically stacked multiple times.

Figure 4:
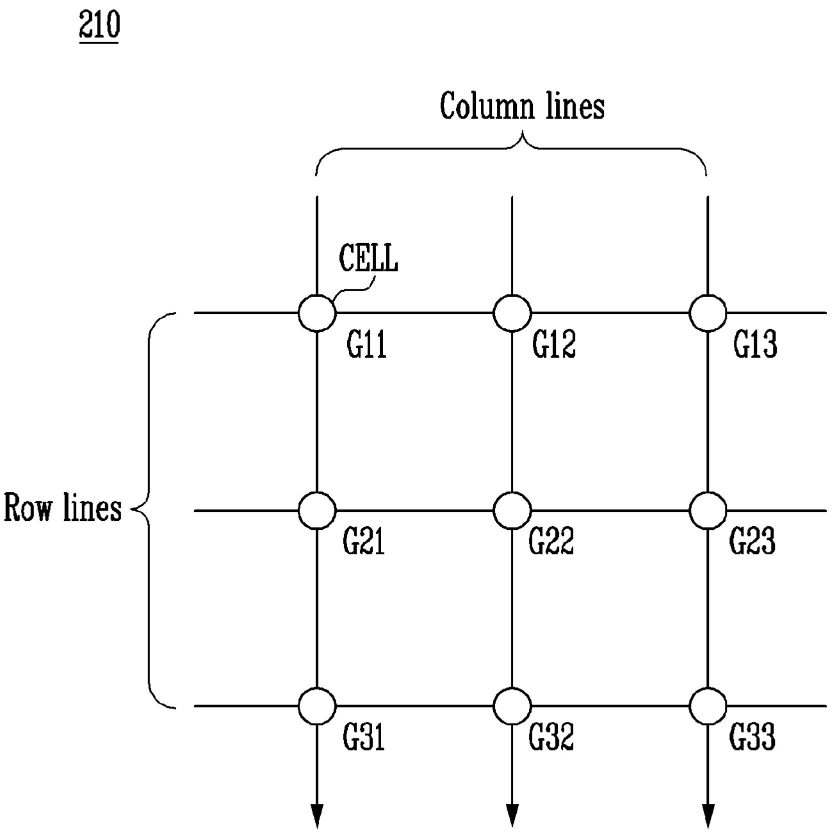
FIG. 4 illustrates a crossbar array according to an embodiment of the present disclosure.

FIG. 4 illustrates a crossbar array 210 according to an embodiment of the present disclosure. The crossbar array 210 shown in FIG. 4 may correspond to the crossbar array 210 of each of FIGS. 2A, 2B, and 3.

For convenience of description, FIG. 4 illustrates 3 column lines and 3 row lines, but the number of column lines and the number of row lines may not be limited thereto.

Referring to FIG. 4, the crossbar array 210 may include a plurality of memory cells CELL arranged in a matrix form, each memory cell including a resistive element. The resistive element has a resistance value varying with a write voltage applied thereto, and the plurality of memory cells CELL may store data using such resistance variation.

In an embodiment, each memory cell CELL may store data based on a conductance value of the resistive element, and the conductance value may correspond to a conductive state of the resistive element. The memory cell CELL may indicate various logic values and store various bits of data by updating the conductance value.

Also, the resistive element may be used to indicate a plurality of bits. For example, a resistive element having a first conductance value may indicate a logic value of "0." A resistive element having a second conductance value may indicate a logic value of "1." By changing the conductance value of the resistive element, different data may be stored in the memory cell CELL. The change in the conductance value may be performed by applying voltages to a column line and a row line coupled to the memory cell CELL.

In an embodiment, each memory cell CELL may be implemented to include any memory cell such as a Phase change Random Access Memory (PRAM) cell, a Resistive Random Access Memory (RRAM) cell, a Magnetic RAM (MRAM) cell, or a Ferroelectric Random Access Memory (FRAM) cell. Each of the plurality of memory cells CELL may be coupled to one of a plurality of row lines and one of a plurality of column lines.

The crossbar array 210 stores a plurality of weight data in the plurality of memory cells CELL. Here, the plurality of weight data may respectively correspond to conductance values G11, G12, G13, G21, G22, G23, G31, G32, and G33 of the plurality of memory cells CELL. For example, the plurality of weight data may be stored in the plurality of memory cells CELL using variation in the resistance of the resistive element included in each of the plurality of memory cells CELL.

Further, the crossbar array 210 may perform a multiply-accumulate operation on a plurality of input voltages and the plurality of weight data. For example, the plurality of input voltages may be input to the crossbar array 210 through the plurality of row lines.

The crossbar array 210 may output a plurality of output currents as a result of the multiply-accumulate operation. For example, the plurality of output currents may be output through the plurality of column lines.

FIGS. 5A to 5D illustrate memory cells of a crossbar array.

Figure 5A:
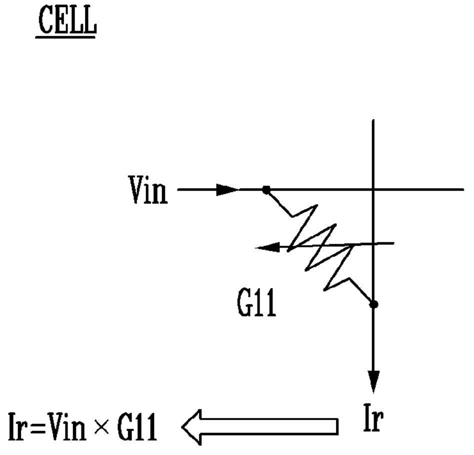
FIGS. 5A to 5D illustrate memory cells of a crossbar array.

Referring to FIG. 5A, a memory cell CELL may be coupled to one row line and one column line.

The memory cell CELL may have a resistive element.

The memory cell CELL may store a conductance value G11 corresponding to one weight data using the resistive element. For example, the memory cell CELL may receive the conductance value G11 through the column line, and may store the conductance value G11 therein.

The memory cell CELL may receive an input voltage Vin through the row line. The memory cell CELL may output an output current Ir by performing a multiply operation on the input voltage Vin and the conductance value G11.

Figure 5C:
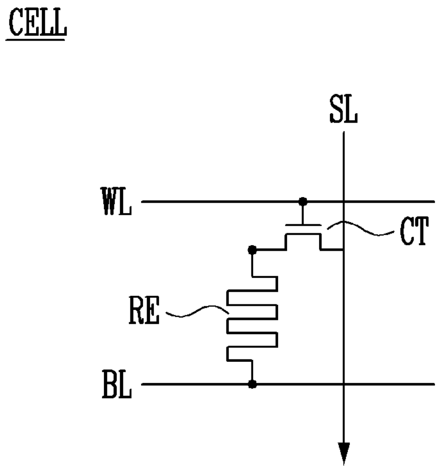
Figure 5B:
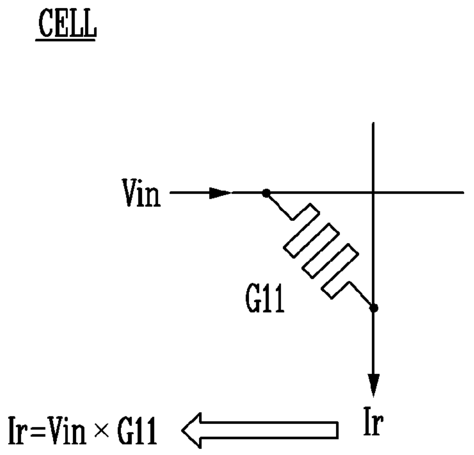

Referring to FIG. 5B, in an embodiment, a resistive element included in a memory cell CELL may be implemented as a memristor. The memristor is a portmanteau word of a memory and a register, and is a memory element which memorizes all previous states. Because the memristor memorizes a direction and an amount of current passing therethrough immediately before interruption of power even when power supply is interrupted, a previous state of the memristor may be restored when the power supply is resumed. The resistive element such as the memristor may use a resistance level so as to indicate a specific logic value such as 1 or 0. When the memristor is used as the resistive element of the memory cell CELL, the memristor is caused to be in a low-resistance state related to a logic value such as 1 by applying activation energy, such as voltage pulses having different values or different polarities, thus accumulating digital operations. Also, voltage pulses having different polarities or different values may cause the memristor to be in a high-resistance state related to another logic value such as "0."

The memristor may have a property of an electronic component that is called memristance. The memristor may have a switching voltage, and thus current, which flows through the memristor and generates a voltage lower than the switching voltage, may not change a state of the memristor. When the application of a voltage is blocked and the flow of charges is stopped, the memristor may memorize the last resistance thereof, whereas when the flow of charges is resumed, the memristor may have resistance at a time when the memristor was last activated. The memristor may be a variable resistor device. The memristor may have a resistance value varying with a write voltage applied thereto, and the memory cell CELL including the memristor may store data using such resistance variation.

In FIG. 5C, a word line WL and a bit line BL may correspond to the row lines of FIG. 4, and a source line SL may correspond to the column line of FIG. 4.

A memory cell CELL may include a cell transistor CT and a resistive element RE. Here, the resistive element RE may be implemented as a memristor. The memory cell CELL may be coupled to one of a plurality of word lines WL, one of a plurality of bit lines BL, and one of a plurality of source lines SL. For example, the cell transistor CT may include a first electrode coupled to the source line SL, a gate electrode coupled to the word line WL, and a second electrode. The resistive element RE may be coupled to and disposed between the second electrode of the cell transistor CT and the bit line BL.

For example, when a supply voltage is applied to the word line WL, a write voltage is applied to the bit line BL, and a ground voltage is applied to the source line, data '1' may be stored in the memory cell CELL. Further, when the supply voltage is applied to the word line WL, the ground voltage is applied to the bit line BL, and the write voltage is applied to the source line SL, data '0' may be stored in the memory cell CELL. Furthermore, when the supply voltage is applied to the word line WL, a read voltage is applied to the bit line BL, and the ground voltage is applied to the source line SL, data stored in the memory cell CELL may be read.

Figure 5D:
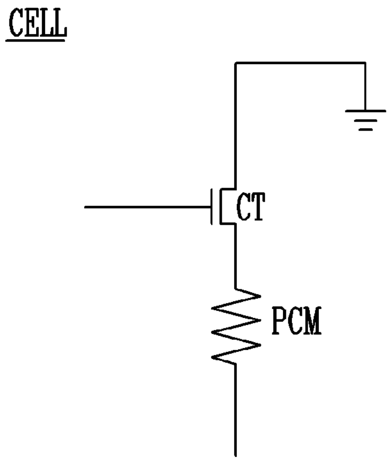

Referring to FIG. 5D, a memory cell CELL may include a cell transistor CT and a phase change material element PCM. The cell transistor CT may have a drain terminal coupled to a ground, a gate terminal coupled to a row line, and a source terminal coupled to the phase-change material element PCM. The phase-change material element PCM may have a first terminal coupled to the source terminal of the cell transistor CT, and a second terminal coupled to a column line. The phase-change material element PCM may store data using variation in a resistance value thereof.

Meanwhile, although the case where the crossbar array 210 is formed in a two-dimensional (2D) array structure has been described in the above-described embodiments, embodiments are not limited thereto. The crossbar array 210 may be formed in a three-dimensional (3D) array structure in accordance with another embodiment. A structure of a memory cell may also be changed in accordance with an embodiment.

Figure 6A:
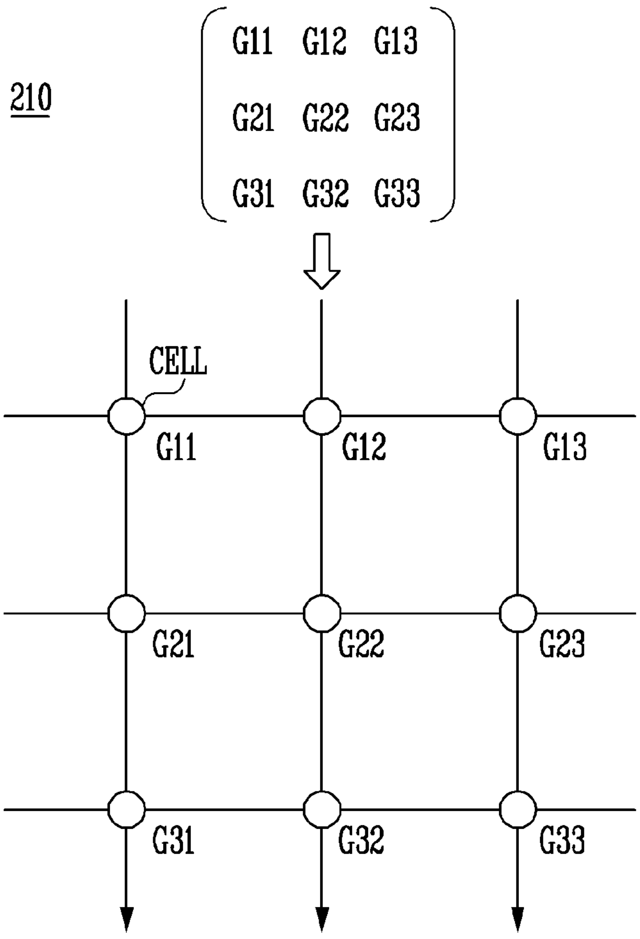
FIGS. 6A to 6C illustrate an operation of the crossbar array of FIG. 4.
Figure 6B:
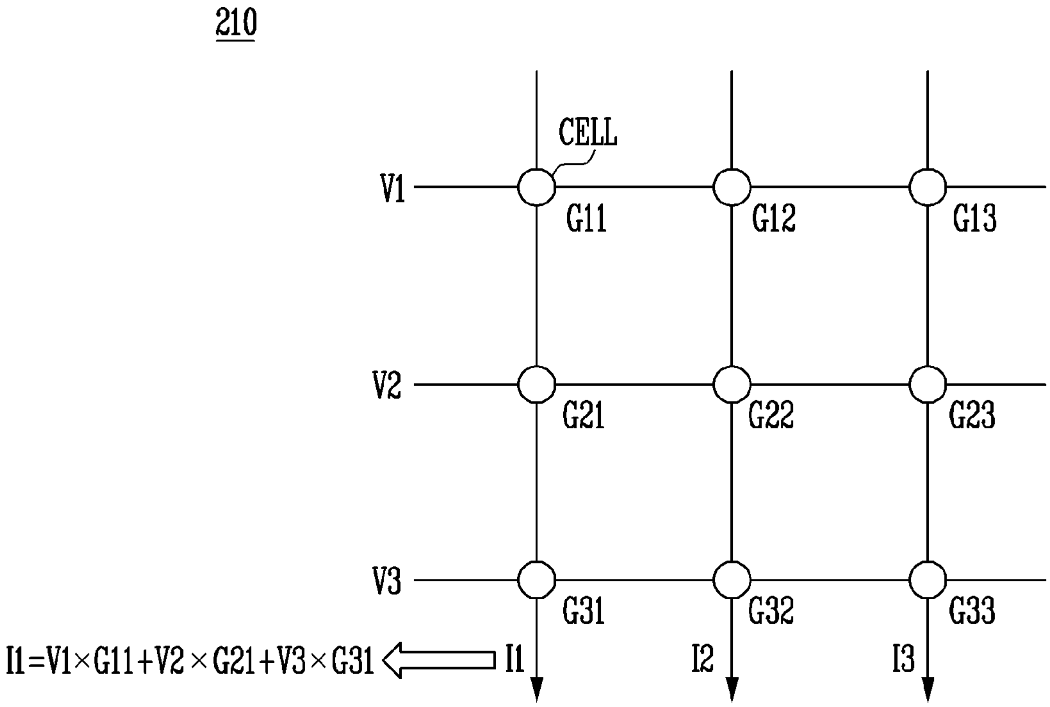
Figures 6C, 7:
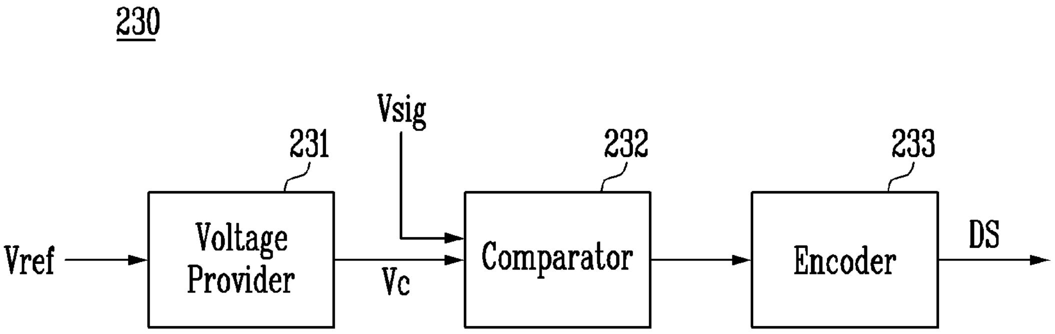
FIG. 7 illustrates an analog-to-digital converter according to an embodiment of the present disclosure.

FIGS. 6A to 6C illustrates an operation of the crossbar array 210 of FIG. 4.

Referring to FIG. 6A, the crossbar array 210 may store a plurality of conductance values G11 to G33 that correspond to a plurality of weight data.

For example, a plurality of memory cells CELL included in the crossbar array 210 may store the plurality of conductance values G11 to G33, respectively.

In an embodiment, the crossbar array 210 may receive a matrix composed of the plurality of conductance values G11 to G33 through a plurality of column lines. Here, the size of the matrix may be equal to the size of the crossbar array 210 composed of the plurality of memory cells CELL.

Referring to FIG. 6B, the crossbar array 210 may perform a multiply-accumulate operation on a plurality of input voltages V1 to V3 and the plurality of weight data G11 to G33.

For example, the crossbar array 210 may receive the plurality of input voltages V1 to V3 corresponding to input data through a plurality of row lines. As illustrated in FIGS. 5A and 5B, the crossbar array 210 may perform multiply operations on the conductance values G11 to G33 stored in the memory cells CELL and the input voltages V1 to V3. For example, memory cells coupled to a first column line among the plurality of column lines may perform a multiply operation on the first input voltage V1 and the conductance value G11, a multiply operation on the second input voltage V2 and the conductance value G21, and a multiply operation on the third input voltage V3 and the conductance value G31. For example, memory cells coupled to a second column line among the plurality of column lines may perform a multiply operation on the first input voltage V1 and the conductance value G12, a multiply operation on the second input voltage V2 and the conductance value G22, and a multiply operation on the third input voltage V3 and the conductance value G32. For example, memory cells coupled to a third column line among the plurality of column lines may perform a multiply operation on the first input voltage V1 and the conductance value G13, a multiply operation on the second input voltage V2 and the conductance value G23, and a multiply operation on the third input voltage V3 and the conductance value G33.

Also, the crossbar array 210 may perform an accumulate operation on results of the multiply operations on the conductance values G11 to G33 and the input voltages V1 to V3 for respective column lines. For example, for the first column line among the plurality of column lines, an accumulate operation is performed on the results of the multiply operation on the first input voltage V1 and the conductance value G11, the multiply operation on the second input voltage V2 and the conductance value G21, and the multiply operation on the third input voltage V3 and the conductance value G31. As a result, the first column line may output a first output current I1 ($=V1\times G11+V2\times G21+V3\times G31$) as a result of the multiply-accumulate operation. For example, for the second column line among the plurality of column lines, an accumulate operation is performed on the results of the multiply operation on the first input voltage V1 and the conductance value G12, the multiply operation on the second input voltage V2 and the conductance value G22, and the multiply operation on the third input voltage V3 and the conductance value G32. The second column line may output a second output current I2 ($=V1\times G12+V2\times G22+V3\times G32$) as a result of the multiply-accumulate operation. For example, for the third column line among the plurality of column lines, an accumulate operation is performed on the results of the multiply operation on the first input voltage V1 and the conductance value G13, the multiply operation on the second input voltage V2 and the conductance value G23, and the multiply operation on the third input voltage V3 and the conductance value G33. The third column line may output a third output current I3 ($=V1\times G13+V2\times G23+V3\times G33$) as a result of the multiply-accumulate operation.

Referring to FIG. 6C, the crossbar array 210 may output the output currents I1 to I3 by performing the multiply operation on the matrix composed of the conductance values G11 to G33 and a vector composed of the input voltages V1 to V3.

FIG. 7 illustrates an analog-to-digital converter according to an embodiment of the present disclosure. The analog-to-digital converter illustrated in FIG. 7 may correspond to the analog-to-digital converter 230 of FIG. 2A.

Referring to FIG. 7, the analog-to-digital converter 230 may include a voltage provider 231, a comparator 232, and an encoder 233. The analog-to-digital converter 230 may be coupled to the crossbar array 210 described above.

The voltage provider 231 may receive a reference voltage Vref. The voltage provider 231 may determine a plurality of comparison voltages Vc depending on the reference voltage Vref and a resolution set in the analog-to-digital converter 230. Here, the resolution may indicate the number of bits constituting a digital signal DS output from the analog-to-digital converter 230. The resolution may also be referred to as a resolving power. The voltage provider 231 may provide the plurality of comparison voltages Vc to the comparator 232.

The comparator 232 may compare each of the plurality of comparison voltages Vc with an analog signal voltage Vsig, and may provide a result of the comparison to the encoder 233. Such a comparison result may be information indicating whether the analog signal voltage Vsig is greater than or less than each of the plurality of comparison voltages Vc.

The encoder 233 may output the digital signal DS corresponding to the analog signal voltage Vsig based on the comparison result of the comparator 232.

Figure 8:
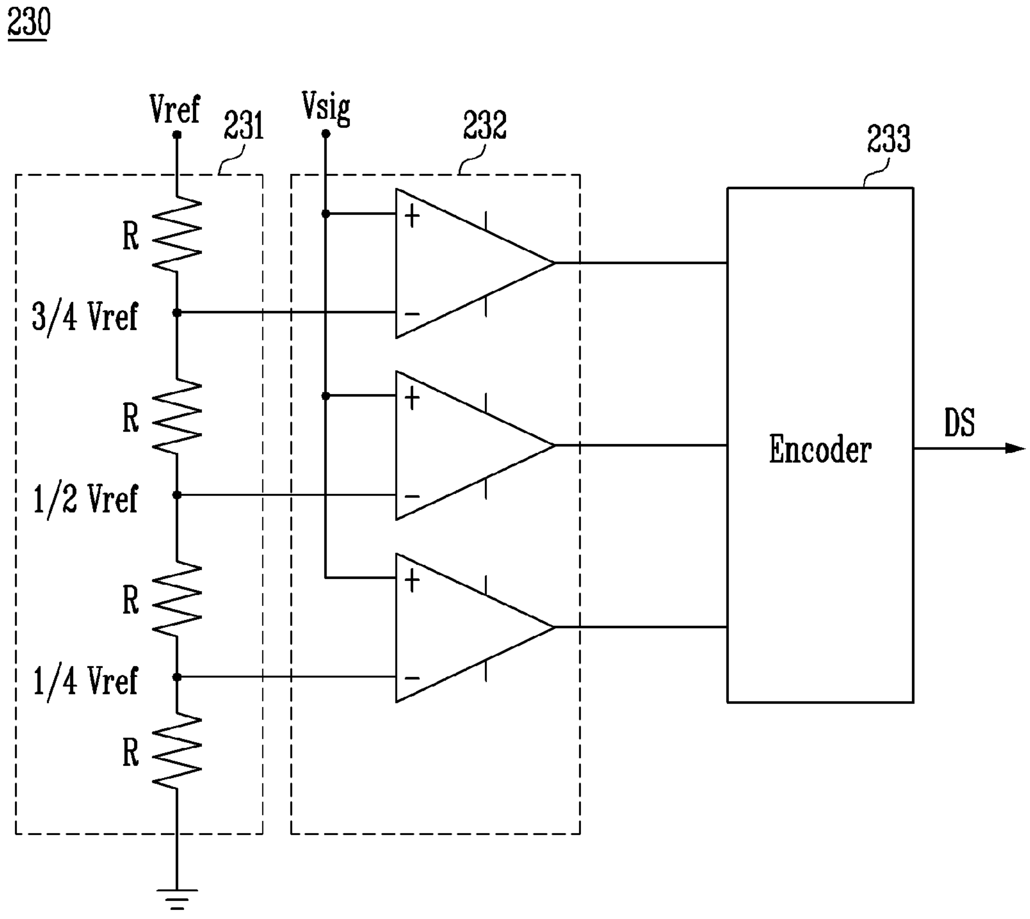
FIG. 8 illustrates an operation of the analog-to-digital converter of FIG. 7.

FIG. 8 illustrates the analog-to-digital converter of FIG. 7 according to an embodiment of the present disclosure.

Although FIG. 8 shows the resolution of the analog-to-digital converter 230 that is 2 bits, the resolution of the analog-to-digital converter 230 may be set to more than or less than two bits according to an embodiment.

Referring to FIG. 8, the voltage provider 231 may include a plurality of resistors R connected in series between a voltage supply terminal, to which the reference voltage Vref is supplied, and a ground terminal. The voltage provider 231 may determine a plurality of comparison voltages Vref, ¾ Vref, ½ Vref, and ¼ Vref using the plurality of resistors R. The voltage provider 231 may provide the plurality of comparison voltages Vref, ¾ Vref, ½ Vref, and ¼ Vref to the comparator 232.

The comparator 232 may compare each of the plurality of comparison voltages Vref, ¾ Vref, ½ Vref, and ¼ Vref with the analog signal voltage Vsig.

For example, the comparator 232 may compare the analog signal voltage Vsig with the comparison voltage ½ Vref.

When the analog signal voltage Vsig is greater than the comparison voltage ½ Vref, the comparator 232 may compare the analog signal voltage Vsig with the comparison voltage ¾ Vref. When the analog signal voltage Vsig is greater than the comparison voltage ¾ Vref, the comparator 232 may provide a corresponding comparison result to the encoder 233. In this case, referring to FIG. 9A, the encoder 233 may output a digital signal DS having '11' based on the corresponding comparison result. Unlike this, when the analog signal voltage Vsig is less than the comparison voltage ¾ Vref, the comparator 232 may provide a corresponding comparison result to the encoder 233. In this case, referring to FIG. 9A, the encoder 233 may output a digital signal DS having '10' based on the corresponding comparison result.

Meanwhile, when the analog signal voltage Vsig is less than the comparison voltage ½ Vref, the comparator 232 may compare the analog signal voltage Vsig with the comparison voltage ¼ Vref. When the analog signal voltage Vsig is greater than the comparison voltage ¼ Vref, the comparator 232 may provide a corresponding comparison result to the encoder 233. In this case, referring to FIG. 9A, the encoder 233 may output a digital signal DS having '01' based on the corresponding comparison result. Unlike this, when the analog signal voltage Vsig is less than the comparison voltage ¼ Vref, the comparator 232 may provide a corresponding comparison result to the encoder 233. In this case, referring to FIG. 9A, the encoder 233 may output a digital signal DS having '00' based on the corresponding comparison result.

FIGS. 9A to 9E illustrate an input range of the analog-to-digital converter 230 of FIG. 7 according to an embodiment.

The input range of the analog-to-digital converter 230 may be a maximum dynamic range which prevents the analog-to-digital converter 230 from being overloaded. In an embodiment, the term "input range" may be designated as a "quantization range."

Figure 9A:
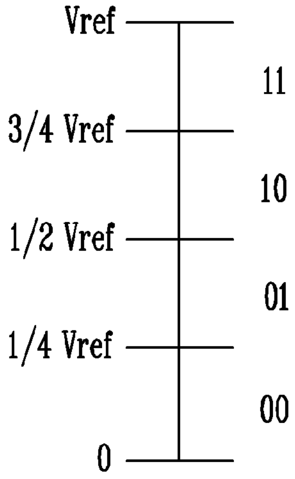
FIGS. 9A to 9E illustrate an input range of an analog-to-digital converter according to an embodiment of the present disclosure.
Figure 9B:
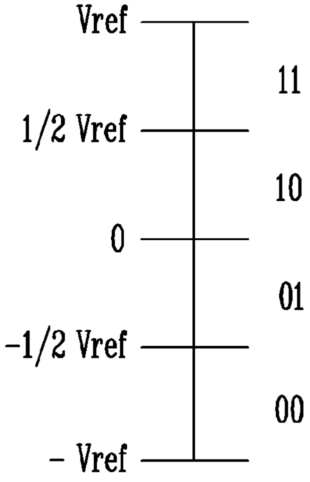

FIGS. 9A and 9B show the resolution of the analog-to-digital converter 230 that is 2 bits. However, the resolution of the analog-to-digital converter may be set to another value in accordance with an embodiment.

Referring to FIG. 9A, the input range of the analog-to-digital converter 230 may indicate a range from a minimum value of '0' to a maximum value of a reference voltage Vref.

Also, as described above with reference to FIGS. 7 and 8, the analog-to-digital converter 230 may determine the plurality of comparison voltages depending on the reference voltage Vref and the resolution. For example, when the resolution is 2 bits, the analog-to-digital converter 230 may output a digital signal indicating any one of digital values '00,' '01,' '10,' and '11.' Because the analog-to-digital converter 230 may output digital signals each corresponding to one of the four digital values, the plurality of comparison voltages respectively identifying the four digital values may be determined within the input range. That is, the input range is divided into four sections by the plurality of comparison voltages, and the four sections respectively correspond to the four digital values.

For example, the analog-to-digital converter 230 may determine the plurality of comparison voltages including the reference voltage Vref, a voltage having a magnitude corresponding to ¾ of the reference voltage Vref (i.e., ¾ Vref), a voltage having a magnitude corresponding to ½ of the reference voltage Vref (i.e., ½ Vref), a voltage having a magnitude corresponding to ¼ of the reference voltage Vref (i.e., ¼ Vref), and a voltage of 0. In this case, when the analog signal voltage Vsig is present between the reference voltage Vref and the voltage having a magnitude corresponding to ¾ of the reference voltage Vref (i.e., ¾ Vref), the analog-to-digital converter 230 may output the digital signal indicating '11.' Further, when the analog signal voltage Vsig is present between the voltage having the magnitude corresponding to ¾ of the reference voltage Vref (i.e., ¾ Vref) and the voltage having the magnitude corresponding to ½ of the reference voltage Vref (i.e., ½ Vref), the analog-to-digital converter 230 may output the digital signal indicating '10.' Furthermore, when the analog signal voltage Vsig is present between the voltage having the magnitude corresponding to ½ of the reference voltage Vref (i.e., ½ Vref) and the voltage having the magnitude corresponding to ¼ of the reference voltage Vref (i.e., ¼ Vref), the analog-to-digital converter 230 may output the digital signal indicating '01.' Furthermore, when the analog signal voltage Vsig is present between the voltage having the magnitude corresponding to ¼ of the reference voltage Vref (i.e., ¼ Vref) and the voltage of 0, the analog-to-digital converter 230 may output the digital signal indicating '00.'

Referring to FIG. 9B, unlike the embodiment of FIG. 9A, the input range of the analog-to-digital converter 230 may be a range from a minimum value corresponding to a negative value of the reference voltage Vref to a maximum value corresponding to a positive value of the reference voltage Vref.

Also, as described above with reference to FIGS. 7 and 8, the analog-to-digital converter 230 may determine the plurality of comparison voltages depending on the reference voltage Vref and the resolution. For example, when the resolution is 2 bits, the analog-to-digital converter 230 may output a digital signal indicating any one of '00,' '01,' '10,' and '11.' Because the analog-to-digital converter 230 may output digital signals respectively corresponding to the four cases, the plurality of comparison voltages identifying the four cases may be determined within the input range.

For example, the analog-to-digital converter 230 may determine the plurality of comparison voltages including the reference voltage Vref, a voltage having a magnitude corresponding to ½ of the reference voltage Vref (i.e., ½ Vref), a voltage of 0, a negative voltage having a magnitude corresponding to ½ of the reference voltage Vref (i.e., −½ Vref), and a negative reference voltage −Vref. In this case, when the analog signal voltage Vsig is present between the reference voltage Vref and the voltage having the magnitude corresponding to ½ of the reference voltage Vref (i.e., ½ Vref), the analog-to-digital converter 230 may output the digital signal indicating '11.' Furthermore, when the analog signal voltage Vsig is present between the voltage having the magnitude corresponding to ½ of the reference voltage Vref (i.e., ½ Vref) and the voltage of 0, the analog-to-digital converter 230 may output the digital signal indicating '10.' Furthermore, when the analog signal voltage Vsig is present between the voltage of 0 and the negative voltage having the magnitude corresponding to ½ of the reference voltage Vref (i.e., −½ Vref), the analog-to-digital converter 230 may output the digital signal indicating '01.' Further, when the analog signal voltage Vsig is present between the negative voltage having the magnitude corresponding to ½ of the reference voltage Vref (i.e., −½ Vref) and the negative reference voltage-Vref, the analog-to-digital converter 230 may output the digital signal indicating '00.'

Hereinafter, for convenience of description, a description will be made on the assumption that the minimum value of the input range is 0. However, this is only an example, and a configuration and an operation of an electronic device, which will be described below, may be equally applied to the case where the minimum value of the input range is the negative value of the reference voltage Vref (i.e., −Vref).

Figure 9C:
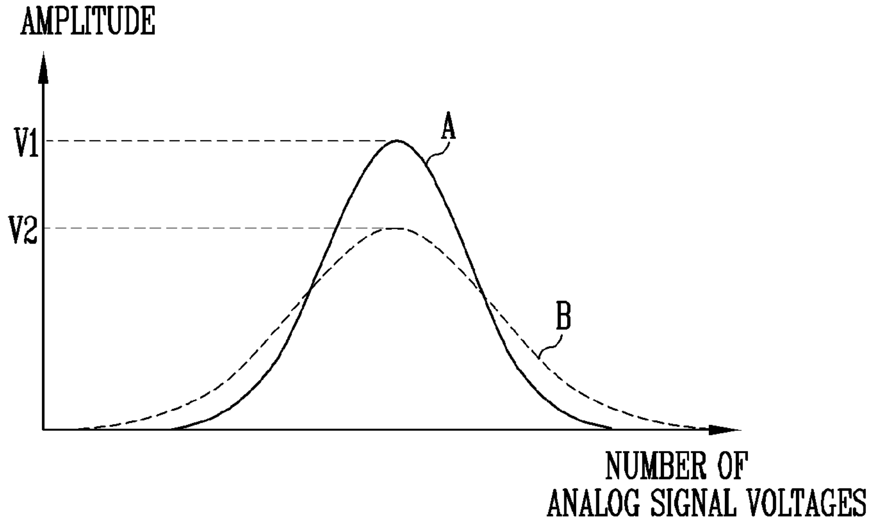

In detail, FIG. 9C illustrates the distribution of analog signal voltages input to the analog-to-digital converter 230 according to an embodiment of the present disclosure. In FIG. 9C, a waveform diagram indicated by a solid line may represent the distribution A of analog signal voltages corresponding to first input data, and a waveform diagram indicated by a dotted line may represent the distribution B of analog signal voltages corresponding to second input data.

In an embodiment, the crossbar array 210 may receive input voltages corresponding to input data, and may output analog signal voltages by performing a multiply-accumulate operation on the input voltages and conductance values stored in the crossbar array 210. Here, the distribution of analog signal voltages may vary depending on the input data.

For example, the distribution A of analog signal voltages corresponding to the first input data may have an amplitude V1 as a maximum value. Unlike this, the distribution B of analog signal voltages corresponding to the second input data may have an amplitude V2 as a maximum value. That is, the maximum value that the analog signal voltages can have may vary with the corresponding input data.

Figure 9D:
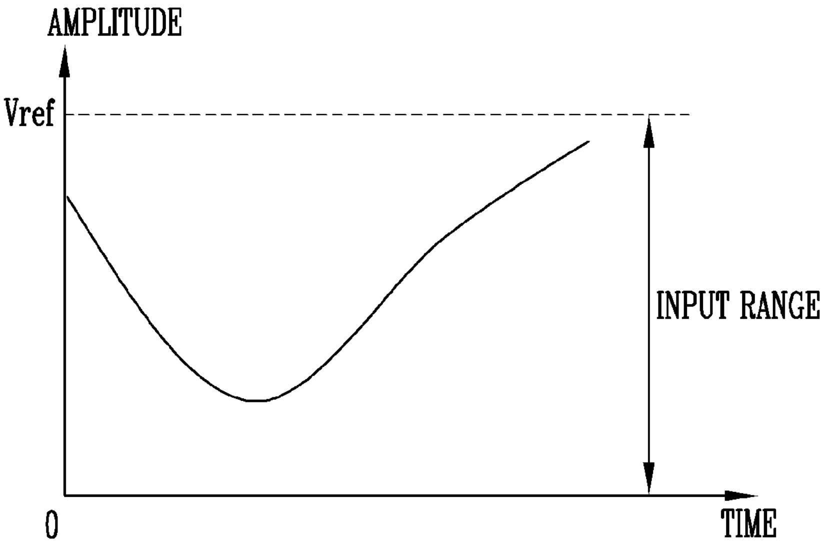

FIG. 9D is a graph showing an analog signal voltage that falls within the input range of the analog-to-digital converter 230 according to an embodiment of the present disclosure.

In the graph of FIG. 9D, a vertical axis denotes an amplitude of the analog signal voltage, and a horizontal axis denotes a time.

Referring to FIG. 9D, the input range of the analog-to-digital converter 230 may be set to a range from 0 to a reference voltage Vref.

In an embodiment, the analog signal voltage may fall within the input range of the analog-to-digital converter 230. For example, the maximum value of the analog signal voltage may be less than the reference voltage Vref. In this case, a probability of error occurring in a quantization operation on the analog signal voltage may be low.

Figure 9E:
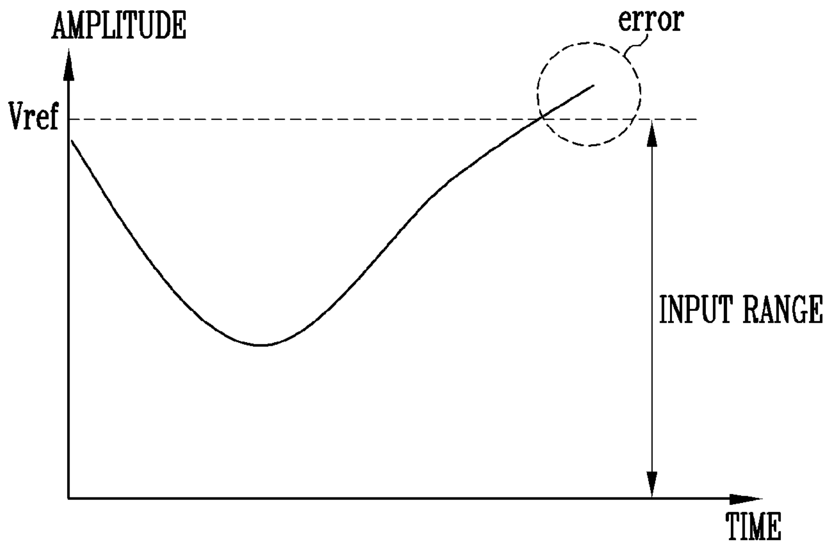

FIG. 9E is a graph showing an analog signal voltage that falls out of the input range of the analog-to-digital converter 230 according to an embodiment of the present disclosure.

In the graph of FIG. 9E, a vertical axis denotes an amplitude of the analog signal voltage, and a horizontal axis denotes a time.

Referring to FIG. 9E, the input range of the analog-to-digital converter 230 may be set to a range from 0 to a reference voltage Vref.

In an embodiment, the analog signal voltage may fall out of the input range of the analog-to-digital converter 230. For example, the maximum value of the analog signal voltage may be greater than the reference voltage Vref. In this case, a probability of error occurring in a quantization operation on the analog signal voltage may be high.

As described above, the analog-to-digital converter 230 may quantize a voltage period within the input range with a preset resolution. Here, when the result of the multiply-accumulate operation using the crossbar array 210 falls within the input range of the analog-to-digital converter 230, the electronic device 200*a* or 200*b* shown in FIG. 2A or 2B may reduce error occurring due to the quantization operation. For example, a neural network may perform learning using learning data. Here, when the input range of the analog-to-digital converter 230 is determined based on a reference voltage depending on the learning data, error caused by the quantization operation may increase due to a change in the distribution of input data corresponding to various types of services to which the trained neural network is applied. Therefore, there is required a scheme for determining the input range of the analog-to-digital converter 230 depending on the input data.

Figure 10:
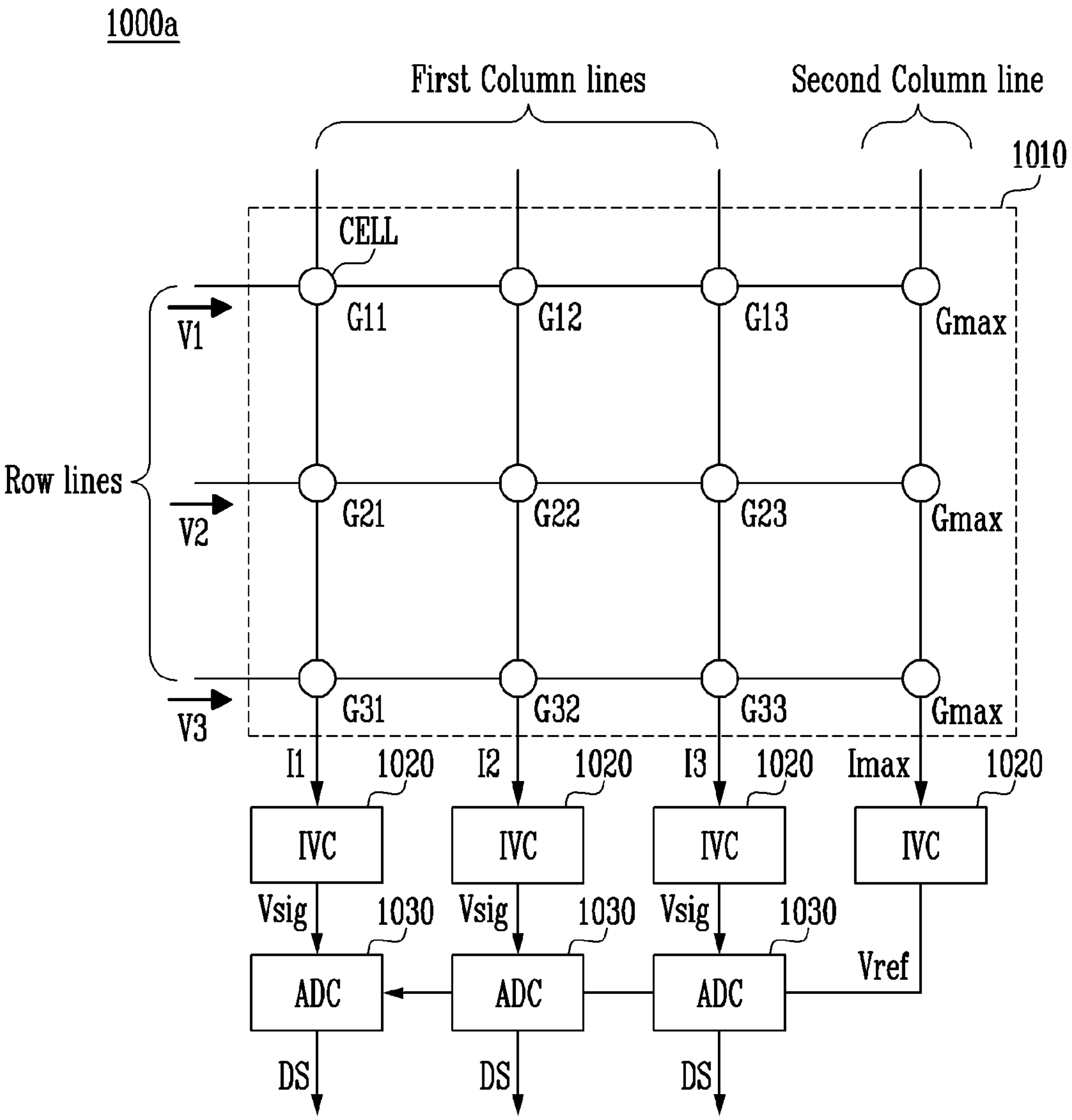
FIG. 10 illustrates an electronic device according to an embodiment of the present disclosure.

FIG. 10 illustrates an electronic device 1000*a* according to an embodiment of the present disclosure.

Referring to FIG. 10, the electronic device 1000*a* may include a crossbar array 1010, a plurality of current-to-voltage converters (IVCs) 1020, and a plurality of analog-to-digital converters (ADCs) 1030.

In FIG. 10, the plurality of current-to-voltage converters 1020 and the plurality of analog-to-digital converters 1030 may correspond to the plurality of current-to-voltage converters 220 and the plurality of analog-to-digital converters 230 of FIGS. 2A and 2B, respectively. Therefore, repeated descriptions of the plurality of current-to-voltage converters 1020 and the plurality of analog-to-digital converters 1030 will be omitted.

The crossbar array 1010 may include a plurality of row lines, a plurality of first column lines, a second column line, and a plurality of memory cells CELL.

Although FIG. 10 illustrates 3 row lines and 3 first column lines, the number of row lines and the number of column lines may be applied in various manners according to embodiments.

Each memory cell included in a first portion of the plurality of memory cells CELL may be coupled to a corresponding one of the plurality of row lines and a corresponding one of the plurality of first column lines. Each memory cell included in a second portion of the plurality of memory cells CELL may be coupled to a corresponding one of the plurality of row lines and the second column line.

The plurality of row lines may receive a plurality of input voltages corresponding to input data. In FIG. 10, input voltages V1 to V3 may be provided to the plurality of memory cells CELL coupled to the respective row lines.

Each of the plurality of first column lines may be coupled to a multiplicity of memory cells CELL coupled to the plurality of row lines. The first portion of the plurality of memory cells CELL coupled to the plurality of first column lines may store a plurality of conductance values G11 to G33 respectively corresponding to a plurality of weight data. The first column lines may be implemented in the same manner as the plurality of column lines described above with reference to FIG. 2A.

In an embodiment, the crossbar array 1010 may perform a multiply-accumulate operation on the plurality of input voltages V1 to V3 and the plurality of conductance values G11 to G33 and output a plurality of output currents I1 to I3 through the plurality of first column lines, respectively. In detail, a multiply operation may be performed on the plurality of input voltages V1 to V3 and the plurality of conductance values G11 to G33. After that, an accumulate operation may be perform on results of the multiply operation for each of the plurality of first column lines. Therefore, the plurality of first column lines may output the plurality of output currents I1 to I3, respectively, as a result of the multiply-accumulate operation performed on the plurality of input voltages V1 to V3 and the plurality of conductance values G11 to G33.

The second column line may be coupled to the second portion of the plurality of memory cells CELL coupled to the plurality of row lines. In an embodiment, each of the memory cells CELL coupled to the second column line may store a maximum conductance value Gmax. Here, the maximum conductance value Gmax may correspond to a conductance value having the largest magnitude among the plurality of conductance values G11 to G33. For example, when the 22-th conductance value G22 has the largest magnitude, the maximum conductance value Gmax may be determined to be the same as the 22-th conductance value G22.

Meanwhile, although, in the above-described example, a description is made on the assumption that all of the memory cells CELL coupled to the second column line store the maximum conductance value Gmax, embodiments are not limited thereto. In another embodiment, each of the memory cells CELL coupled to the second column line may store the largest conductance value selected from among conductance values stored in memory cells coupled to a corresponding one of the plurality of row lines to which each of the memory cells CELL coupled to the second column line is coupled. For example, a conductance value of the memory cell CELL coupled to and disposed between the first row line and the second column line may correspond to a conductance value having the largest magnitude among the conductance values G11, G12, and G13 stored in the memory cells CELL coupled to and disposed between the first row line and the plurality of first column lines. A conductance value of the memory cell CELL coupled to and disposed between the second row line and the second column line may correspond to a conductance value having the largest magnitude among the conductance values G21, G22, and G23 stored in the memory cells CELL coupled to and disposed between the second row line and the plurality of first column lines. A conductance value of the memory cell CELL coupled to and disposed between the third row line and the second column line may correspond to a conductance value having the largest magnitude among the conductance values G31, G32, and G33 stored in the memory cells CELL coupled to and disposed between the third row line and the plurality of first column lines.

Hereinafter, for convenience of description, a description will be made on the assumption that all of the memory cells CELL coupled to the second column line store the same maximum conductance value Gmax.

In an embodiment, the second column line may output the maximum output current Imax based on a result of a multiply-accumulate operation performed on the plurality of input voltages V1 to V3 and the maximum conductance value Gmax. In detail, a multiply operation is performed on each of the plurality of input voltages V1 to V3 and the maximum conductance value Gmax stored in each of the memory cells CELL coupled to the second column line. After that, an accumulate operation is performed on results of the respective multiply operations. The second column line may output the maximum output current Imax as a result of the multiply-accumulate operation performed on the plurality of input voltages V1 to V3 and the maximum conductance value Gmax.

Each of the plurality of current-to-voltage converters 1020 may be coupled to a corresponding one of the plurality of first column lines or the second column line.

In an embodiment, the plurality of current-to-voltage converters 1020 may be respectively coupled to the plurality of first column lines and the second column line, may convert the plurality of output currents I1 to I3 from the plurality of first column lines into a plurality of analog signal voltages Vsig, and may convert the maximum output current Imax from the second column line into a reference voltage Vref. For example, the current-to-voltage converter 1020 coupled to any one of the plurality of first column lines, among the plurality of current-to-voltage converters 1020, may convert a corresponding one of the plurality of output currents I1 to I3 into a corresponding one of the plurality of analog signal voltages Vsig. Further, the current-to-voltage converter 1020 coupled to the second column line, among the plurality of current-to-voltage converters 1020, may convert the maximum output current Imax into the reference voltage Vref.

Furthermore, the plurality of current-to-voltage converters 1020 may be coupled to the plurality of analog-to-digital converters 1030, respectively, and may provide the plurality of analog signal voltages Vsig and the reference voltage Vref to the plurality of analog-to-digital converters 1030. For example, the IVC 1020 coupled to one of the plurality of first column lines, among the plurality of current-to-voltage converters 1020, may provide a corresponding one of the plurality of analog signal voltages Vsig to the analog-to-digital converter 1030 coupled thereto. Also, the IVC 1020 coupled to the second column line, among the plurality of current-to-voltage converters 1020, may provide the reference voltage Vref to the plurality of analog-to-digital converters 1030.

The plurality of analog-to-digital converters 1030 may be coupled to the plurality of first column lines, respectively.

In an embodiment, the plurality of analog-to-digital converters 1030 may convert the plurality of analog signal voltages Vsig into a plurality of digital signals DS, respectively.

For example, each of the plurality of analog-to-digital converters 1030 may receive an analog signal voltage Vsig corresponding to an output current, which is output from a corresponding one of the first column lines, among the plurality of output currents I1 to I3. Furthermore, the plurality of analog-to-digital converters 1030 may receive the reference voltage Vref from the IVC 1020 coupled to the second column line.

In addition, each of the plurality of analog-to-digital converters 1030 may convert the analog signal voltage Vsig into a digital signal DS based on the input range determined depending on the reference voltage Vref. In an embodiment, each of the plurality of analog-to-digital converters 1030 may determine the reference voltage Vref to be the maximum value of the input range, and may determine a value of 0 to be the minimum value of the input range, as illustrated in FIG. 9A.

In another embodiment, the plurality of analog-to-digital converters 1030 may determine a negative value of the reference voltage Vref to be the minimum value of the input range, and may determine a positive value of the reference voltage Vref to be the maximum value of the input range, as illustrated in FIG. 9B. Here, the maximum value of the input range may correspond to the maximum value of the analog signal voltage Vsig input to the plurality of analog-to-digital converters 1030. Further, the minimum value of the input range may correspond to the minimum value of the analog signal voltage Vsig input to the plurality of analog-to-digital converters 1030.

In an embodiment, the plurality of analog-to-digital converters 1030 may output the respective digital signals DS based on the results of comparison between the reference voltage Vref and the respective analog signal voltages Vsig. For example, the plurality of analog-to-digital converters 1030 may determine a plurality of comparison voltages depending on the reference voltage Vref and a preset resolution. The plurality of analog-to-digital converters 1030 may output the digital signals DS that are determined based on the results of comparison between the plurality of comparison voltages and the analog signal voltages Vsig.

In an embodiment, when the magnitudes of the analog signal voltages Vsig are greater than the magnitude of the reference voltage Vref, the plurality of analog-to-digital converters 1030 may change the magnitudes of the analog signal voltages Vsig to be the same as the magnitude of the reference voltage Vref. The plurality of analog-to-digital converters 1030 may output the digital signals DS based on the results of comparison between the reference voltage Vref and the magnitude-changed analog signal voltages Vsig.

In an embodiment, the plurality of analog-to-digital converters 1030 may apply a gain corresponding to the reference voltage Vref to the analog signal voltages Vsig, and then convert the analog signal voltages Vsig to which the gain is applied into the digital signals DS. For example, the plurality of analog-to-digital converters 1030 may optimize an operation of converting the analog signal voltages Vsig into the digital signals DS using an automatic gain control (AGC) technique. Accordingly, the plurality of analog-to-digital converters 1030 may reduce error that may occur in the operation of converting the analog signal voltages Vsig into the digital signals DS.

In an embodiment, the plurality of analog-to-digital converters 1030 may output the digital signals DS based on the results of comparison between the plurality of comparison voltages and the analog signal voltages Vsig to which the gain corresponding to the reference voltage Vref is applied.

Also, the plurality of analog-to-digital converters 1030 may control a gain depending on the reference voltage Vref, and then optimize the input range of the analog-to-digital converters 1030 based on the gain. In an embodiment, when the magnitudes of the analog signal voltages Vsig are greater than the magnitude of the reference voltage Vref, the plurality of analog-to-digital converters 1030 may control the gain so that the magnitudes of the analog signal voltages Vsig to which the gain is applied are less than or equal to the magnitude of the reference voltage Vref.

Meanwhile, although, in the above-described embodiments, the case where the automatic gain control technique is applied to the analog-to-digital converters 1030 has been described, embodiments are not limited thereto. For example, the electronic device may further include a voltage buffer for buffering the analog signal voltages Vsig that are input to the analog-to-digital converters 1030. This configuration will be described in detail later with reference to FIG. 13.

Therefore, in accordance with the embodiment of the present disclosure, the reference voltage Vref may be determined depending on the input data, and the input range of the analog-to-digital converters 1030 is changed based on the reference voltage Vref, and thus error occurring in the quantization operation may be reduced.

FIGS. 11A to 11D illustrate a second column line according to an embodiment of the present disclosure.

Figure 11A:
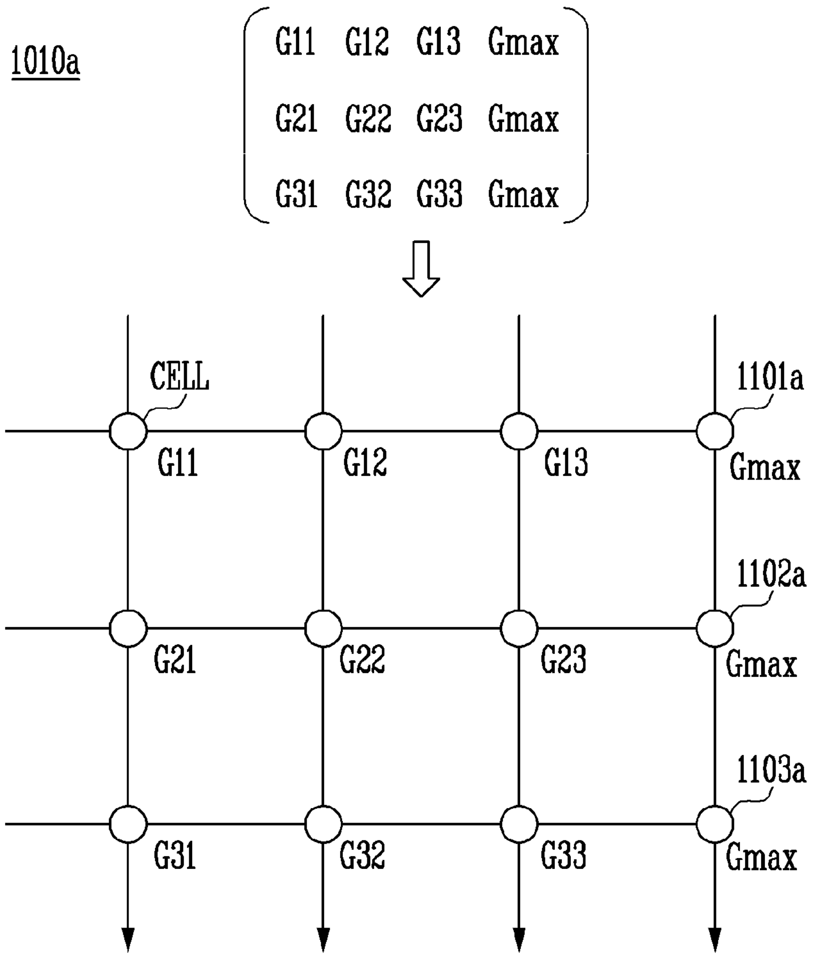
FIGS. 11A to 11D illustrate a second column line of FIG. 10 according to an embodiment of the present disclosure.

A crossbar array 1010*a* of FIG. 11A shows an example of the crossbar array 1010 of FIG. 10.

Referring to FIG. 11A, the crossbar array 1010*a* may include a plurality of memory cells 1101*a* to 1103*a* coupled to the second column line. Here, the plurality of memory cells 1101*a* to 1103*a* may be resistive memory cells. For example, the plurality of memory cells 1101*a* to 1103*a* may include resistive elements. The resistive elements included in the memory cells 1101*a* to 1103*a* may be implemented as memristors. The resistive element may have a resistance value varying with a write voltage applied thereto, and each of the memory cells 1101*a* to 1103*a* may store data using such resistance variation.

Each of the plurality of memory cells 1101*a* to 1103*a* may store the maximum conductance value Gmax.

For example, the crossbar array 1010*a* may store a plurality of conductance values G11 to G33 and the maximum conductance value Gmax.

For example, a plurality of memory cells CELL coupled to a plurality of first column lines of the crossbar array 1010*a* may store the plurality of conductance values G11 to G33, respectively. Each of the plurality of memory cells 1101*a* to 1103*a* coupled to the second column line may store the maximum conductance value Gmax.

In an embodiment, the crossbar array 1010*a* may receive the plurality of conductance values G11 to G33 and the maximum conductance value Gmax in the form of a matrix through a plurality of column lines including the plurality of first column lines and the second column line.

Figure 11B:
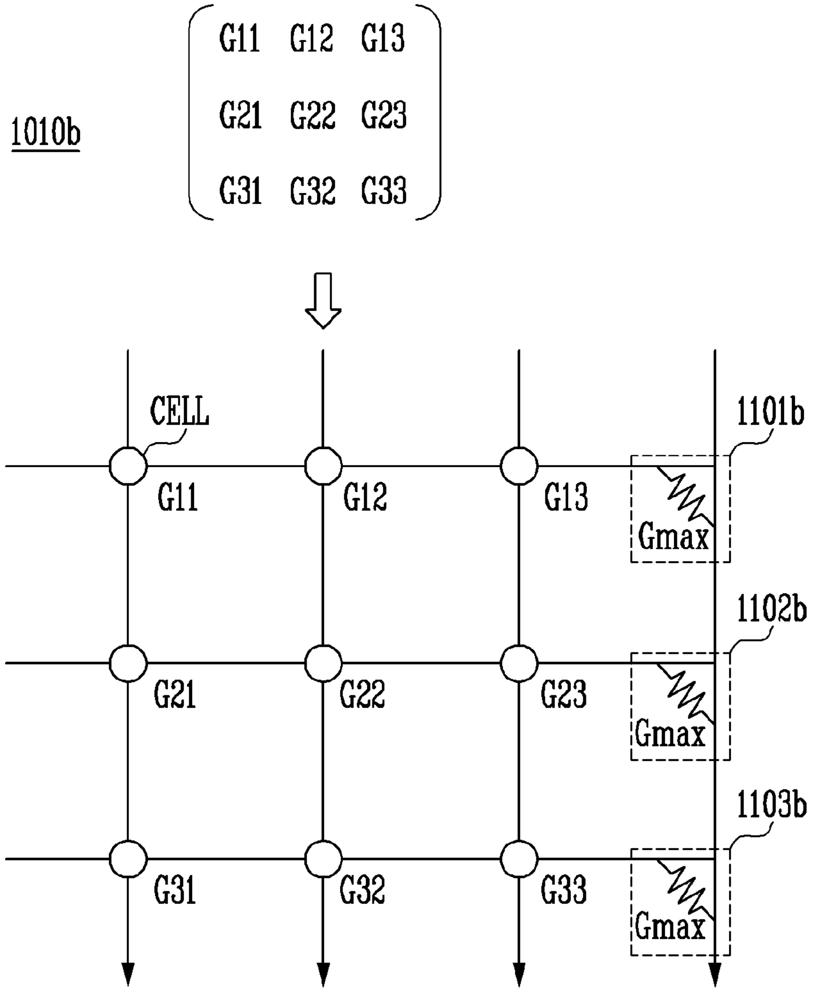

A crossbar array 1010*b* of FIG. 11B shows an example of the crossbar array 1010 of FIG. 10.

Referring to FIG. 11B, the crossbar array 1010*b* may include a plurality of memory cells 1101*b* to 1103*b* coupled to a second column line.

For example, the plurality of memory cells 1101*b* to 1103*b* may include a plurality of resistors each having a fixed conductance value. The conductance values of the plurality of resistors may be equal to each other, and may be greater than conductance values G11 to G33 stored in the crossbar array 1010*b*. For example, the conductance values of the plurality of resistors may be the maximum conductance value Gmax. In an embodiment, the conductance values of the plurality of resistors may be set in a design stage for the crossbar array 1010*b*.

For example, the crossbar array 1010*b* may receive the plurality of conductance values G11 to G33 in the form of a matrix through a plurality of first column lines. A plurality of memory cells CELL coupled to the plurality of first column lines may store the plurality of conductance values G11 to G33, respectively.

Each of the plurality of memory cells 1101*b* to 1103*b* coupled to the second column line may have the maximum conductance value Gmax.

Figure 11C:
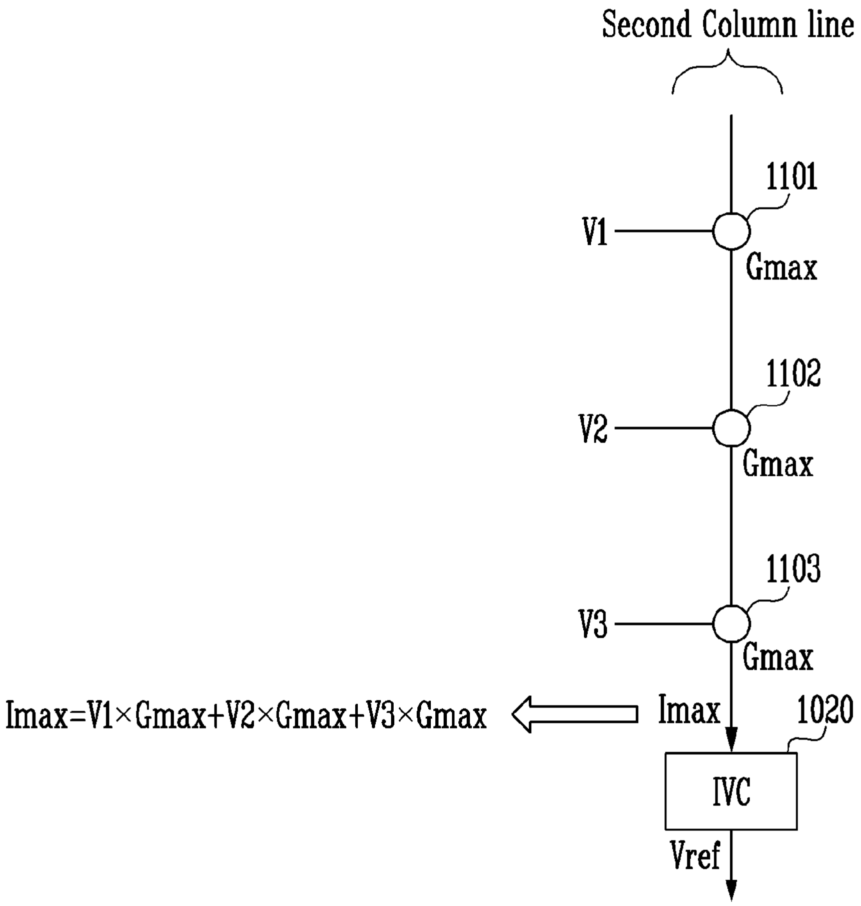

A plurality of memory cells 1101 to 1103 of FIG. 11C may correspond to the plurality of memory cells 1101*a* to 1103*a* of FIG. 11A, respectively. A description of the plurality of memory cells 1101*a* to 1103*a* may be equally applied to the plurality of memory cells 1101 to 1103 of FIG. 11C.

Referring to FIG. 11C, each of the plurality of memory cells 1101 to 1103 may store the maximum conductance value Gmax.

The plurality of memory cells 1101 to 1103 coupled to the second column line may receive a plurality of input voltages V1 to V3 from a plurality of row lines coupled thereto, respectively. Each of the memory cells 1101 to 1103 may perform a multiply operation on a corresponding one of the input voltages V1 to V3 and the maximum conductance value Gmax. For example, the first memory cell 1101 may receive the first input voltage V1. The first memory cell 1101 may perform a multiply operation on the first input voltage V1 and the maximum conductance value Gmax. Further, the second memory cell 1102 may receive the second input voltage V2. The second memory cell 1102 may perform a multiply operation on the second input voltage V2 and the maximum conductance value Gmax. Further, the third memory cell 1103 may receive the third input voltage V3. The third memory cell 1103 may perform a multiply operation on the third input voltage V3 and the maximum conductance value Gmax.

After that, the second column line may perform an accumulate operation on results of the multiply operations performed on the plurality of memory cells 1101 to 1103. For example, the second column line may perform the accumulate operation on the result of the multiply operation on the first input voltage V1 and the maximum conductance value Gmax, the result of the multiply operation on the second input voltage V2 and the maximum conductance value Gmax, and the result of the multiply operation on the third input voltage V3 and the maximum conductance value Gmax. The second column line may output the maximum current Imax as a result of the accumulate operation.

The IVC 1020 coupled to the second column line may convert the maximum output current Imax into the reference voltage Vref.

Figure 11D:
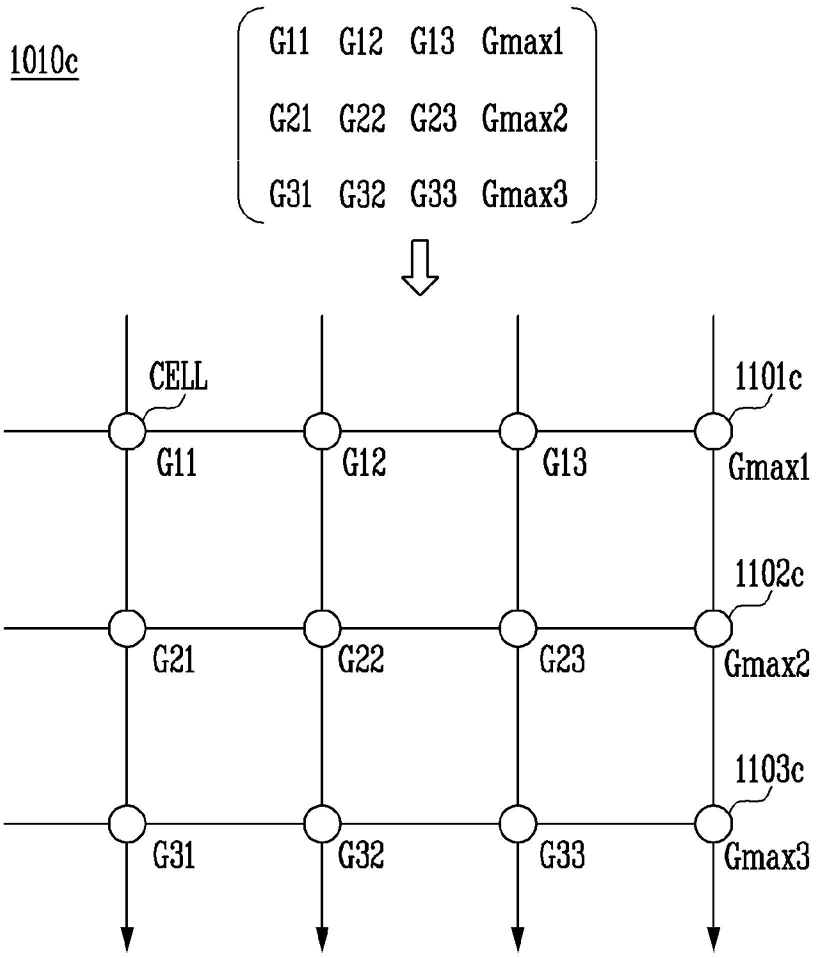

A crossbar array 1010*c* of FIG. 11D shows an example of the crossbar array 1010 of FIG. 10.

The crossbar array 1010*c* of FIG. 11D may have different conductance values Gmax1, Gmax2, and Gmax 3 respectively stored in a plurality of memory cells 1101*c*, 1102*c*, and 1103*c* coupled to a second column line, unlike the crossbar arrays 1010*a* and 1010*b* illustrated in FIGS. 11A and 11B.

In an embodiment, the crossbar array 1010*c* may receive a plurality of conductance values G11 to G33, Gmax1, Gmax2, and Gmax3 in the form of a matrix through a plurality of column lines including a plurality of first column lines and the second column line.

The crossbar array 1010*c* may store the plurality of conductance values G11 to G33, Gmax1, Gmax2, and Gmax3.

A plurality of memory cells CELL coupled to the plurality of first column lines may store the plurality of conductance values G11 to G33, respectively.

The plurality of memory cells 1101*c* to 1103*c* coupled to the second column line may store the conductance values Gmax1, Gmax2, and Gmax3, respectively. For example, the memory cell 1101*c* coupled to and disposed between the first row line and the second column line may store the conductance value Gmax1 that corresponds to a conductance value having the largest magnitude, among the conductance values G11, G12, and G13 stored in the memory cells CELL coupled to and disposed between the first row line and the plurality of first column lines. The memory cell 1102*c* coupled to and disposed between the second row line and the second column line may store the conductance value Gmax2 that corresponds to a conductance value having the largest magnitude, among the conductance values G21, G22, and G23 stored in the memory cells CELL coupled to and disposed between the second row line and the plurality of first column lines. The memory cell 1103*c* coupled to and disposed between the third row line and the second column line may store the conductance value Gmax3 that corresponds to a conductance value having the largest magnitude, among the conductance values G31, G32, and G33 stored in the memory cells CELL coupled to and disposed between the third row line and the plurality of first column lines.

FIGS. 12A to 12D illustrate an operation of an analog-to-digital converter 1030 according to an embodiment of the present disclosure. The analog-to-digital converter 1030 may correspond to the analog-to-digital converter 1020 of FIG. 10.

The analog-to-digital converter 1030 may include a voltage provider 1031, a comparator 1032, and an encoder 1033.

The voltage provider 1031, the comparator 1032, and the encoder 1033 illustrated in FIGS. 12A to 12D may be implemented in the same manner as the voltage provider 231, the comparator 232, and the encoder 233 illustrated in FIGS. 7 and 8.

Further, a resolution of the analog-to-digital converter 1030 illustrated in FIGS. 12A to 12D may be 2 bits.

Figure 12A:
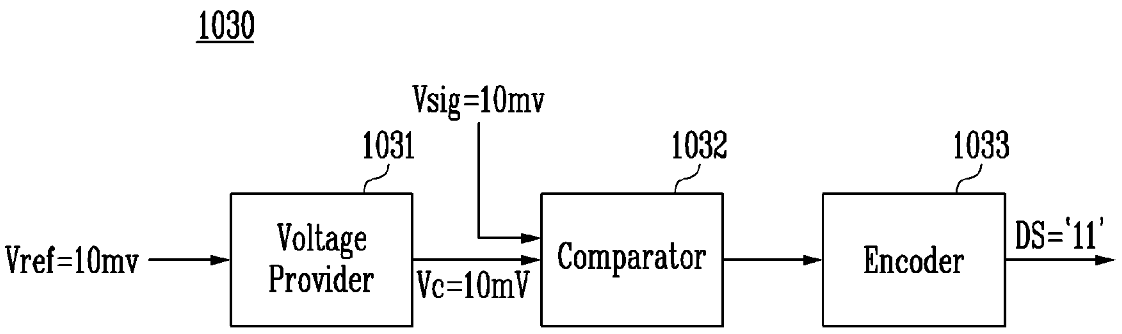
FIGS. 12A to 12D illustrate an operation of an analog-to-digital converter according to an embodiment of the present disclosure.

Referring to FIG. 12A, the voltage provider 1031 may receive a reference voltage Vref of 10 mV from a current-to-voltage converter coupled to the second column line. In an embodiment, the voltage provider 1031 may determine a plurality of comparison voltages Vref, ¾ Vref, ½ Vref, and ¼ Vref depending on the reference voltage Vref and the resolution of 2 bits. The voltage provider 1031 may provide the plurality of comparison voltages Vref, ¾ Vref, ½ Vref, and ¼ Vref to the comparator 1032.

The comparator 1032 may receive an analog signal voltage Vsig of 10 mV.

The comparator 1032 may compare the plurality of comparison voltages Vref, ¾ Vref, ½ Vref, and ¼ Vref with the analog signal voltage Vsig. The comparator 1032 may provide results of comparison to the encoder 1033.

The encoder 1033 may output a digital signal DS corresponding to the analog signal voltage Vsig of 10 mV based on the results of comparison. Since the analog signal voltage Vsig of 10 mV is determined to be greater than the comparison voltage ¾ Vref according to the results of the comparison, the analog signal voltage Vsig may be a voltage located between the comparison voltage Vref and the comparison voltage ¾ Vref, i.e., in a first voltage section closest to the maximum value Vref of an input range of the analog-to-digital converter 1030. Therefore, referring to FIG. 9A, the encoder 1033 may output '11,' which is the largest value among values represented by 2 bits, as the digital signal DS.

Figure 12B:
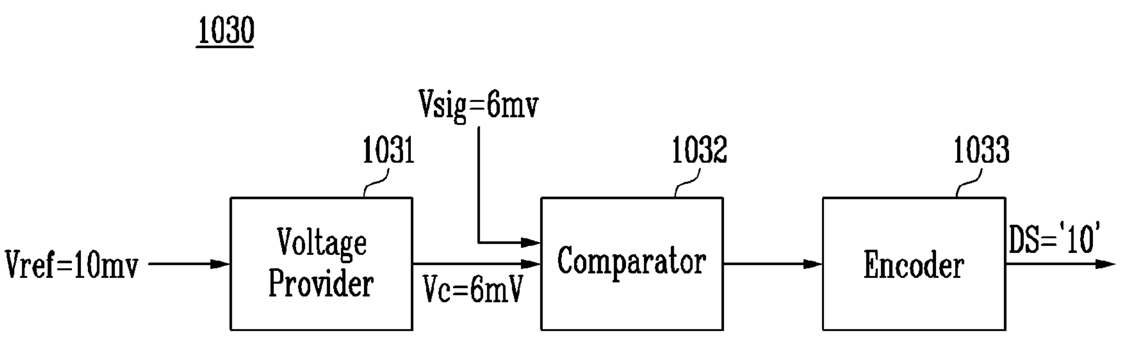

Referring to FIG. 12B, the voltage provider 1031 may receive the reference voltage Vref of 10 mV from the current-to-voltage converter coupled to the second column line. In an embodiment, the voltage provider 1031 may determine the plurality of comparison voltages Vref, ¾ Vref, ½ Vref, and ¼ Vref depending on the reference voltage Vref and the resolution of 2 bits. The voltage provider 1031 may provide the plurality of comparison voltages Vref, ¾ Vref, ½ Vref, and ¼ Vref to the comparator 1032.

The comparator 1032 may receive an analog signal voltage Vsig of 6 mV.

The comparator 1032 may compare the plurality of comparison voltages Vref, ¾ Vref, ½ Vref, and ¼ Vref with the analog signal voltage Vsig. The comparator 1032 may provide results of comparison to the encoder 1033.

The encoder 1033 may output a digital signal DS corresponding to the analog signal voltage Vsig of 6 mV based on the results of comparison. Since the analog signal voltage Vsig of 6 mV is less than the comparison voltage ¾ Vref and greater than the comparison voltage ½ Vref according to the results of the comparison, the analog signal voltage Vsig may be a voltage located between the comparison voltage ¾ Vref and the comparison voltage ½ Vref, i.e., in a second voltage section of the input range of the analog-to-digital converter 1030. Therefore, referring to FIG. 9A, the encoder 1033 may output '10' as the digital signal DS.

Figure 12C:
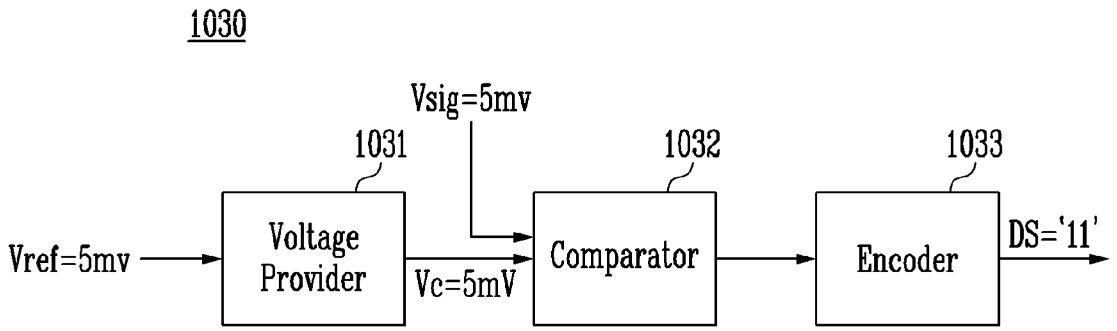

Referring to FIG. 12C, the voltage provider 1031 may receive the reference voltage Vref of 5 mV from the current-to-voltage converter coupled to the second column line. In an embodiment, the voltage provider 1031 may determine the plurality of comparison voltages Vref, ¾ Vref, ½ Vref, and ¼ Vref depending on the reference voltage Vref and the resolution of 2 bits. The voltage provider 1031 may provide the plurality of comparison voltages Vref, ¾ Vref, ½ Vref, and ¼ Vref to the comparator 1032.

The comparator 1032 may receive an analog signal voltage Vsig of 5 mV.

The comparator 1032 may compare the plurality of comparison voltages Vref, ¾ Vref, ½ Vref, and ¼ Vref with the analog signal voltage Vsig. The comparator 1032 may provide results of comparison to the encoder 1033.

The encoder 1033 may output a digital signal DS corresponding to the analog signal voltage Vsig of 5 mV based on the results of comparison. Since the analog signal voltage Vsig of 5 mV is greater than the comparison voltage ¾ Vref according to the results of the comparison, the analog signal voltage Vsig may be a voltage located between the comparison voltage Vref and the comparison voltage ¾ Vref, i.e., in the first voltage section closest to the maximum value of the input range of the analog-to-digital converter 1030. Therefore, referring to FIG. 9A, the encoder 1033 may output '11,' which is the largest value among values represented by 2 bits, as the digital signal DS.

FIGS. 12A and 12C show that the analog signal voltages Vsig have different voltage levels from each other, but the digital signals thereof are equal to each other. Therefore, in accordance with an embodiment of the present disclosure, since the maximum output current Imax is calculated based on input voltages corresponding to the input data, and a voltage corresponding to the maximum output current Imax is set as the reference voltage Vref, the input range of the analog-to-digital converter is determined depending on the input data.

Figure 12D:
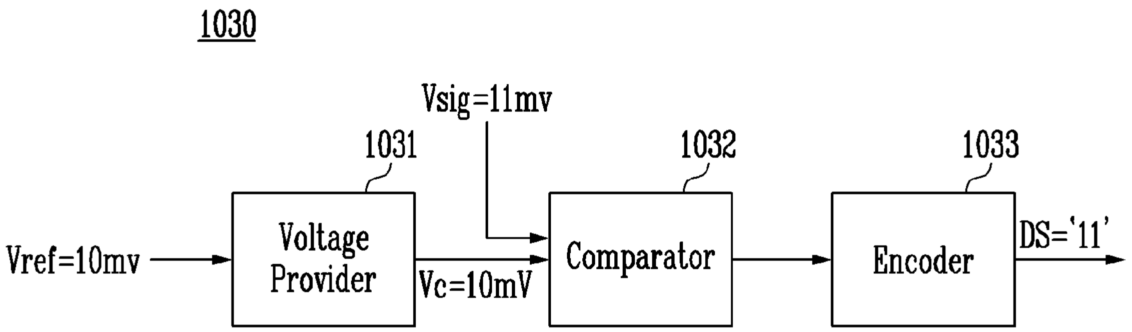

Referring to FIG. 12D, the voltage provider 1031 may receive the reference voltage Vref of 10 mV from the current-to-voltage converter coupled to the second column line. In an embodiment, the voltage provider 1031 may determine the plurality of comparison voltages Vref, ¾ Vref, ½ Vref, and ¼ Vref depending on the reference voltage Vref and the resolution of 2 bits. The voltage provider 1031 may provide the plurality of comparison voltages Vref, ¾ Vref, ½ Vref, and ¼ Vref to the comparator 1032.

The comparator 1032 may receive an analog signal voltage Vsig of 11 mV. Since the magnitude of the analog signal voltage Vsig is greater than that of the reference voltage Vref, the comparator 1032 may change the magnitude of the analog signal voltage Vsig to be the same as the magnitude of the reference voltage Vref.

The comparator 1032 may compare the plurality of comparison voltages Vref, ¾ Vref, ½ Vref, and ¼ Vref with the magnitude-changed analog signal voltage Vsig. The comparator 1032 may provide results of comparison to the encoder 1033.

The encoder 1033 may output a digital signal DS corresponding to the analog signal voltage Vsig of 11 mV based on the results of comparison. Since the analog signal voltage Vsig of 11 mV is greater than the comparison voltage ¾ Vref according to the results of comparison, the analog signal voltage Vsig may be a voltage located between the comparison voltage Vref and the comparison voltage ¾ Vref, i.e., in the first voltage section closest to the maximum value Vref of the input range of the analog-to-digital converter 1030. Therefore, referring to FIG. 9A, the encoder 1033 may output '11,' as the digital signal DS.

FIG. 12D shows that the analog signal voltage Vsig has a greater voltage level than the reference voltage Vref, but the analog-to-digital converter 1030 may adjust the magnitude of the analog signal voltage Vsig so that the analog signal voltage Vsig falls within the input range determined depending on the reference voltage Vref.

Figure 13:
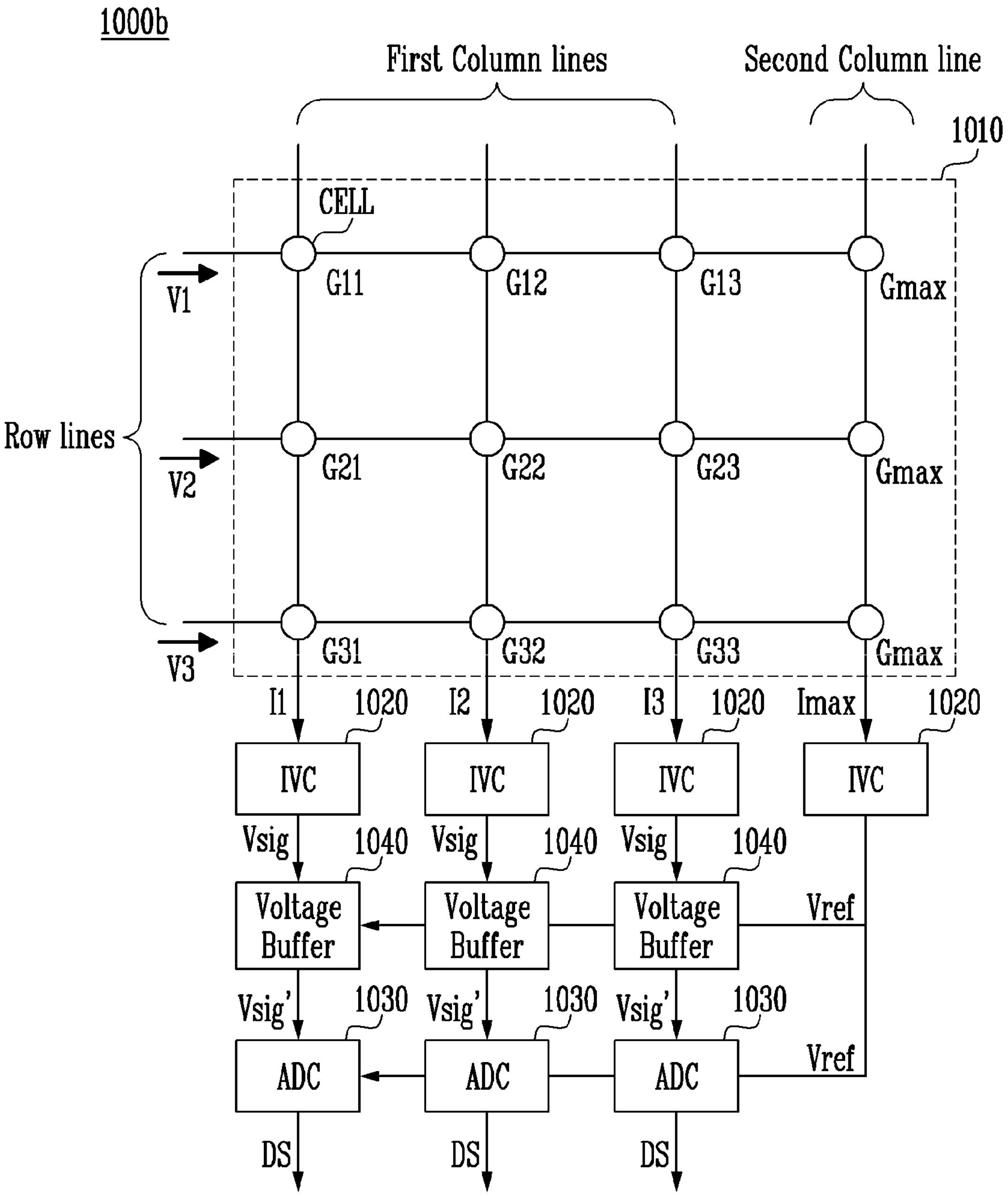
FIG. 13 illustrates an electronic device according to another embodiment of the present disclosure.

FIG. 13 illustrates an electronic device 1000*b* according to another embodiment of the present disclosure.

Referring to FIG. 13, the electronic device 1000*b* further includes a plurality of voltage buffers 1040 compared to the electronic device 1000*a* illustrated in FIG. 10. In FIG. 13, a crossbar array 1010, a plurality of current-to-voltage converters (IVCs) 1020, and a plurality of analog-to-digital converters (ADCs) 1030 are the same as those of FIG. 10, and thus descriptions thereof will be omitted.

Each of the plurality of voltage buffers 1040 may be coupled to and disposed between a corresponding one of the plurality of current-to-voltage converters 1020 and a corresponding one of the plurality of ADCs 1030. Each of the plurality of voltage buffers 1040 may be coupled to a corresponding one of a plurality of first column lines.

In an embodiment, each of the plurality of voltage buffers 1040 may receive an analog signal voltage Vsig from the first column line coupled thereto. For example, the plurality of voltage buffers 1040 may respectively receive a plurality of analog signal voltages Vsig from the respective IVCs 1020 coupled thereto.

In an embodiment, each of the plurality of voltage buffers 1040 may buffer the analog signal voltage Vsig, and may output a buffered analog signal voltage Vsig'. During a process in which the analog signal voltage Vsig is input to the ADC 1030, noise may be contained in the analog signal voltage Vsig. Each of the plurality of voltage buffers 1040 may cancel the noise contained in the analog signal voltage Vsig by buffering the analog signal voltage Vsig.

In an embodiment, the plurality of voltage buffers 1040 may determine the maximum value of an output voltage based on the reference voltage Vref. Here, the output voltage may be the buffered analog signal voltage Vsig'. For example, the plurality of voltage buffers 1040 may receive the reference voltage Vref from the IVC 1020 coupled to a second column line.

Each of the plurality of voltage buffers 1040 may compare the magnitude of the reference voltage Vref with the magnitude of the corresponding analog signal voltage Vsig. When the magnitude of the analog signal voltage Vsig is not greater than the magnitude of the reference voltage Vref, each of the plurality of voltage buffers 1040 may output the buffered analog signal voltage Vsig' depending on a voltage gain. On the other hand, when the magnitude of the analog signal voltage Vsig is greater than the magnitude of the reference voltage Vref, each of the plurality of voltage buffers 1040 may output the buffered analog signal voltage Vsig' having the same magnitude as the reference voltage Vref to the corresponding one of the plurality of ADCs 1030. That is, when the magnitude of the analog signal voltage Vsig is greater than the magnitude of the reference voltage Vref, the magnitude of the buffered analog signal voltage Vsig' may be equal to that of the reference voltage Vref.

The plurality of ADCs 1030 may receive the buffered analog signal voltages Vsig' from the plurality of voltage buffers 1040, respectively. Further, the plurality of ADCs 1030 may receive the reference voltage Vref from the IVC 1020 coupled to the second column line. The plurality of ADCs 1030 may output respective digital signals DS based on results of comparison between the reference voltage Vref and the buffered analog signal voltages Vsig'.

Therefore, in accordance with an embodiment of the present disclosure, an input range of each ADC 1030 may be additionally controlled by the corresponding voltage buffer 1040, and thus error occurring in a quantization operation of the ADC 1030 may be reduced by determining the input range of the ADC 1030 using the corresponding voltage buffer 1040.

Figure 14:
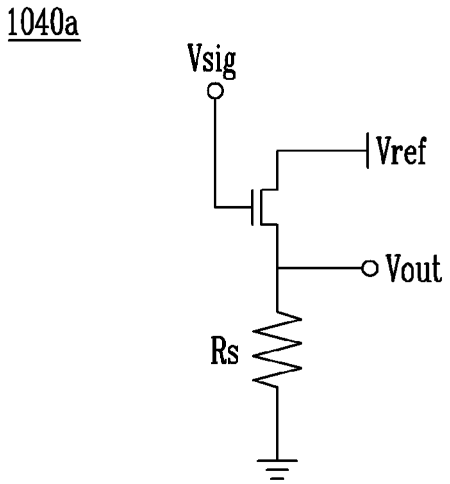
FIGS. 14 and 15 illustrate a voltage buffer according to an embodiment of the present disclosure.
Figure 15:
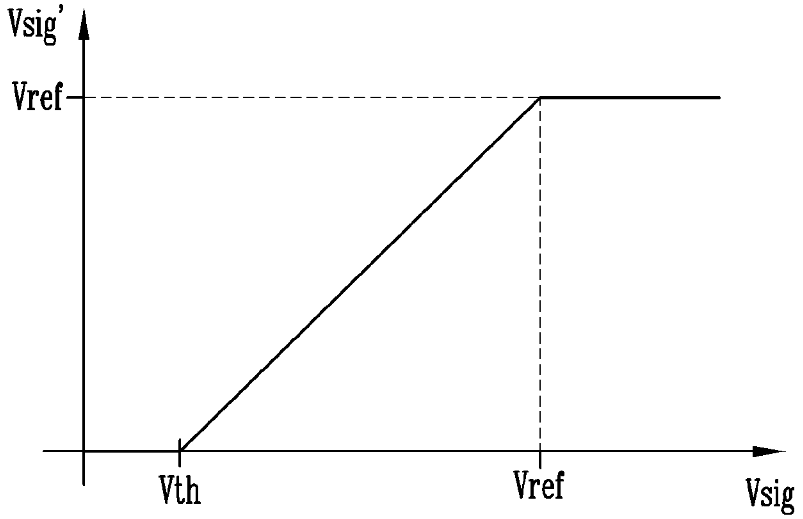

FIGS. 14 and 15 illustrate a voltage buffer 1040*a* and its operation according to an embodiment of the present disclosure.

The voltage buffer 1040*a* illustrated in FIG. 14 may represent an example of the voltage buffer 1040 illustrated in FIG. 13.

Referring to FIG. 14, the voltage buffer 1040*a* may be implemented using a source follower. The voltage buffer 1040*a* may include a MOS transistor and a resistor Rs that are connected in series between a power source and a ground terminal.

For example, the voltage buffer 1040*a* may be configured in a common drain structure in which a common terminal coupled to the power source is coupled to a drain of the MOS transistor. Here, the reference voltage Vref may be set to a supply voltage provided by the power source.

Referring to FIG. 15, when an analog signal voltage Vsig input to a gate of the MOS transistor is less than a threshold voltage Vth, the MOS transistor is turned off, and thus an output voltage Vout (or Vsig') may be 0. When the analog signal voltage Vsig input to the voltage buffer 1040*a* is equal to or greater than the threshold voltage Vth, the output voltage Vout (or Vsig') corresponding to the analog signal voltage Vsig may be output while current flows through the resistor Rs. When the analog signal voltage Vsig is equal to or greater than the reference voltage Vref, the output voltage Vout (or Vsig') may be equal to the reference voltage Vref.

Meanwhile, a voltage gain of the voltage buffer 1040*a* may have a value close to '1,' but it may be set to one of various values in accordance with an embodiment.

For example, when the magnitude of the analog signal voltage Vsig is not greater than the magnitude of the threshold voltage Vth, the MOS transistor is turned off, and thus the voltage buffer 1040*a* may not output any voltage. That is, the output voltage Vout (or Vsig') has 0 V.

On the other hand, when the magnitude of the analog signal voltage Vsig is equal to or greater than the magnitude of the threshold voltage Vth and is not greater than the magnitude of the reference voltage Vref, the MOS transistor is turned on, and thus the output voltage Vout (or Vsig') may have a voltage level corresponding to the magnitude of the analog signal voltage Vsig.

When the magnitude of the analog signal voltage Vsig is greater than the magnitude of the reference voltage Vref, the output voltage Vout (or Vsig') may have the same magnitude as the reference voltage Vref.

That is, the maximum value of the output voltage Vout (or Vsig') output from the voltage buffer 1040*a* may be set to the reference voltage Vref. Accordingly, even if the analog signal voltage Vsig higher than the reference voltage Vref is applied to the voltage buffer 1040*a*, the magnitude of the output voltage Vout (or Vsig') may not be greater than that of the reference voltage Vref.

For example, when the voltage buffer 1040*a* receives the reference voltage Vref of 10 mV, the maximum value output from the voltage buffer 1040*a* may be 10 mV. When the voltage buffer 1040*a* receives an analog signal voltage Vsig of 10 mV, since the magnitude of the analog signal voltage Vsig is greater than that of the threshold voltage Vth and is not greater than that of the reference voltage Vref, the voltage buffer 1040*a* may output the output voltage Vout (or Vsig') in which the voltage gain of the voltage buffer 1040*a* is applied to the analog signal voltage Vsig.

In another example, when the voltage buffer 1040*a* receives the reference voltage Vref of 10 mV, the maximum value output from the voltage buffer 1040*a* may be 10 mV. When the voltage buffer 1040*a* receives an analog signal voltage Vsig of 5 mV, since the magnitude of the analog signal voltage Vsig is greater than that of the threshold voltage Vth and is not greater than that of the reference voltage Vref, the voltage buffer 1040*a* may output the output voltage Vout (or Vsig') in which the voltage gain is applied to the analog signal voltage Vsig.

In still another example, when the voltage buffer 1040*a* receives the reference voltage Vref of 10 mV, the maximum value output from the voltage buffer 1040*a* may be 10 mV. When the voltage buffer 1040*a* receives an analog signal voltage Vsig of 11 mV, since the magnitude of the analog signal voltage Vsig is greater than that of the reference voltage Vref, the voltage buffer 1040*a* may output the output voltage Vout (or Vsig') having the maximum value of 10 mV.

Figure 16:
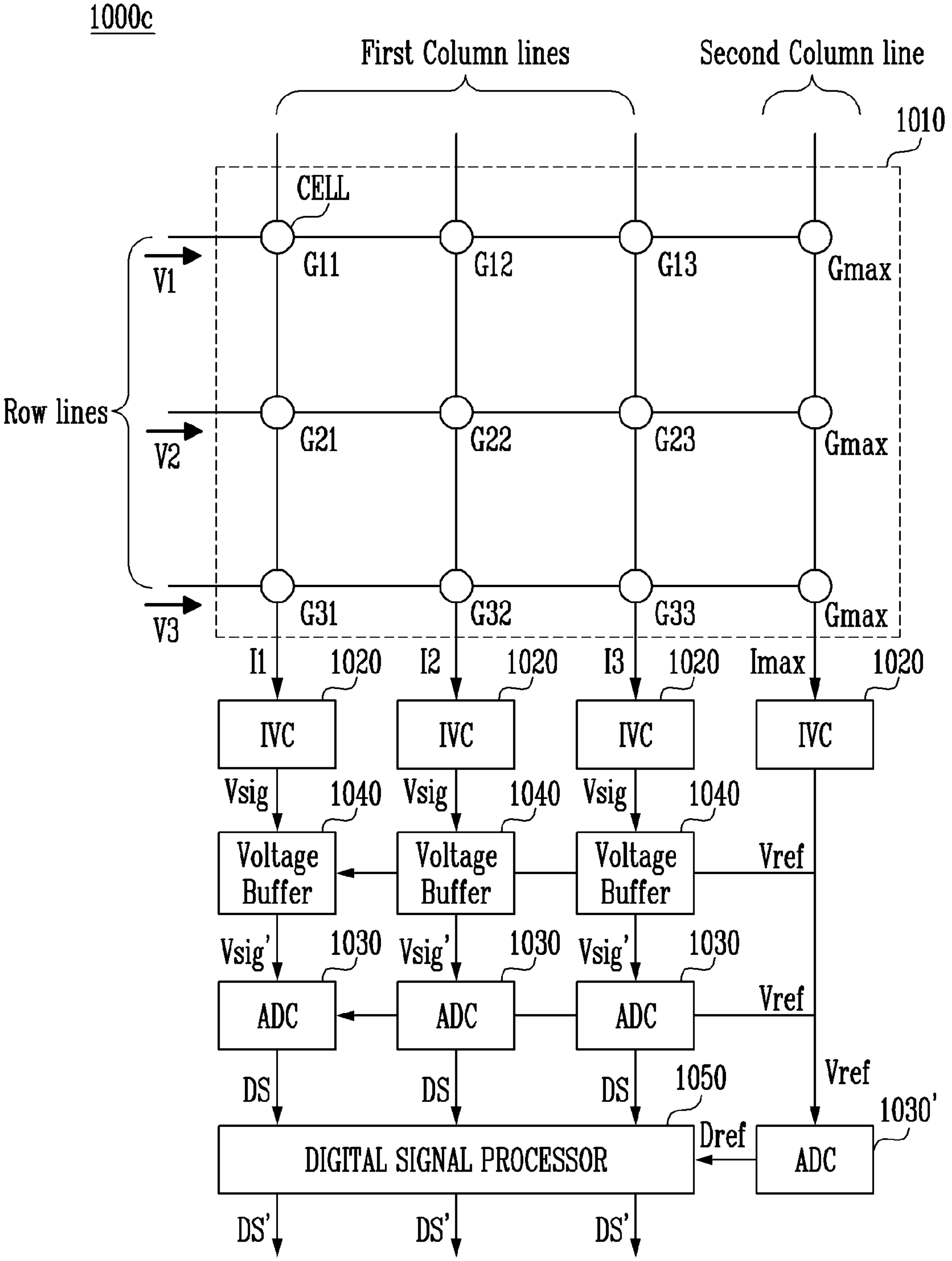
FIG. 16 illustrates an electronic device according to still another embodiment of the present disclosure.

FIG. 16 illustrates an electronic device 1000*c* according to still another embodiment of the present disclosure.

Referring to FIG. 16, the electronic device 1000*c* further includes a digital signal processor 1050 compared to the electronic device 1000*b* illustrated in FIG. 13. In FIG. 16, a crossbar array 1010, a plurality of current-to-voltage converters (IVCs) 1020, a plurality of analog-to-digital converters (ADCs) 1030, and a plurality of voltage buffers 1040 are the same as those of FIG. 13, and thus descriptions thereof will be omitted.

The digital signal processor 1050 may be coupled to the plurality of ADCs 1030. Meanwhile, although FIG. 16 shows one digital signal processor 1050, the number of digital signal processors included in the electronic device 1000*c* may vary according to embodiments.

The digital signal processor 1050 may receive a plurality of digital signals DS that are output from the plurality of ADCs 1030 depending on a plurality of input data. Here, the plurality of digital signals DS may be obtained based on a plurality of input ranges. The plurality of input ranges are determined depending on a plurality of reference voltages, respectively. In an embodiment, the plurality of reference voltages may be generated based on the plurality of input data that are input at different time points and a maximum conductance value.

Also, the digital signal processor 1050 may receive a digital reference signal Dref corresponding to a reference voltage Vref. For example, an ADC 1030' may be coupled to and disposed between a second column line and the digital signal processor 1050. The ADC 1030' may receive the reference voltage Vref, and may convert the reference voltage Vref into the digital reference signal Dref. The ADC 1030' may provide the digital reference signal Dref to the digital signal processor 1050.

In an embodiment, the digital signal processor 1050 may output digital operation signals DS' based on the digital signals DS and the digital reference signal Dref. Here, the digital operation signals DS' may be digital signals having a distribution range that corresponds to a previous normal distribution range. Here, the previous normal distribution range may be a normal distribution range of the plurality of analog signal voltages Vsig corresponding to the plurality of digital signals DS. That is, the previous normal distribution range may represent a range formed by consecutive values of the analog signal voltages Vsig before the analog signal voltages Vsig are converted into the digital signals DS by the ADCs 1030.

In an embodiment, the digital signal processor 1050 may perform multiply operations on the digital signals DS and the digital reference voltage Dref and output the digital operation signals DS' as a result of the multiply operations.

In an embodiment, the digital signal processor 1050 may output the digital operation signals DS' at different time points based on the plurality of reference voltages and the plurality of digital signals DS output from the plurality of ADCs 1030 to which the plurality of reference voltages are applied.

For example, the digital signal processor 1050 may perform a multiply operation on any one of the plurality of digital signals DS and the digital reference signal Dref corresponding to the reference voltage Vref used to generate the one digital signal DS. The digital signal processor 1050 may output a digital operation signal DS' as a result of the multiply operation.

In an embodiment, the electronic device 1000*c* may perform a digital signal processing operation using the plurality of digital operation signals DS'. Here, the digital signal processing operation may be an operation of performing any of tasks such as noise cancellation, filtering, error removal, error detection, and calculation on digital signals.

Figure 17A:
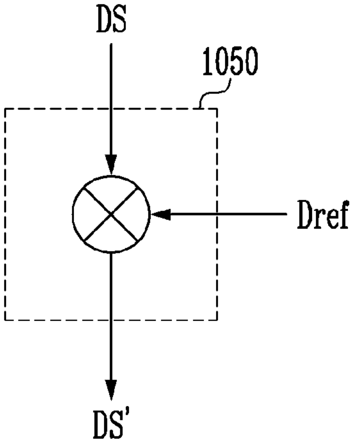
FIGS. 17A and 17B illustrate a digital signal controller according to an embodiment of the present disclosure.
Figure 17B:
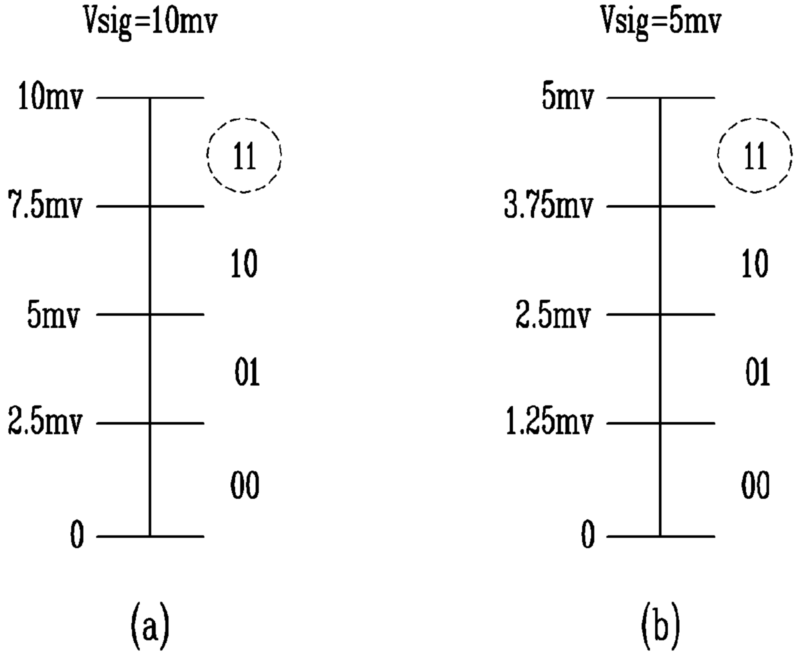

FIGS. 17A and 17B illustrate a digital signal processor according to an embodiment of the present disclosure. The digital signal processor illustrated in FIG. 17A may correspond to the digital signal processor 1050 shown in FIG. 16, and thus the digital signal processor 1050 may be described with reference to FIG. 16.

Referring to FIG. 17A, the digital signal processor 1050 may perform a multiply operation on a digital signal DS, output from an ADC 1030 and a digital reference signal Dref, and may output a digital operation signal DS' as a result of the multiply operation.

In an embodiment, an output value of the ADC 1030 may be represented by the following Equation (2):

$$ADC\ Out = \frac{V_{sig}}{V_{ref}} \times \left(2^{bit} - 1\right) \tag{2}$$

In Equation (2), ADC Out may denote the output value of the ADC 1030, Vsig may denote an analog signal voltage input to the ADC 1030, Vref may denote a reference voltage, and bit may denote a resolution.

Referring to Equation (2), the output value of the ADC 1030 is in inverse proportion to the reference voltage Vref. Here, the reference voltage Vref may vary with input data that is input to the crossbar array 1010. That is, whenever the input data varies, the reference voltage Vref applied to the ADC 1030 may also vary. Therefore, in order to perform an operation between digital signals DS to which different reference voltages are applied, the digital signals DS need to be corrected.

For example, referring to FIG. 17B, when the reference voltage Vref is 10 mV and the analog signal voltage Vsig is 10 mV, as shown in (a), the ADC 1030 may output '11' as a digital signal DS. For example, when the reference voltage Vref is 5 mV and the analog signal voltage Vsig is 5 mV, as shown in (b), the ADC 1030 may output '11' as a digital signal DS. As described above, since the reference voltage Vref varies with the input data, the output values of the ADC 1030 may be equal to each other even if the analog signal voltages Vsig are different from each other.

In this case, in order to perform a digital signal processing operation using digital signals DS, which are output based on different reference voltages Vref, the digital signals DS need to be corrected to have the previous normal distribution range.

Therefore, the digital signal processor 1050 may output a digital operation signal DS' by multiplying the digital signal DS by the digital reference voltage Dref.

For example, the digital operation signal DS' may be represented by the following Equation (3):

$$DS' = DS \times Dref \tag{3}$$

In detail, the digital signal DS may be a signal output from the corresponding ADC 1030 to which a gain corresponding to the reference voltage Vref is applied. Therefore, the digital signal DS may be corrected by multiplying the digital signal DS by the reciprocal of the gain applied to the ADC 1030. This operation is formulated in Equation (3), wherein the reciprocal of the gain may be multiplied by the digital signal DS by multiplying the digital reference signal Dref by the digital signal DS. Accordingly, the digital operation signal DS' may have a signal value before the gain is applied to the analog-to-digital converter 1030.

Figure 18A:
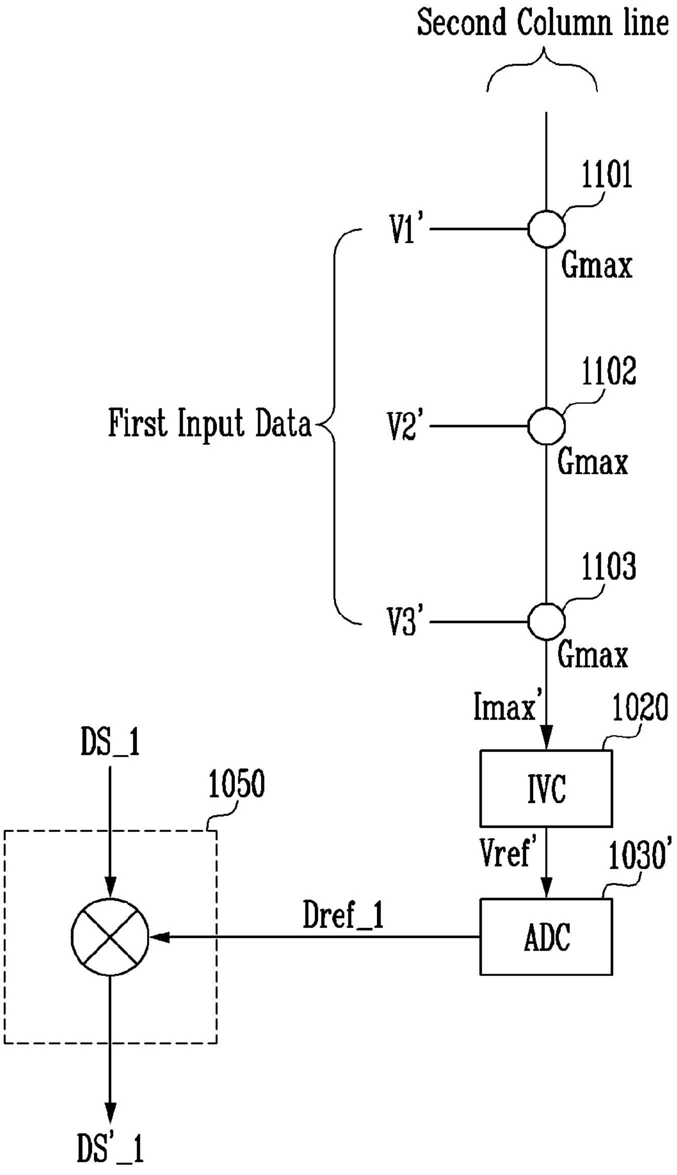
FIGS. 18A and 18B illustrate an operation of a digital signal controller according to an embodiment of the present disclosure.
Figure 18B:
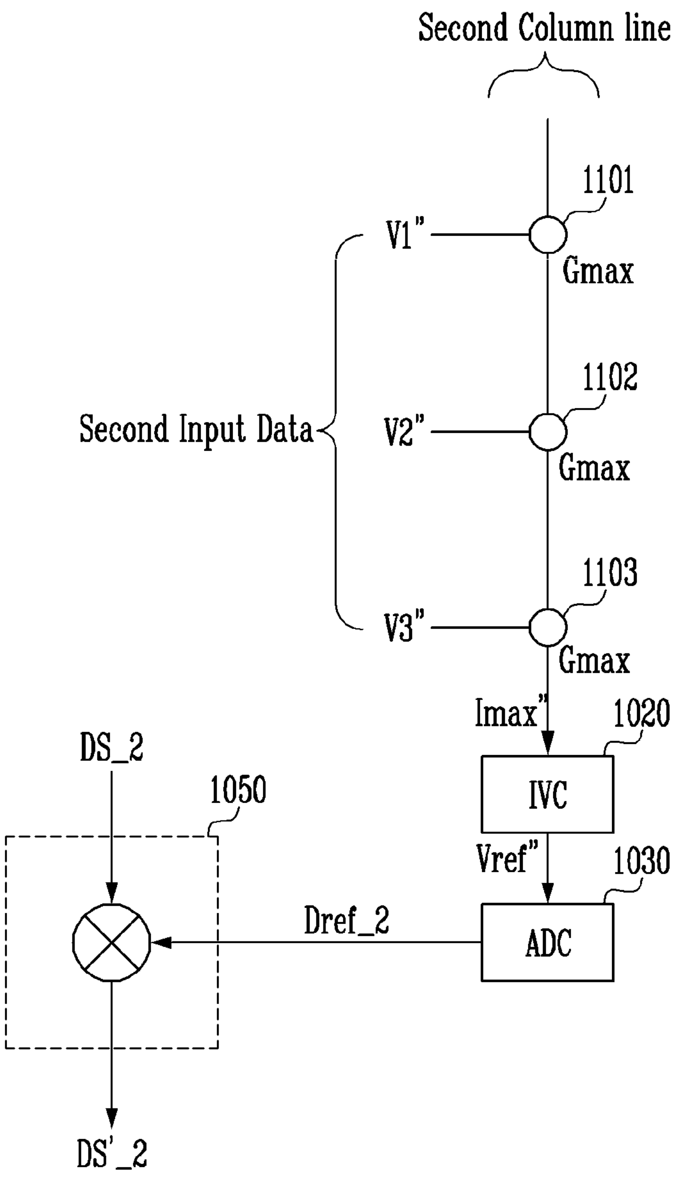

FIGS. 18A and 18B illustrate an operation of the digital signal processor 1050 of FIG. 16 according to an embodiment of the present disclosure.

Referring to FIG. 18A, a plurality of input voltages V1' to V3' corresponding to first input data may be input through a plurality of row lines. A multiply-accumulate operation may be performed on the plurality of input voltages V1' to V3' and a maximum conductance value Gmax stored in each of memory cells 1101, 1102, and 1103 coupled to a second column line, and a maximum output current Imax' may be output as a result of the multiply-accumulate operation. The maximum output current Imax' may be converted into a reference voltage Vref' by an IVC 1020 coupled to the second column line. The reference voltage Vref' may be converted into a digital reference signal Dref_1 by an ADC 1030'.

The digital signal processor 1050 may receive the digital reference signal Dref_1. Further, the digital signal processor 1050 may receive a digital signal DS_1 from one of a plurality of first column lines. Here, the digital signal DS_1 may correspond to an analog signal voltage that is generated by performing a multiply-accumulate operation on the plurality of input voltages V1' to V3' and conductance values stored in memory cells coupled to one of the plurality of first column lines. The digital signal processor 1050 may perform a multiply operation on the digital signal DS_1 and the digital reference signal Dref_1, and may output a digital operation signal DS'_1.

Referring to FIG. 18B, a plurality of input voltages V1" to V3" corresponding to second input data may be input through the plurality of row lines. Here, the second input data may be input to the plurality of row lines after the first input data has been input. A multiply-accumulate operation may be performed on the plurality of input voltages V1" to V3" and the maximum conductance value Gmax stored in each of the memory cells 1101, 1102, and 1103 coupled to the second column line, and a maximum output current Imax" may be output as a result of the multiply-accumulate operation. The maximum output current Imax" may be converted into a reference voltage Vref" by the IVC 1020 coupled to the second column line. The reference voltage Vref" may be converted into a digital reference signal Dref_2 by the ADC 1030'.

The digital signal processor 1050 may receive the digital reference signal Dref_2. Further, the digital signal processor 1050 may receive a digital signal DS_2 from one of the plurality of first column lines. Here, the digital signal DS_2 may correspond to an analog signal voltage that is output through a multiply-accumulate operation performed on the plurality of input voltages V1" to V3" and conductance values stored in memory cells included in one of the plurality of first column lines. The digital signal processor 1050 may perform a multiply operation on the digital signal DS_2 and the digital reference signal Dref_2, and may output a digital operation signal DS'_2.

In an embodiment, the electronic device 1000*c* of FIG. 16 may perform a digital signal processing operation using the digital operation signal DS'_1 output for the first input data and the digital operation signal DS'_2 output for the second input data.

Figure 19:
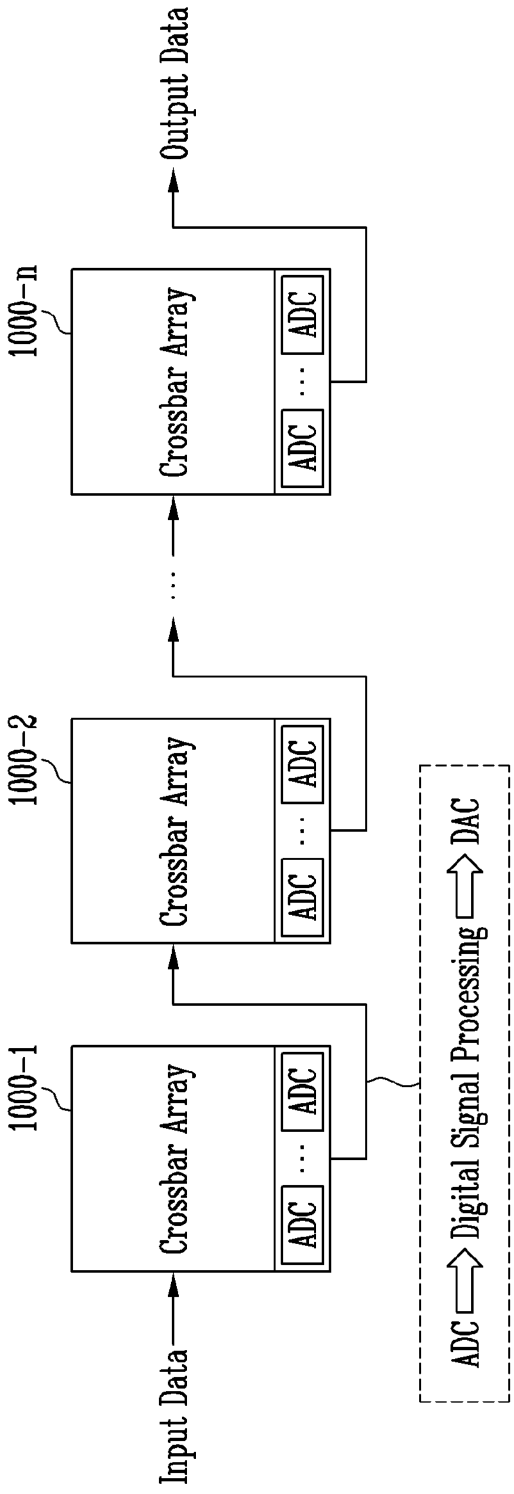
FIG. 19 illustrates a neural network operation using a plurality of electronic devices according to an embodiment of the present disclosure.

FIG. 19 illustrates a neural network operation using a plurality of electronic devices 1000-1 to 1000-*n* according to an embodiment of the present disclosure.

Referring to FIG. 19, each of the plurality of electronic devices 1000-1 to 1000-*n* may correspond to any one of the electronic device 1000*a* of FIG. 10, the electronic device 1000*b* of FIG. 13, and the electronic device 1000*c* of FIG. 16.

The plurality of electronic devices 1000-1 to 1000-*n* may be devices for implementing respective layers included in a neural network. For example, when n layers are included in the neural network, the plurality of electronic devices 1000-1 to 1000-*n* may implement the n layers, respectively.

Each of the plurality of electronic devices 1000-1 to 1000-*n* may perform a multiply-accumulate operation on input data using a crossbar array. Each of the plurality of electronic devices 1000-1 to 1000-*n* may output results of the multiply-accumulate operations using a plurality of ADCs as digital signals. The digital signals may be input to a subsequent electronic device as input data of the subsequent electronic device.

In an embodiment, each of the plurality of electronic devices 1000-1 to 1000-*n* may further include a plurality of digital-to-analog converters (DACs). Each of the plurality of electronic devices 1000-1 to 1000-*n* may convert the digital signals input from a previous electronic device into a plurality of input voltages using the plurality of DACs. Thereafter, as described above, the plurality of electronic devices 1000-1 to **1000-*n*** may finally output output data corresponding to the input data by repeatedly performing the multiply-accumulate operation.

In an embodiment, before digital signals output from any one electronic device are provided to a subsequent electronic device, a digital signal processing operation may be performed on the digital signals.

For example, the first electronic device 1000-1 may output digital signals through the plurality of ADCs. Also, the first electronic device 1000-1 may perform a digital signal processing operation on the digital signals. In an embodiment, the digital signal processing operation may be performed using the digital signal processor 1050, described above with reference to FIGS. 16, 17A, 17B, 18A, and 18B. Thereafter, the digital signals on which the digital signal processing operation has been performed may be provided to the second electronic device 1000-2. The second electronic device 1000-2 may convert the digital signals into a plurality of input voltages using the DAC. Thereafter, the second electronic device 1000-2 may perform a multiply-accumulate operation on the plurality of input voltages.

Therefore, the neural network operation may be performed through the operations of the plurality of electronic devices 1000-1 to **1000-*n***.

Figure 20:
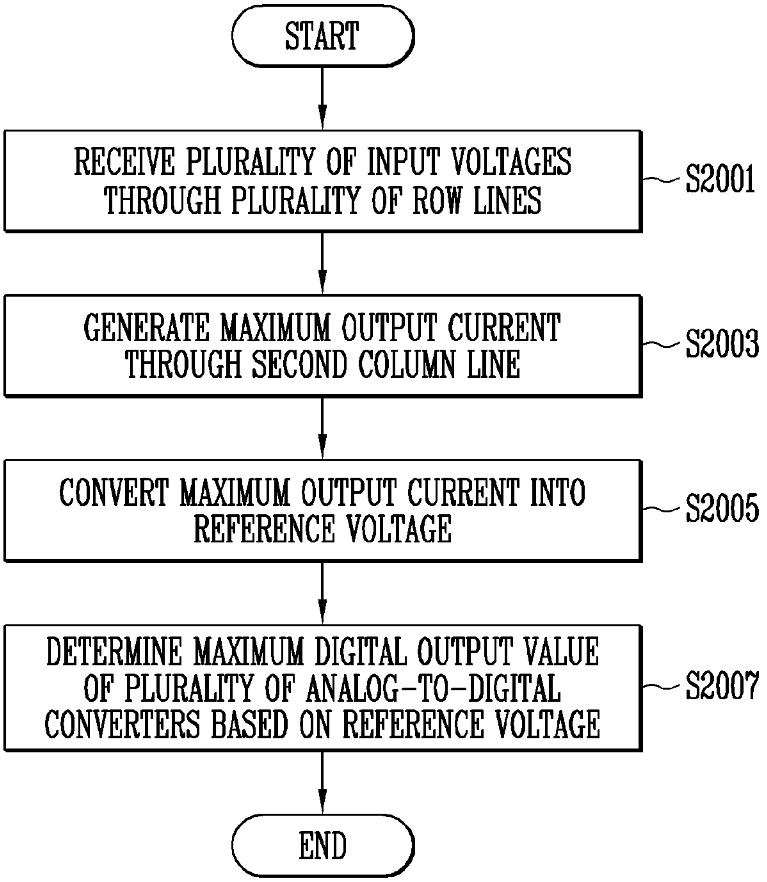
FIG. 20 is a flowchart illustrating a method of operating an electronic device according to an embodiment of the present disclosure.

FIG. 20 is a flowchart illustrating a method of operating an electronic device according to an embodiment of the present disclosure.

The method illustrated in FIG. 20 may be performed by any one of the electronic device **1000*a* of FIG. 10, the electronic device 1000*b* of FIG. 13, and the electronic device 1000*c* of FIG. 16. Hereinafter, although the method of operating the electronic device 1000*c* of FIG. 16 is described for convenience of description, the method may be equally applied to the electronic device 1000*a* of FIG. 10 and the electronic device 1000*b* of FIG. 13**.

Referring to FIGS. 16 and 20, at step S2001, the electronic device **1000*c* may receive the plurality of input voltages V1 to V3** through the plurality of row lines, respectively.

At step S2003, the electronic device **1000*c* may generate the maximum output current Imax based on the maximum conductance value Gmax and the plurality of input voltages V1 to V3 and output the maximum output current Imax through the second column line. The maximum conductance value Gmax may be a conductance value having the largest magnitude, among the conductance values G11 to G33 stored in the plurality of memory cells coupled to the plurality of first column lines. For example, the electronic device 1000*c* may generate the maximum output current Imax by performing a multiply-accumulate operation on the maximum conductance value Gmax and the plurality of input voltages V1 to V3**.

At step S2005, the electronic device **1000*c* may convert the maximum output current Imax into the reference voltage Vref. For example, the electronic device 1000*c* may convert the maximum output current Imax into the reference voltage Vref using the current-to-voltage converter (IVC) 1020** coupled to the second column line.

At step S2007, the electronic device **1000*c* may determine the maximum value of an input range of the plurality of ADCs 1030 based on the reference voltage Vref. In an embodiment, the electronic device 1000*c* may determine the reference voltage Vref to be the maximum value of the input range of the plurality of ADCs 1030. In another embodiment, the electronic device 1000*c* may determine the maximum value of the input range by applying a gain corresponding to the reference voltage Vref to the plurality of ADCs 1030**.

Figure 21:
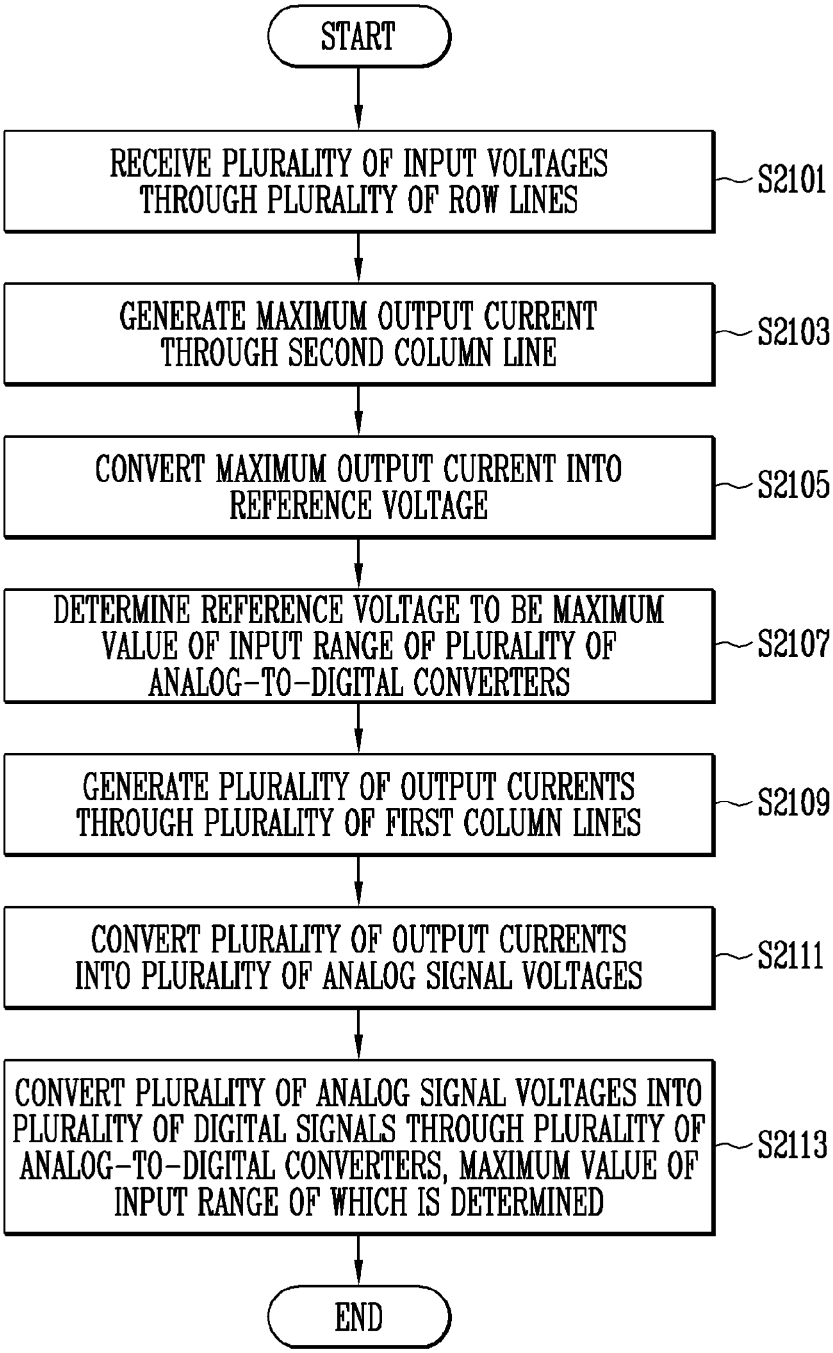
FIG. 21 is a flowchart illustrating a method of operating an electronic device according to another embodiment of the present disclosure.

FIG. 21 is a flowchart illustrating a method of operating an electronic device according to another embodiment of the present disclosure.

The method illustrated in FIG. 21 may be performed by any one of the electronic device **1000*a* of FIG. 10, the electronic device 1000*b* of FIG. 13, and the electronic device 1000*c* of FIG. 16. Hereinafter, although the method of operating the electronic device 1000*c* of FIG. 16 is described for convenience of description, the method may be equally applied to the electronic device 1000*a* of FIG. 10 and the electronic device 1000*b* of FIG. 13**.

Referring to FIGS. 16 and 21, at step S2101, the electronic device **1000*c* may receive the plurality of input voltages V1 to V3** through the plurality of row lines, respectively.

At step S2103, the electronic device **1000*c* may generate the maximum output current Imax based on the maximum conductance value Gmax and the plurality of input voltages V1 to V3 and output the maximum output current Imax through the second column line. The maximum conductance value Gmax may be a conductance value having the largest magnitude, among the plurality of conductance values G11 to G33 respectively stored in the plurality of memory cells coupled to the plurality of first column lines. For example, the electronic device 1000*c* may generate the maximum output current Imax by performing a multiply-accumulate operation on the maximum conductance value Gmax and the plurality of input voltages V1 to V3**.

At step S2105, the electronic device **1000*c* may convert the maximum output current Imax into the reference voltage Vref. For example, the electronic device 1000*c* may convert the maximum output current Imax into the reference voltage Vref using the current-to-voltage converter (IVC) 1020** coupled to the second column line.

At step S2107, the electronic device **1000*c* may determine the reference voltage Vref to be the maximum value of the input range of the plurality of ADCs 1030**.

At step S2109, the electronic device **1000*c* may generate the plurality of output currents I1 to I3 based on the plurality of input voltages V1 to V3 and the plurality of conductance values G11 to G33 stored in the plurality of memory cells and output the plurality of output currents I1 to I3 through the plurality of first column lines, respectively. For example, the electronic device 1000*c* may generate the plurality of output currents I1 to I3 by performing a multiply-accumulate operation on the plurality of input voltages V1 to V3 and the plurality of conductance values G11 to G33**.

At step S2111, the electronic device **1000*c* may convert the plurality of output currents I1 to I3 into the plurality of analog signal voltages Vsig. For example, the electronic device 1000*c* may convert the plurality of output currents I1 to I3 into the plurality of analog signal voltages Vsig using the current-to-voltage converters 1020 respectively coupled to the plurality of first column lines. In an embodiment, the electronic device 1000*c* may buffer the analog signal voltages Vsig using the plurality of voltage buffers 1040, and may provide the buffered analog signal voltages Vsig' to the plurality of ADCs 1030**.

At step S2113, the electronic device **1000*c* may convert the plurality of analog signal voltages Vsig or the buffered analog signal voltages Vsig' into the plurality of digital signals DS using the plurality of ADCs 1030**, the maximum value of the input range of which has been determined to be the reference voltage Vref.

Figure 22:
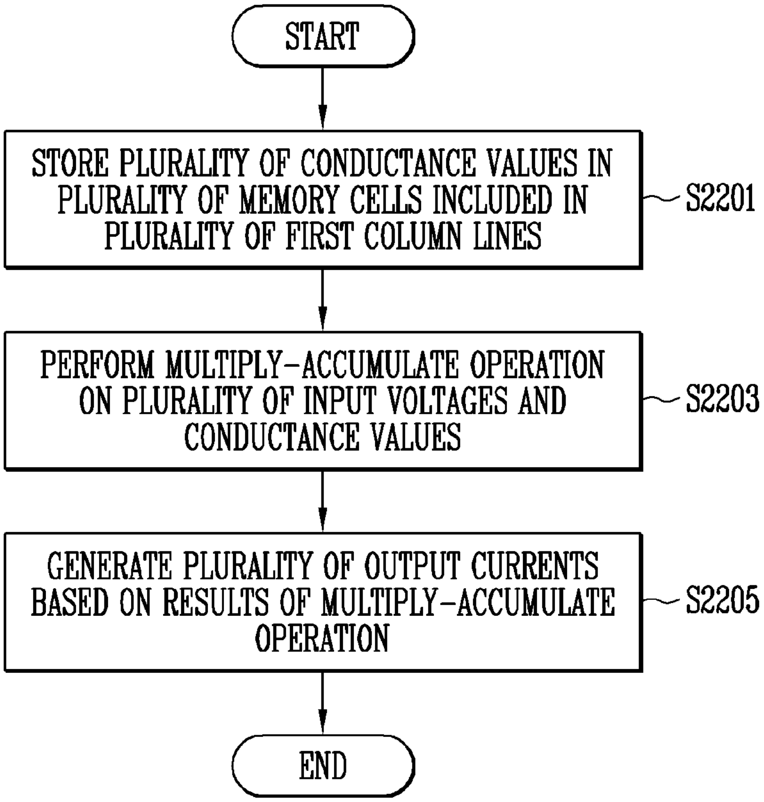
FIG. 22 is a flowchart illustrating a method of outputting a plurality of output currents through a plurality of first column lines according to an embodiment of the present disclosure.

FIG. 22 is a flowchart illustrating a method of outputting a plurality of output currents through a plurality of first column lines according to an embodiment of the present disclosure.

The method illustrated in FIG. 22 may be performed by any one of the electronic device 1000*a* of FIG. 10, the electronic device 1000*b* of FIG. 13, and the electronic device 1000*c* of FIG. 16. Hereinafter, although the method of operating the electronic device 1000*c* of FIG. 16 is described for convenience of description, the method may be equally applied to the electronic device 1000*a* of FIG. 10 and the electronic device 1000*b* of FIG. 13.

Also, the method illustrated in FIG. 22 may be a method of embodying step S2109 of FIG. 21.

Referring to FIGS. 16 and 22, at step S2201, the electronic device 1000*c* may store the plurality of conductance values G11 to G33 in the plurality of memory cells coupled to the plurality of first column lines. Here, the plurality of conductance values G11 to G33 may correspond to a plurality of weight data.

At step S2203, the electronic device 1000*c* may perform a multiply-accumulate operation on the plurality of input voltages V1 to V3 and the plurality of conductance values G11 to G33. For example, the electronic device 1000*c* may perform multiply operations on the plurality of input voltages V1 to V3 and the plurality of conductance values G11 to G33. After that, the electronic device 1000*c* may perform an accumulate operation on results of the multiply operations.

At step S2205, the electronic device 1000*c* may generate the plurality of output currents I1 to I3 based on results of the multiply-accumulate operation.

Figure 23:
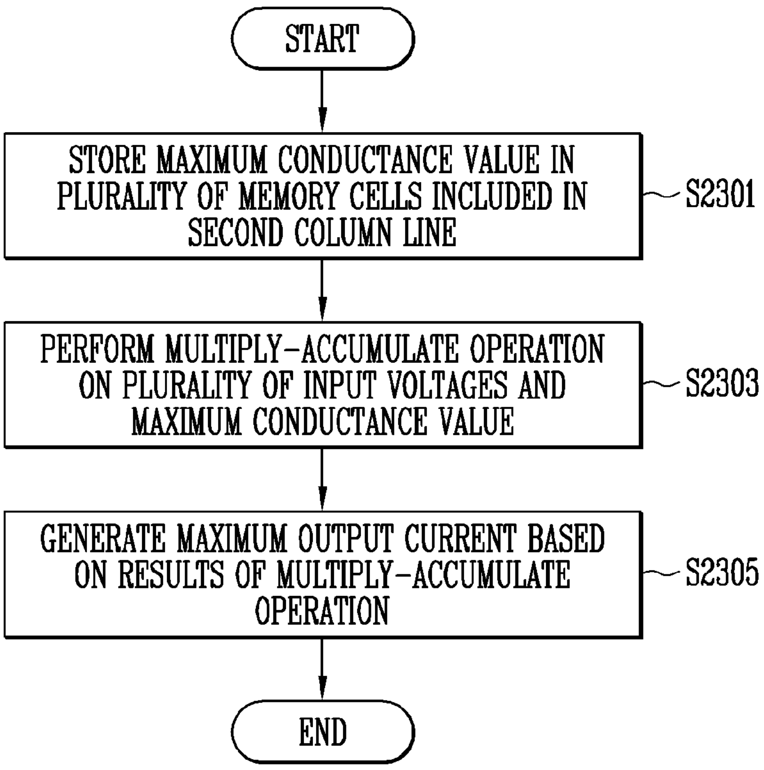
FIG. 23 is a flowchart illustrating a method of outputting a maximum output current through a second column line according to an embodiment of the present disclosure.

FIG. 23 is a flowchart illustrating a method of outputting a maximum output current through a second column line according to an embodiment of the present disclosure.

The method illustrated in FIG. 23 may be performed by any one of the electronic device 1000*a* of FIG. 10, the electronic device 1000*b* of FIG. 13, and the electronic device 1000*c* of FIG. 16. Hereinafter, although the method of operating the electronic device 1000*c* of FIG. 16 is described for convenience of description, the method may be equally applied to the electronic device 1000*a* of FIG. 10 and the electronic device 1000*b* of FIG. 13.

Also, the method illustrated in FIG. 23 may be a method of embodying step S2103 of FIG. 21.

Referring to FIGS. 16 and 23, at step S2301, the electronic device 1000*c* may store the maximum conductance value Gmax in each of the plurality of memory cells coupled to the second column line.

At step S2303, the electronic device 1000*c* may perform a multiply-accumulate operation on the plurality of input voltages V1 to V3 and the maximum conductance value Gmax. For example, the electronic device 1000*c* may perform multiply operations on the plurality of input voltages V1 to V3 and the maximum conductance value Gmax. After that, the electronic device 1000*c* may perform an accumulate operation on results of the multiply operations.

At step S2305, the electronic device 1000*c* may generate the maximum output current Imax based on results of the multiply-accumulate operation.

Figure 24:
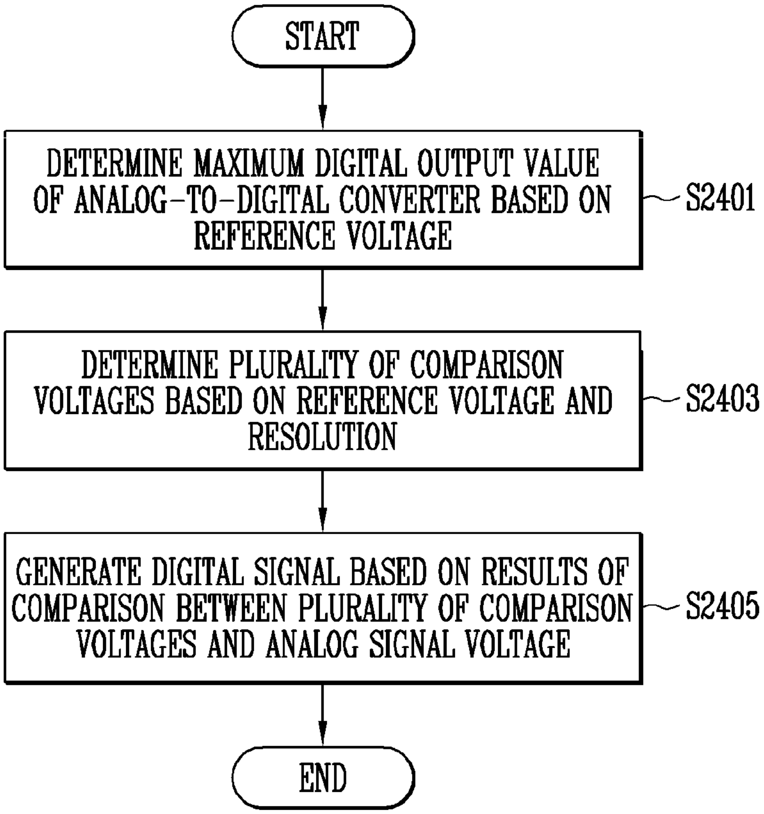
FIG. 24 is a flowchart illustrating a method of outputting a digital signal through an analog-to-digital converter according to an embodiment of the present disclosure.

FIG. 24 is a flowchart illustrating a method of outputting a digital signal through an analog-to-digital converter according to an embodiment of the present disclosure.

The method illustrated in FIG. 24 may be performed by any one of the electronic device 1000*a* of FIG. 10, the electronic device 1000*b* of FIG. 13, and the electronic device 1000*c* of FIG. 16. Hereinafter, although the method of operating the electronic device 1000*c* of FIG. 16 is described for convenience of description, the method may be equally applied to the electronic device 1000*a* of FIG. 10 and the electronic device 1000*b* of FIG. 13.

Also, the method illustrated in FIG. 24 may be a method for embodying step S2113 of FIG. 21.

Referring to FIGS. 16 and 24, at step S2401, the electronic device 1000*c* may determine the maximum value of an input range of the ADC 1030 based on the reference voltage Vref. In an embodiment, the minimum value of the input range of the ADC 1030 may be 0 or the negative value of the reference voltage Vref, i.e., −Vref.

At step S2403, the electronic device 1000*c* may determine a plurality of comparison voltages based on the reference voltage Vref and the resolution of the ADC 1030. For example, when the resolution is 2 bits, the ADC 1030 may output a digital signal indicating any one of '00,' '01,' '10,' and '11.' Therefore, the electronic device 1000*c* may determine the plurality of comparison voltages for identifying four types of digital signals within the input range.

At step S2405, the electronic device 1000*c* may generate a digital signal DS based on results of comparison between the plurality of comparison voltages and an analog signal voltage Vsig.

Figure 25:
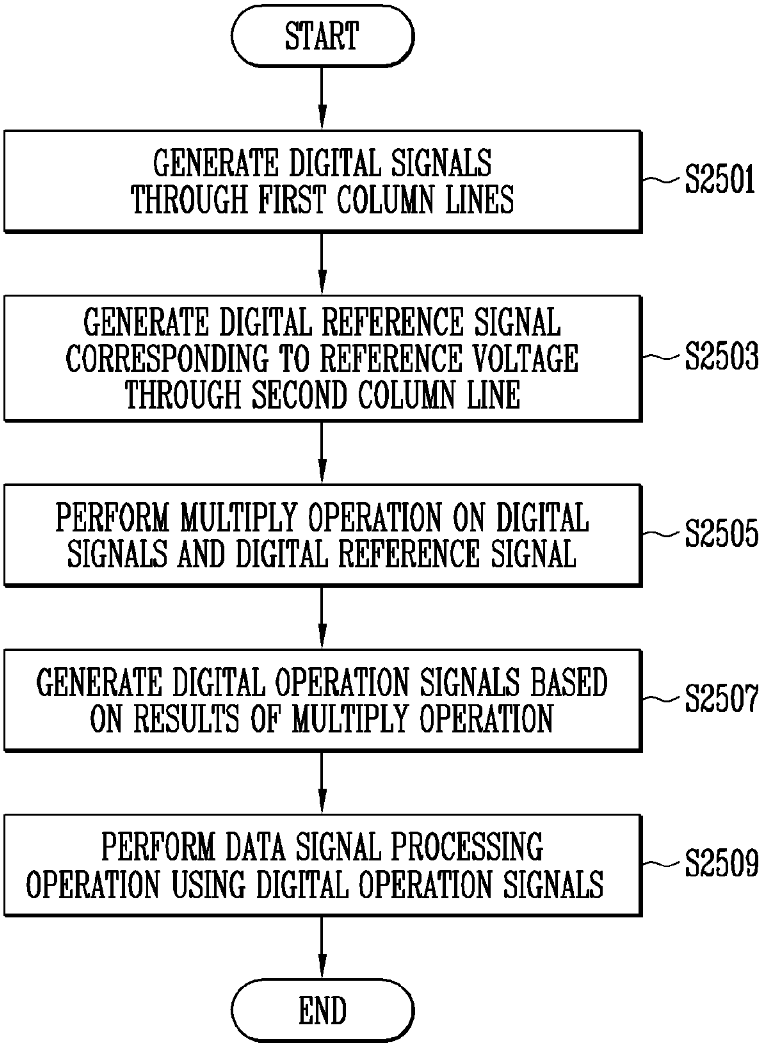
FIG. 25 is a flowchart illustrating a method of performing a digital signal processing operation according to an embodiment of the present disclosure.

FIG. 25 is a flowchart illustrating a method of performing a digital signal processing operation according to an embodiment of the present disclosure.

The method illustrated in FIG. 25 may be performed by, for example, the electronic device 1000*c* illustrated in FIG. 16.

Referring to FIGS. 16 and 25, at step S2501, the electronic device 1000*c* may generate the digital signals DS through the plurality of first column lines.

At step S2503, the electronic device 1000*c* may generate the digital reference signal Dref corresponding to the reference voltage Vref. For example, the electronic device 1000*c* may convert the reference voltage Vref into the digital reference signal Dref using the ADC 1030' coupled to the second column line.

At step S2505, the electronic device 1000*c* may perform a multiply operation on the digital signals DS, generated through the plurality of first column lines, and the digital reference signal Dref.

At step S2507, the electronic device 1000*c* may generate digital operation signals DS' based on results of the multiply operation.

At step S2509, the electronic device 1000*c* may perform the data signal processing operation using the digital operation signals DS'.

Figure 26:
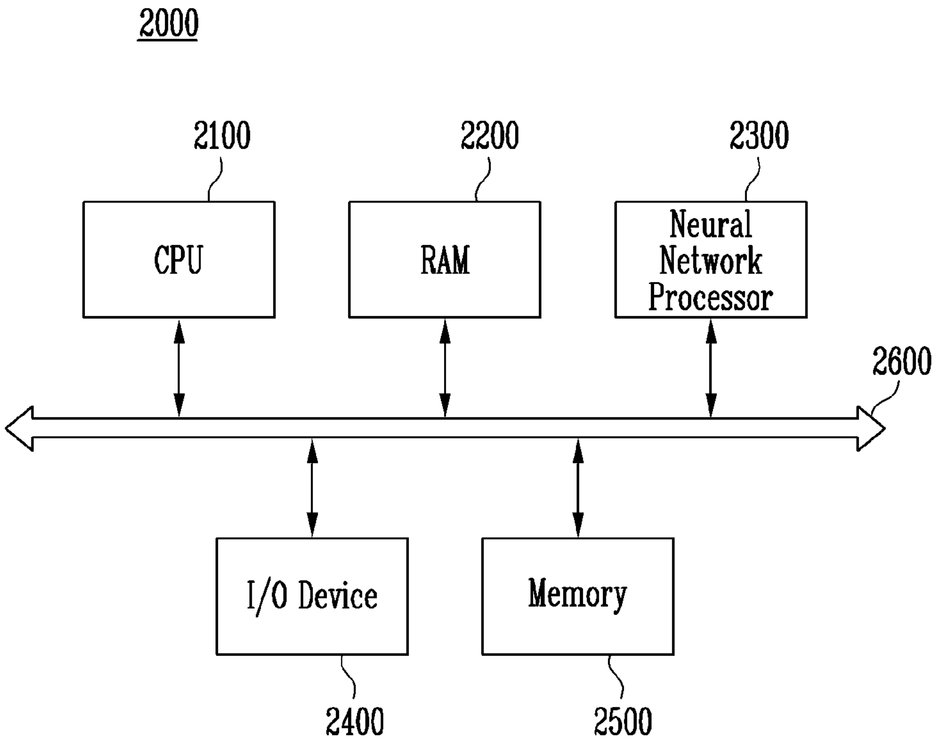
FIG. 26 illustrates a computing system according to an embodiment of the present disclosure.

FIG. 26 illustrates a computing system 2000 according to an embodiment of the present disclosure.

Referring to FIG. 26, the computing system 2000 may analyze input data in real time using a neural network, extract valid information from the input data, and determine a situation of an electronic device in which the computing system 2000 is installed or control components of the electronic device, based on the extracted information. For example, the computing system 2000 may be applied to a drone, an Advanced Drivers Assistance System (ADAS), a smart TV, a smartphone, a medical appliance, a mobile device, an image display device, a measuring device, an Internet of Things (IoT) device, etc., and may be installed in any one of various types of electronic devices in addition to these examples.

The computing system 2000 may include a Central Processing Unit (CPU) 2100, a Random Access Memory (RAM) 2200, a neural network processor 2300, an input/output (I/O) device 2400, and a memory 2500. The computing system 2000 may further include one or more of other universal components such as a Multi-Format Codec (MFC), a video module (e.g., a camera interface, a Joint Photographic Experts Group (JPEG) processor, a video processor, a mixer, or the like), a 3D graphics core, an audio system, a display driver, a Graphic Processing Unit (GPU), or a Digital Signal Processor (DSP), and the like. The CPU 2100, the RAM 2200, the neural network processor 2300, the input/output device 2400, and the memory 2500 may transmit/receive data through a communication bus 2600.

In an embodiment, the components of the computing system 2000, that is, the CPU 2100, the RAM 2200, the neural network processor 2300, the input/output device 2400, and the memory 2500 may be integrated into a single semiconductor chip, and the computing system 2000 may be implemented as, for example, a System-on-Chip (SoC). However, embodiments are not limited thereto. In another embodiment, the computing system 2000 may be implemented using a plurality of semiconductor chips. In an embodiment, the computing system 2000 may be an application processor installed in a mobile device.

The CPU 2100 may control the overall operation of the computing system 2000. The CPU 2100 may have a single-core structure or a multi-core structure having multiple cores. The CPU 2100 may process or execute programs and/or data stored in the RAM 2200 and the memory 2500. For example, the CPU 2100 may control functions of the computing system 2000 by executing the programs stored in the memory 2500.

The RAM 2200 may temporarily store programs, data, or instructions. For example, the programs and/or data stored in the memory 2500 may be temporarily loaded into the RAM 2200 under the control of the CPU 2100 or according to a boot code. The RAM 2200 may be implemented using a memory such as a Dynamic RAM (DRAM) or a Static RAM (SRAM).

The input/output device 2400 may receive user's input or input data from an external system, and may output results of data processed by the computing system 2000. The input/output device 2400 may be implemented as a touch screen panel, a keyboard, any of various types of sensors, or the like. In an embodiment, the input/output device 2400 may collect information surrounding the computing system 2000. For example, the input/output device 2400 may include at least one of various types of sensing devices such as an imaging device, an image sensor, a light detection and ranging (LiDAR) sensor, an ultrasonic sensor, and an infrared sensor, or may receive a sensing signal from such a device.

The memory 2500 may be a storage device for storing data, and may store, for example, an operating system (OS), various types of programs, and various types of data. The memory 2500 may be, but is not limited to, a DRAM. The memory 2500 may include at least one of a volatile memory and a nonvolatile memory. Examples of the nonvolatile memory include a read only memory (ROM), a programmable ROM (PROM), an electrically programmable ROM (EPROM), an electrically erasable programmable ROM (EEPROM), a flash memory, a phase-change RAM (PRAM), a magnetic RAM (MRAM), a resistive RAM (RRAM), and a ferroelectric RAM (FRAM). Examples of the volatile memory include a dynamic RAM (DRAM), a static RAM (SRAM), and a synchronous DRAM (SDRAM). Also, in an embodiment, the memory 2500 may be implemented as a storage device such as a Hard Disk Drive (HDD), a Solid-State Drive (SSD), a Compact Flash (CF), Secure Digital (SD), Micro Secure Digital (Micro-SD), Mini Secure Digital (Mini-SD), extreme digital (xD), a Memory Stick, or the like.

The neural network processor 2300 may include the neural network, train the neural network (or allow the neural network to perform learning), perform an operation based on received input data, or generate an information signal or re-train the neural network based on results of the operation. The neural network may include, but is not limited to, any of various types of neural networks such as a Convolution Neural Network (CNN), Region with Convolution Neural Network (R-CNN), a Region Proposal Network (RPN), a Recurrent Neural Network (RNN), a Deep Neural Network (DNN), a Stacking-based Deep Neural Network (S-DNN), a State-Space Dynamic Neural Network (S-SDNN), a deconvolutional network, a Deep Belief Network (DBN), a Restricted Boltzmann Machine (RBN), a fully convolutional network, a Long Short-Term Memory (LSTM) network, and a classification network.

The neural network processor 2300 may be a dedicated hardware accelerator itself for neural networks, or a device including the dedicated hardware accelerator, and may be implemented using any one of the electronic device 1000*a* of FIG. 10, the electronic device 1000*b* of FIG. 13, and the electronic device 1000*c* of FIG. 16.

Although not illustrated in the drawing, the computing system 2000 may further include a sensor module.

The sensor module may collect information surrounding the electronic device in which the computing system 2000 is installed. The sensor module may sense signals or receive signals from outside of the electronic device, and may convert the sensed or received signals into data. The signals may include an image signal, an audio signal, a magnetic signal, a biometric signal, a touch signal, etc. For this operation, the sensor module may include at least one of various types of sensing devices such as a microphone, an imaging device, an image sensor, a light detection and ranging (LiDAR) sensor, an ultrasonic sensor, an infrared sensor, a bio-sensor, a touch sensor, and so on.

The sensor module may provide the converted data, as input data, to the neural network processor 2300. For example, the sensor module may include an image sensor, which may capture images of an external environment of the electronic device and generate a video stream, and may sequentially provide consecutive data frames in the video stream, as the input data, to the neural network processor 2300. However, embodiments are not limited thereto. The sensor module may provide various types of data to the neural network processor 2300.

Figure 27:
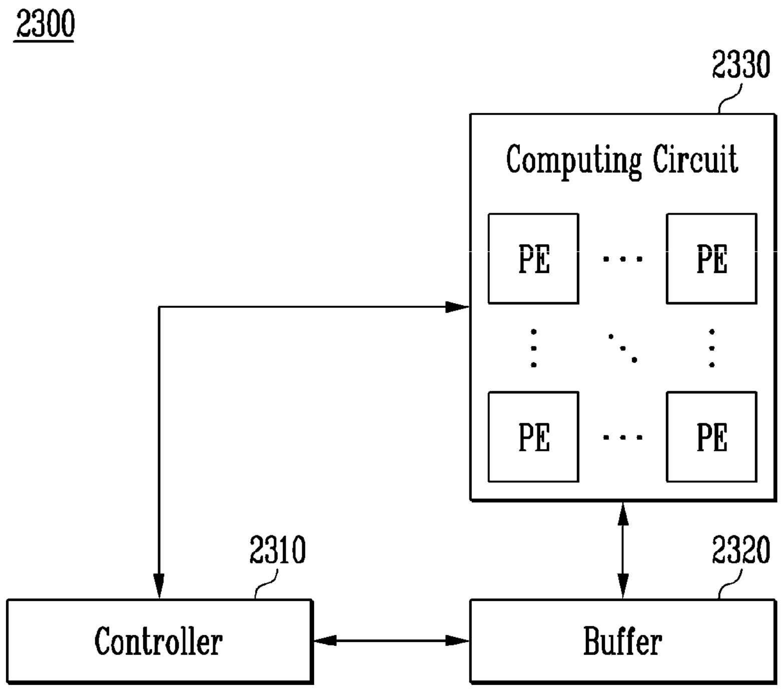
FIG. 27 illustrates a neural network processor of FIG. 26.

FIG. 27 illustrates the neural network processor 2300 of FIG. 26.

Referring to FIG. 27, the neural network processor 2300 may include a controller 2310, a buffer 2320, and a computing circuit 2330. In an embodiment, the controller 2310, the buffer 2320, the computing circuit 2330 may communicate with each other through a communication bus.

In an embodiment, the neural network processor 2300 may be implemented as a single semiconductor chip, for example, a system-on-chip (SoC). However, embodiments are not limited thereto. In another embodiment, the neural network processor 2300 may be implemented using a plurality of semiconductor chips.

The controller 2310 may control the overall operation of the neural network processor 2300. The controller 2310 may control operations of the buffer 2320 and the computing circuit 2330. For example, the controller 2310 may set and manage parameters related to a neural network operation, e.g., a convolution operation, so that the computing circuit 2330 normally executes layers of the neural network.

The controller 2310 may be implemented as hardware, software (or firmware), or a combination of hardware and software. In an embodiment, the controller 2310 may be implemented as a hardware logic that is designed to perform the foregoing functions. In an embodiment, the controller 2310 may be implemented as at least one processor, e.g., a CPU, a microprocessor, or the like, and may execute a program including instructions constituting the above-described functions.

The buffer 2320 may store weight data. The weight data stored in the buffer 2320 may be provided to the computing circuit 2330. Also, when the weight data are updated, the buffer 2320 may store the updated weight data, and may provide the updated weight data to the computing circuit 2330.

The buffer 2320 may be implemented as a Random Access Memory (RAM), e.g., an SRAM, a DRAM, or the like.

Further, the buffer 2320 may exchange data with an external device. The buffer 2320 may store weight data provided by the external device and provide the weight data to the computing circuit 2330. The buffer 2320 may provide output information provided by the computing circuit 2330 to the external device.

The computing circuit 2330 may include a plurality of processing elements PE. The computing circuit 2330 may perform a convolution operation, for example, an element-wise multiply-accumulate (MAC) operation. The plurality of processing elements PE may store the weight data provided by the buffer 2320, receive input data, and perform a multiply-accumulate operation on the input data and the weight data. The computing circuit 2330 may provide results of the multiply-accumulate operation to the buffer 2320 or the controller 2310. In an embodiment, each processing element PE may be implemented using any one of the electronic device 1000*a* of FIG. 10, the electronic device 1000*b* of FIG. 13, and the electronic device 1000*c* of FIG. 16.

In an embodiment, the controller 2310 may control the buffer 2320 and the computing circuit 2330 so that a plurality of input voltages corresponding to the input data are input to the computing circuit 2330 through a plurality of row lines.

Also, the controller 2310 may control the buffer 2320 and the computing circuit 2330 so that a plurality of conductance values are stored in a plurality of memory cells coupled to a plurality of first column lines of the computing circuit 2330.

Further, the controller 2310 may control the computing circuit 2330 so that the multiply-accumulate operation is performed on the plurality of input voltages and the plurality of conductance values. The computing circuit 2330 may perform multiply operations on the plurality of input voltages and a multiplicity of conductance values stored in memory cells coupled to each first column line. Furthermore, the computing circuit 2330 may perform an accumulate operation on results of the multiply operations performed for each first column line. The computing circuit 2330 may output a plurality of output currents as a result of the multiply-accumulate operation on the plurality of input voltages and the plurality of conductance values.

Furthermore, the controller 2310 may control the buffer 2320 and the computing circuit 2330 so that the maximum conductance value is stored in a plurality of memory cells coupled to a second column line of the computing circuit 2330. Here, the maximum conductance value may be a conductance value having the largest magnitude, among the plurality of conductance values stored in the plurality of memory cells coupled to the plurality of first column lines.

In addition, the controller 2310 may control the computing circuit 2330 so that a multiply-accumulate operation is performed on the plurality of input voltages and the maximum conductance value. The computing circuit 2330 may perform a multiply operation on the plurality of input voltages and the maximum conductance value. In addition, the computing circuit 2330 may perform an accumulate operation on results of the multiply operation performed for the second column line. The computing circuit 2330 may output a maximum output current as a result of the multiply-accumulate operation on the plurality of input voltages and the maximum conductance value.

In addition, the controller 2310 may control the computing circuit 2330 so that the plurality of output currents are converted into a plurality of analog signal voltages. The controller 2310 may control the computing circuit 2330 so that the maximum output current is converted into a reference voltage.

In addition, the controller 2310 may control the computing circuit 2330 so that the plurality of analog signal voltages are converted into a plurality of digital signals. The computing circuit 2330 may convert the plurality of analog signal voltages into the plurality of digital signals based on an input range determined depending on the reference voltage. In this case, the reference voltage may be determined to be the maximum value of the input range. In an embodiment, the computing circuit 2330 may output the plurality of digital signals based on results of comparison between the reference voltage and the plurality of analog signal voltages. For example, the computing circuit 2330 may determine a plurality of comparison voltages based on the reference signal and a preset resolution. The input range may be divided into several sections by the plurality of comparison voltages, the several sections corresponding to several different digital values, respectively. The computing circuit 2330 may output the plurality of digital signals based on the results of comparison between the plurality of comparison voltages and the plurality of analog signal voltages, each of the plurality of digital signals having one of the several different digital values.

In an embodiment, the controller 2310 may control the computing circuit 2330 so that the plurality of digital signals are converted into a plurality of digital operation signals having a previous normal distribution range. Here, the previous normal distribution range may correspond to a normal distribution range of the plurality of analog signal voltages. In an embodiment, the computing circuit 2330 may perform a multiply operation on the plurality of digital signals and a digital reference signal corresponding to the reference voltage. The reference voltage is converted into the digital reference signal using an analog-to-digital converter. The computing circuit 2330 may output the plurality of digital operation signals having the previous normal distribution range as a result of the multiply operation. In addition, the computing circuit 2330 may perform a digital signal processing operation using digital operation signals having previous normal distribution ranges.

Figure 28:
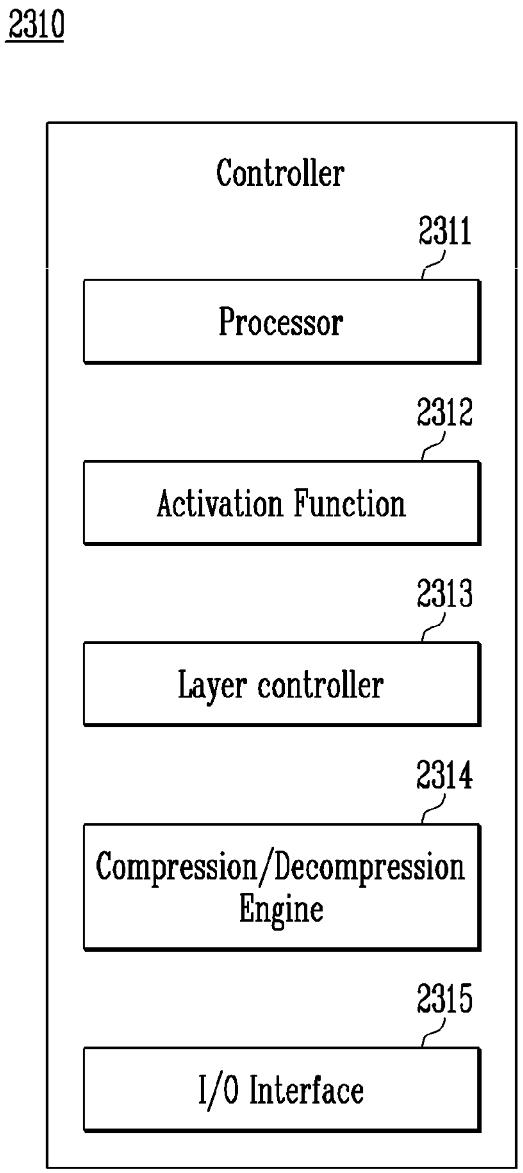
FIG. 28 illustrates a controller of FIG. 27.

FIG. 28 illustrates the controller 2310 of FIG. 27.

Referring to FIG. 28, the controller 2310 may include a processor 2311, an activation function circuit 2312, a layer controller 2313, a compression/decompression engine 2314, and an input/output (I/O) interface 2315.

The processor 2311 may control the overall operation of the controller 2310.

The activation function circuit 2312 may apply an activation function to the result of the multiply-accumulate operation provided by the computing circuit 2330 of FIG. 27.

The layer controller 2313 may control transmission of data between the plurality of processing elements PE in the computing circuit 2330.

The compression/decompression engine 2314 may perform a decompression operation on data provided by the CPU 2100 of FIG. 26 and perform a compression operation on data to be provided to the CPU 2100.

The I/O interface 2315 may perform an interface operation in relation to data input/output between the CPU 2100 and the controller 2310.

In an embodiment, the activation function circuit 2312 and the I/O interface 2315 may be implemented in a field-programmable gate array (FPGA), and the processor 2311, the layer controller 2313, and the compression/decompression engine 2314 may be implemented in an application-specific integrated circuit (ASIC).

Figure 29:
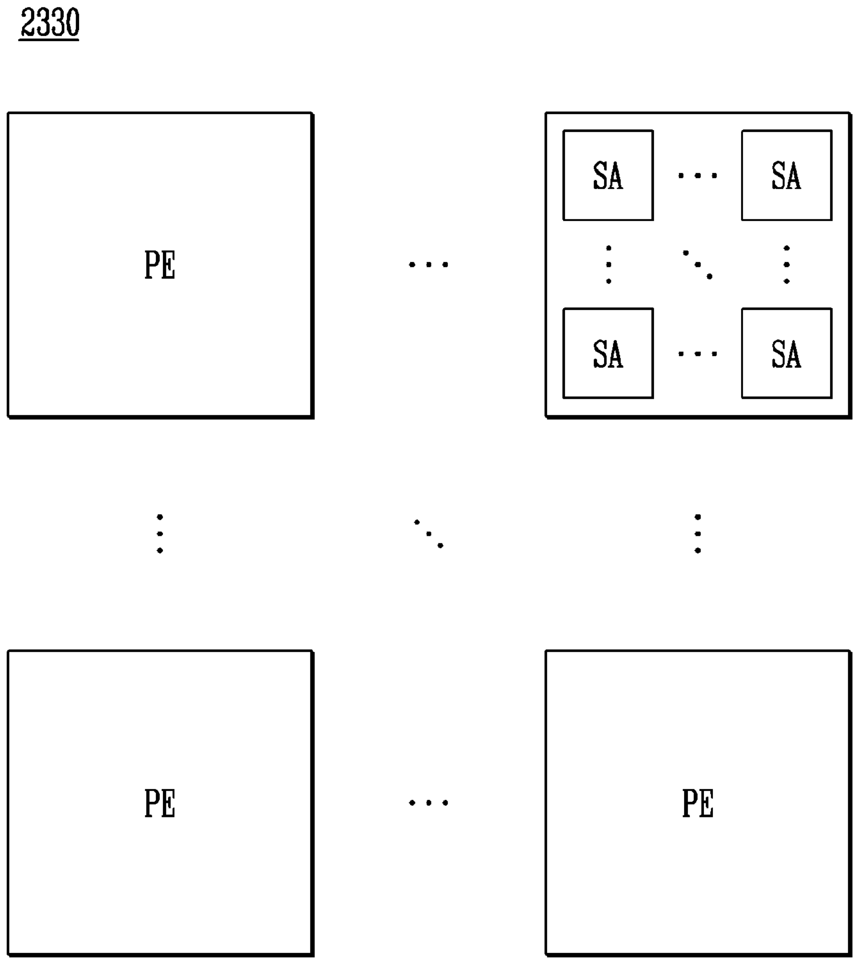
FIG. 29 illustrates a computing circuit of FIG. 27.

FIG. 29 illustrates the computing circuit 2330 of FIG. 27.

Referring to FIG. 29, the computing circuit 2330 may include a plurality of processing elements PE. Each of the plurality of processing elements PE may perform a multiply-accumulate operation on input data and weight data. For example, the plurality of processing elements PE may independently operate, and may simultaneously perform multiply-accumulate operations. Therefore, the multiply-accumulate operations may be performed in parallel on a plurality of input data. In an embodiment, one layer included in a neural network may be implemented using one processing element PE. In an embodiment, each processing element PE may be implemented using any one of the electronic device 1000*a* of FIG. 10, the electronic device 1000*b* of FIG. 13, and the electronic device 1000*c* of FIG. 16.

In an embodiment, each of the plurality of processing elements PE may include a plurality of sub-arrays SA. The plurality of sub-arrays SA may perform a multiply-accumulate operation on input data and weight data. For example, the plurality of sub-arrays SA may independently operate, and may simultaneously perform multiply-accumulate operations. Therefore, the multiply-accumulate operations may be performed in parallel on a plurality of input data. In an embodiment, one layer included in a neural network may be implemented using one processing element PE or one sub-array SA. In an embodiment, each sub-array SA may be implemented using any one of the electronic device 1000*a* of FIG. 10, the electronic device 1000*b* of FIG. 13, and the electronic device 1000*c* of FIG. 16.

Figure 30:
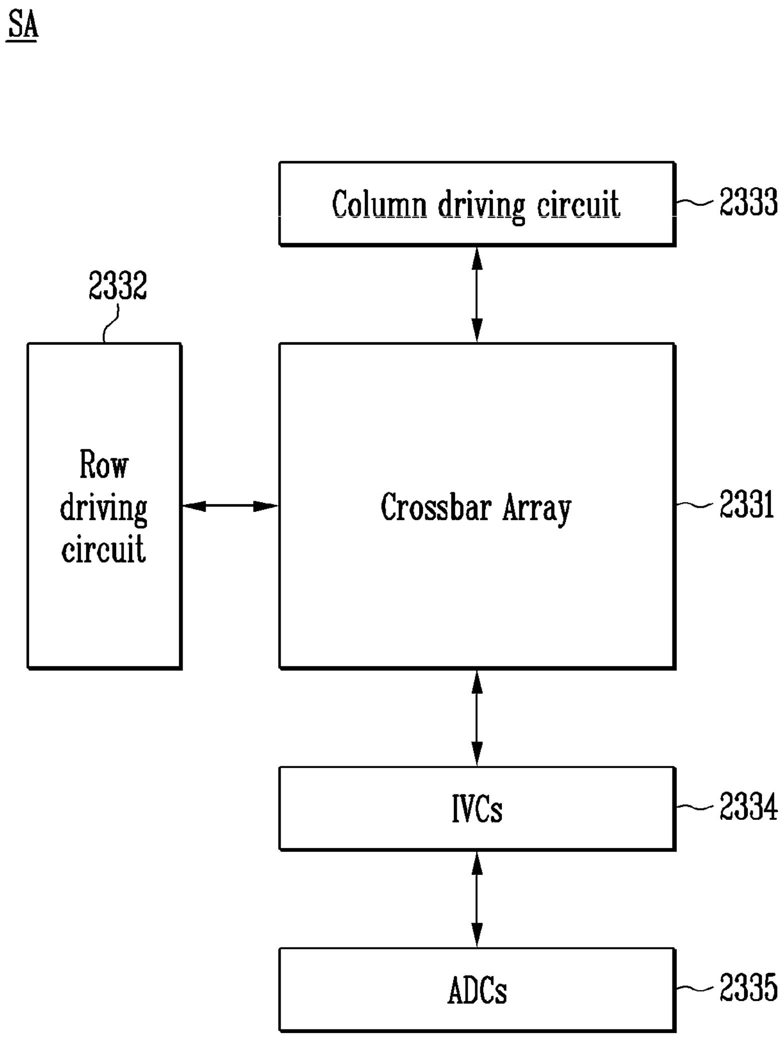
FIG. 30 illustrates a sub-array of FIG. 29.

FIG. 30 illustrates the sub-array SA of FIG. 29.

Referring to FIG. 30, the sub-array SA may include a crossbar array 2331, a row driving circuit 2332, a column driving circuit 2333, a plurality of current-to-voltage converters (IVCs) 2334, and a plurality of Analog-to-Digital Converters (ADCs) 2335. In an embodiment, the row driving circuit 2332 may be designated as a row selector, and the column driving circuit 2333 may be designated as a column selector.

The crossbar array 2331 may include a plurality of resistive memory cells arranged in a matrix form, each memory cell including a resistive element. Each of the plurality of resistive memory cells may be coupled to one of a plurality of row lines and one of a plurality of column lines.

The crossbar array 2331 may store a plurality of weight data, e.g., a plurality of weights. For example, the plurality of resistive memory cells may store the plurality of weights using variation in the resistance of a resistive element included in each of the plurality of resistive memory cells. The crossbar array 2331 may receive a plurality input voltages corresponding to input data and generate a plurality of currents based on the plurality of input voltages and the plurality of weights. For example, the plurality of input voltages may be input to the crossbar array 2331 through the plurality of row lines.

The row driving circuit 2332 may be coupled to the plurality of row lines of the crossbar array 2331. Although not illustrated in detail in the drawing, the row driving circuit 2332 may drive the plurality of row lines based on a row select signal for selecting at least one of the plurality of row lines. Further, the row driving circuit 2332 may drive the plurality of row lines based on a row driving voltage for driving at least one of the plurality of row lines.

The column driving circuit 2333 may be coupled to the plurality of column lines of the crossbar array 2331. Although not illustrated in detail in the drawing, the column driving circuit 2333 may drive the plurality of column lines based on a column select signal for selecting at least one of the plurality of column lines. Further, the column driving circuit 2333 may drive the plurality of column lines based on a column driving voltage for driving at least one of the plurality of column lines.

The plurality of current-to-voltage converters 2334 may convert the plurality of currents output from the crossbar array 2331 into a plurality of analog signal voltages. For example, each of the plurality of current-to-voltage converters 2334 may be implemented to include a current mirror. The plurality of current-to-voltage converters 2334 may correspond to the current-to-voltage converters 220 illustrated in FIGS. 2A and 2B.

The plurality of ADCs 2335 may convert the plurality of analog signal voltages into a plurality of digital signals. The plurality of ADCs 2335 may correspond to the ADCs 230 illustrated in FIGS. 2A and 2B.

Figure 31:
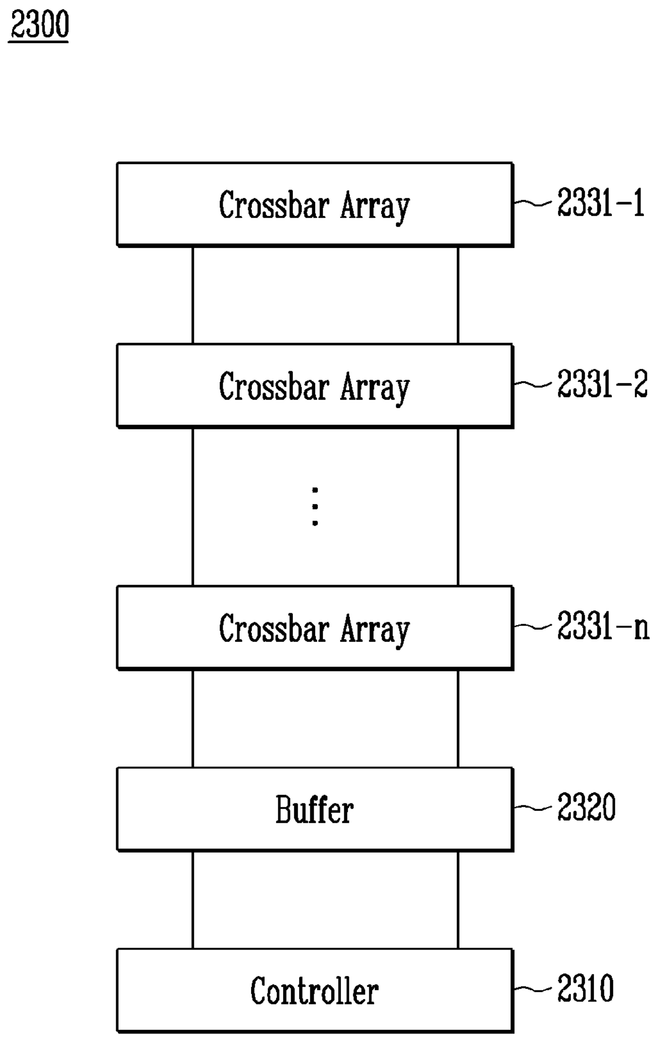
FIG. 31 illustrates a crossbar array having a layered structure according to an embodiment of the present disclosure.

FIG. 31 illustrates a crossbar array having a layered structure according to an embodiment of the present disclosure.

Referring to FIG. 31, a neural network processor 2300 may include a controller 2310, a buffer 2320, and a plurality of crossbar arrays 2331-1 to 2331-*n*. The neural network processor 2300 may be configured such that the controller 2310, the buffer 2320, and the plurality of crossbar arrays 2331-1 to 2331-*n* are individually stacked and packaged. The controller 2310, the buffer 2320, and the plurality of crossbar arrays 2331-1 to 2331-*n* may be electrically connected to each other, and for this connection, the neural network processor 2300 may include a conductive means for electrically connecting the controller 2310, the buffer 2320, and the plurality of crossbar arrays 2331-1 to 2331-*n* to each other. In an embodiment, as the conductive means, a through-silicon via (TSV) may be applied.

In an embodiment, the buffer 2320 may store results of operations performed by the plurality of crossbar arrays 2331-1 to 2331-*n*. The buffer 2320 may include volatile memory cells or nonvolatile memory cells.

The controller 2310 may communicate with the CPU 2100 of FIG. 26, may receive requests and weights from the CPU 2100, and may provide commands corresponding to the requests and the weights to the plurality of crossbar arrays 2331-1 to 2331-*n*.

The controller 2310 may generate the commands in response to the requests provided by the CPU 2100, and may provide the commands to the plurality of crossbar arrays 2331-1 to 2331-*n* through command TSVs which are independently formed for the respective crossbar arrays 2331-1 to 2331-*n*.

The controller 2310 may store the weights in the plurality of crossbar arrays 2331-1 to 2331-*n*, may provide input data to the plurality of crossbar arrays 2331-1 to 2331-*n*, and may receive final data from the plurality of crossbar arrays 2331-1 to 2331-*n*.

The input data and the weights may be provided to at least one of the plurality of crossbar arrays 2331-1 to 2331-*n*, and final data from at least one of the plurality of crossbar arrays 2331-1 to 2331-*n* may be provided to another crossbar array or the controller 2310.

Figure 32:
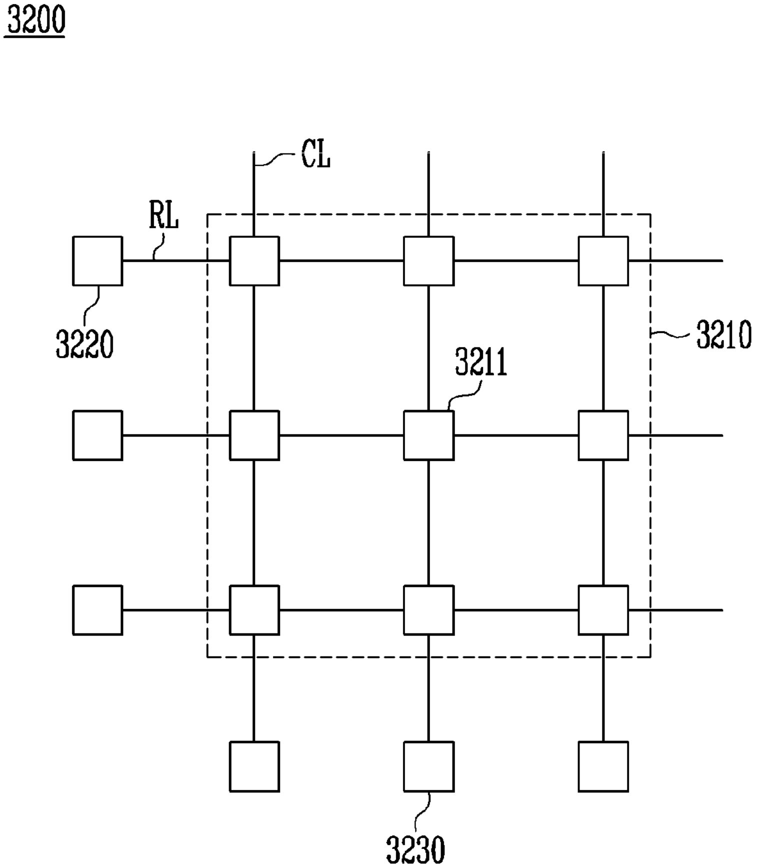
FIG. 32 illustrates a neural network processor according to an embodiment of the present disclosure.

FIG. 32 illustrates a neural network processor 3200 according to an embodiment of the present disclosure.

The neural network processor 3200 of FIG. 32 may be implemented as one component of the neural network processor 2300 of FIG. 26.

Referring to FIG. 32, the neural network processor 3200 may include a crossbar array 3210, a plurality of first neurons 3220, and a plurality of second neurons 3230. The crossbar array 3210 may be called a "synapse array." Each of the plurality of first neurons 3220 may be called a 'pre-synaptic neuron,' and each of the plurality of second neurons 3230 may be called a 'post-synaptic neuron.'

The crossbar array 3210 may include a plurality of synapses 3211, and the plurality of synapses 3211 may be coupled to the plurality of first neurons 3220 through a plurality of row lines RL, and may be coupled to the plurality of second neurons 3230 through a plurality of column lines CL.

The crossbar array 3210 may store weights included in layers constituting a neural network system, and may perform an operation based on the weights and input data. In the crossbar array 3210, the weights may be stored in the plurality of synapses 3211.

Figure 33:
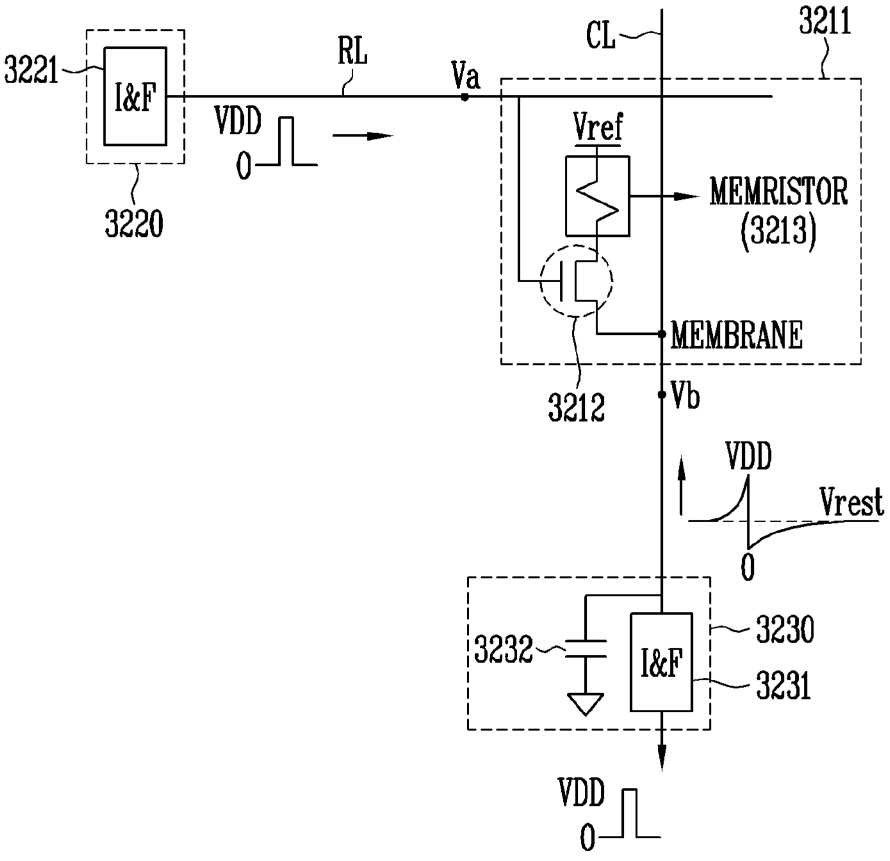
FIG. 33 illustrates a connection relationship between a first neuron and a second neuron according to an embodiment of the present disclosure.

FIG. 33 illustrates a connection relationship between a first neuron, a second neuron, and a synapse coupled to the first and the second neurons according to an embodiment of the present disclosure. The synapse shown in FIG. 33 may correspond to one of the plurality of synapses 3211 included in the crossbar array 3210 of FIG. 32.

In FIG. 33, a first neuron 3220 is coupled to a synapse 3211 through a row line RL, and a second neuron 3230 is coupled to the synapse 3211 through a column line CL.

The synapse 3211 may include a memristor 3213 having a variable resistance value, and a transistor 3212 to which at least two input signals are applied. The resistance value of the memristor 3213 may vary according to a difference between times of applying at least two input signals to the transistor 3212.

The resistance value of the memristor 3213 may vary with voltage variation attributable to the difference between the times at which the input signals are applied to the transistor 3212. For example, the resistance value of the memristor 3213 may vary with the voltage variation attributable to the time difference between a first input signal and a second input signal. The first input signal may be a signal applied to a gate terminal of the transistor 3212. Further, the second input signal may be a signal based on a membrane voltage applied to a source terminal of the transistor 3212. The first input signal may be transferred from the first neuron 3220, and the second input signal may be transferred from the second neuron 3230.

A direction of current flowing through the memristor 3213 may depend on the difference between the times at which the first input signal and the second input signal are applied to the transistor 3212. For example, when the first input signal is input to the transistor 3212 earlier than the second input signal, current may flow from the transistor 3212 to the memristor 3213. On the other hand, when the first input signal is input to the transistor 3212 later than the second input signal, current may flow from the memristor 3213 to the transistor 3212 in a direction opposite to the previous direction.

The direction and amount of the current flowing through the memristor 3213 may depend on a voltage difference attributable to the difference between the times at which the first input signal and the second input signal are applied to the transistor 3212. For example, when the difference between the times at which the first input signal and the second input signal are applied is large and thus it is difficult for the first and second input signals to influence each other, the transistor 3212 is turned on while the first input signal is input, and current flows from the memristor 3213 to the transistor 3212 because a reference voltage Vref is greater than an idle voltage Vrest. The reference voltage Vref is applied to one end of the memristor 3213, and the idle voltage Vrest is applied from the second neuron 3230 to the transistor 3212. In this case, because the voltage difference (Vref−Vrest) between both ends of the memristor 3213 is less than a threshold voltage that changes the characteristic of the memristor 3213, the memristor 3213 is in a High Resistance State (HRS), and only a small amount of current close to '0' can flow through the memristor 3213.

When the difference between the times at which the first input signal and the second input signal are input is within a range so that the first input signal and the second input signal influence each other and thus the first input signal is input slightly earlier than the second input signal, the transistor 3212 is turned on while the first input signal is input. In this case, when a voltage Vb on the source terminal of the transistor 3212 satisfies a relationship of Vb>Vref, current flows from the transistor 3212 to the memristor 3213. Here, when the voltage difference (Vb−Vref) between both ends of the memristor 3213 is greater than the threshold voltage that changes the characteristic of the memristor 3213, the memristor 3213 may be changed to a Low Resistance State (LRS). When the memristor 3213 is in the Low Resistance State (LRS), a large amount of current may flow through the memristor 3213; otherwise the memristor 3213 may remain in the High Resistance State (HRS).

When the difference between the times at which the first input signal and the second input signal are input is within the range and thus the first input signal and the second input signal are input at similar times or the first input signal is input slightly later than the second input signal, the transistor 3212 is turned on while the first input signal is input. In this case, when the voltage Vb on the source terminal of the transistor 3212 satisfies a relationship of Vb<Vref, the current flows from the memristor 3213 to the transistor 3212. When the voltage difference (Vref−Vb) between both ends of the memristor 3213 is greater than the threshold voltage that changes the characteristic of the memristor 3213, the memristor 3213 may be changed to the High Resistance State (HRS), and thus a small amount of current flows through the memristor 3213. If otherwise, the memristor 3213 may remain in the Low Resistance State (LRS).

When the first input signal is input much later than the second input signal, i.e., when a large time difference between the input of the first input signal and the input of the second input signal temporally occurs, and thus it is difficult for the first and second input signals to influence each other, current flows from the memristor 3213 to the transistor 3212 because the reference voltage Vref becomes greater than the idle voltage Vrest. Here, because the voltage difference (Vref−Vrest) between both ends of the memristor 3213 is less than the threshold voltage that changes the characteristic of the memristor 3213, the memristor 3213 is in the High Resistance State (HRS). The large time difference may be determined according to whether the first input signal and the second input terminal influence each other.

A first end of the memristor 3213 may be coupled to a drain terminal of the transistor 3212, and a second end thereof may be coupled to a voltage source that provides the reference voltage Vref. A channel of the memristor 3213 may be coupled in series to a channel of the transistor 3212. Different voltages may be applied to the memristor 3213 and the transistor 3212, and the transistor 3212 may be an NMOS transistor.

The synapse 3211 may further include a first node coupled to the gate terminal of the transistor 3212 to provide the first input signal to the transistor 3212, and a second node coupled to the source terminal of the transistor 3212 to provide the second input signal to the transistor 3212. The synapse 3211 may be coupled to the first neuron 3220 through the first node, and may be coupled to the second neuron 3230 through the second node. Here, a first voltage Va may be provided from the first neuron 3220 to the synapse 3211 through the first node and a second voltage Vb may be provided from the second neuron 3230 to the synapse 3211 through the second node.

The first neuron 3220 may include an Integrate & Firing (I&F) spiking neuron 3221 that fires a spike or a pulse. The second neuron 3230 may include an I&F spiking neuron 3231. Each of the first neuron 3220 and the second neuron 3230 may fire a spike or a pulse when the amount of current received through the synapse 3211 is greater than a preset threshold value.

The second neuron 3230 may generate a spike that is firing based on the idle voltage Vrest. The second neuron 3230 may further include a capacitor 3232.

The structure of FIG. 33 may implement a Spike-Timing-Dependent Plasticity (STDP) operation.

Figure 34:
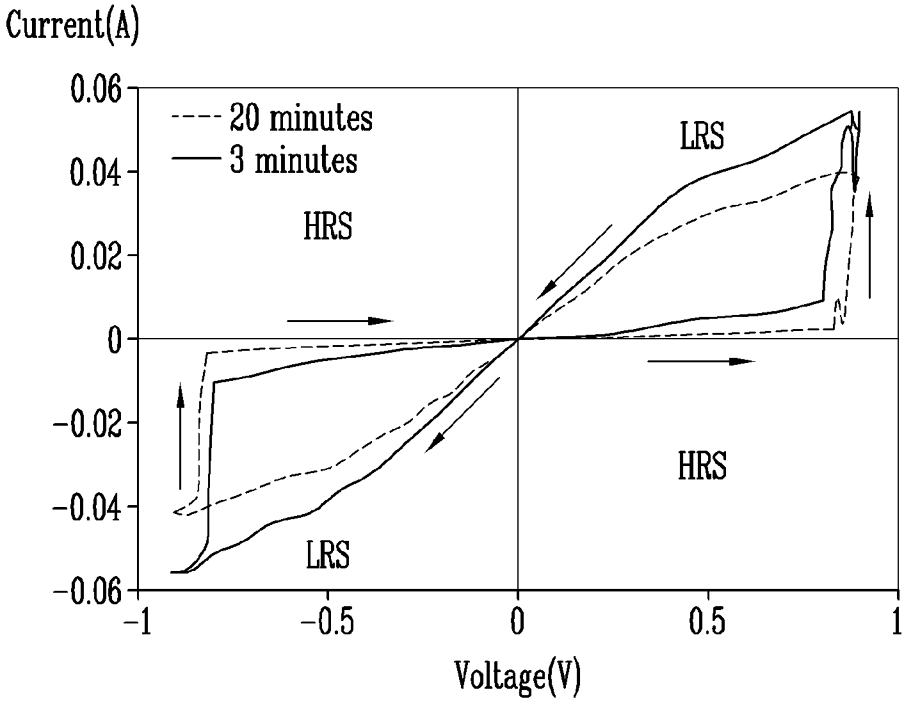
FIG. 34 is a graph illustrating operating characteristics of a memristor included in a synapse of FIG. 33.

FIG. 34 is a graph illustrating operating characteristics of the memristor included in the synapse of FIG. 33.

Referring to FIG. 34, the operating characteristics of the memristor may be described. The memristor may be a passive element that is capable of memorizing how much current has passed therethrough, and may memorize an amount of charge and change a resistance value thereof depending on the memorized amount of charge. In other words, the resistance value of the memristor may vary depending on the flow of current and the amount of charge.

In the graph of FIG. 34, it can be seen that, when a voltage supplied to the memristor does not reach ±0.8V, current hardly flows through the memristor. However, it can be seen that, when the supplied voltage exceeds ±0.8V, a large amount of current suddenly flows through the memristor. Here, a voltage at which the amount of current suddenly changes may be regarded as a threshold voltage of the memristor, and may correspond to ±0.8V in FIG. 34.

A resistance state in which the voltage supplied to the memristor does not reach the threshold voltage and thus current hardly flows through the memristor may be regarded as a High Resistance State (HRS). On the other hand, a resistance state in which the voltage supplied to the memristor exceeds the threshold voltage and thus current suddenly flows through the memristor may be regarded as a Low Resistance State (LRS).

Figure 35:
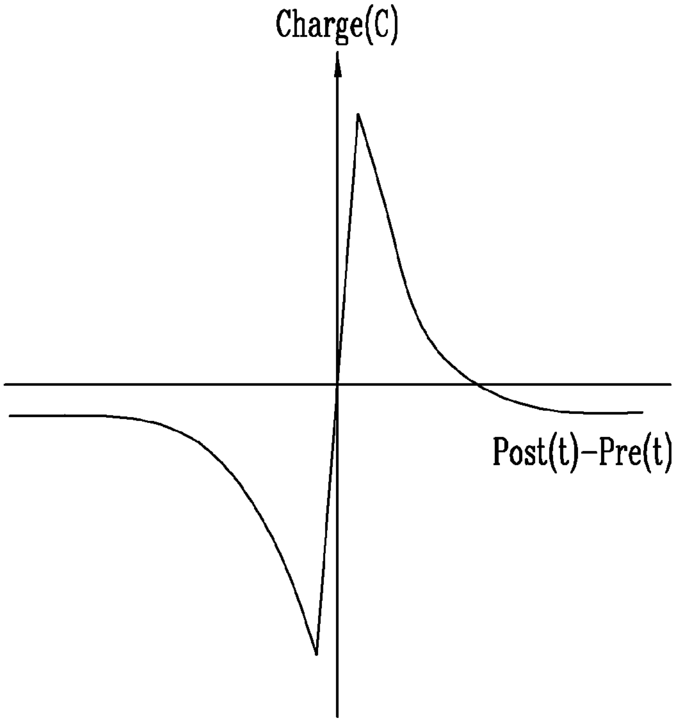
FIGS. 35 and 36 illustrate characteristics of an amount of current flowing between the first neuron and the second neuron of FIG. 33 and a relationship between a difference between spike occurrence times and variation in a synaptic weight during a typical STDP operation.
Figure 36:
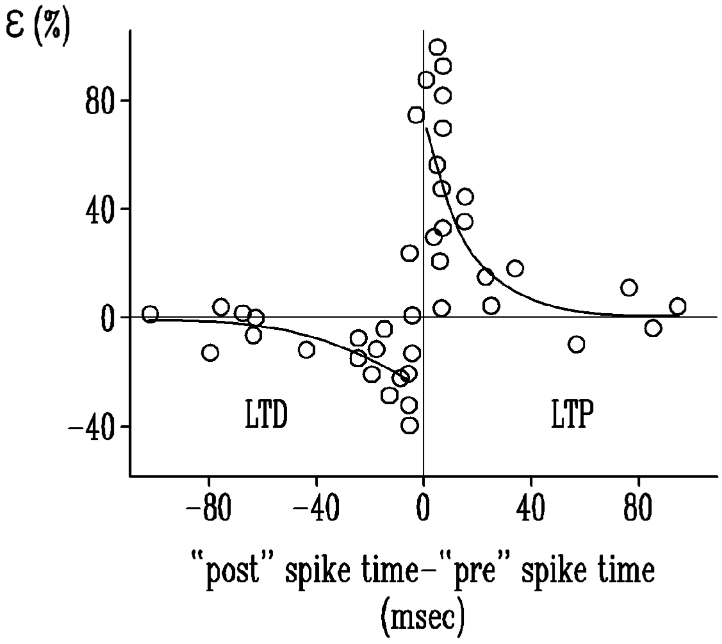

FIGS. 35 and 36 illustrate an amount of current flowing between the first neuron and the second neuron of FIG. 33 and a relationship between a difference between spike occurrence times and variation in a synaptic weight during a typical STDP operation.

FIG. 35 illustrates a relationship between a difference between occurrence times of a post-synaptic spike and a pre-synaptic pulse and an amount of current flowing at that time difference. It can be seen that the relationship between the difference between the occurrence times and the amount of current has characteristics that are similar to those of FIG. 36.

When a spike fired in a synapse is modeled in an electronic waveform, variation in a synaptic weight may be represented by a subtraction between a waveform of a pulse fired in the first neuron (hereinafter referred to as a 'pre-synaptic pulse') and a waveform of a spike fired in the second neuron (hereinafter referred to as a 'post-synaptic spike').

Figure 37:
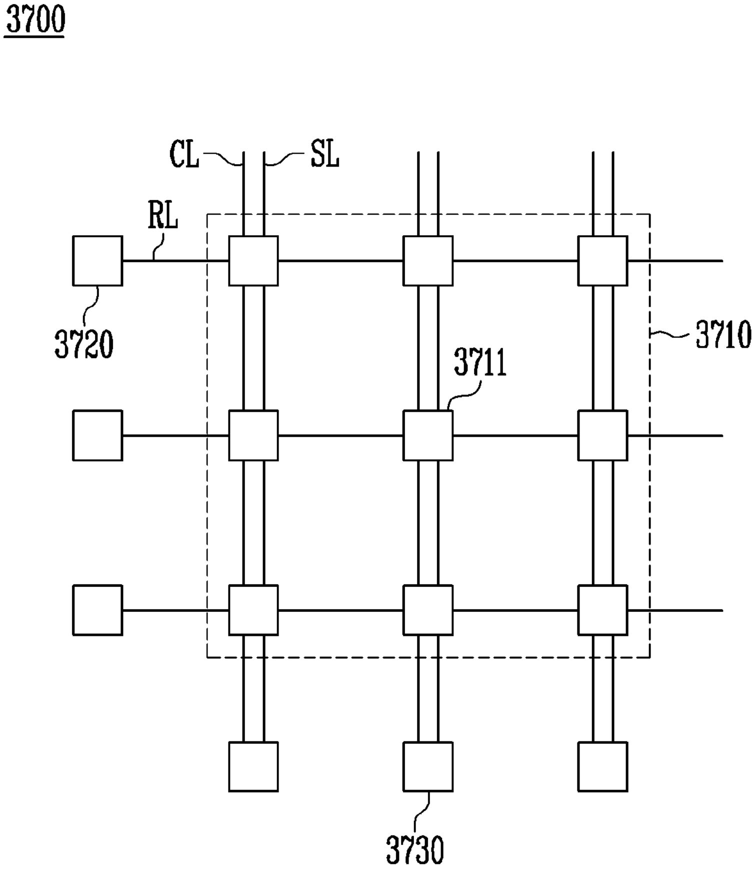
FIG. 37 illustrates a neural network processor according to an embodiment of the present disclosure.

FIG. 37 illustrates a neural network processor 3700 according to another embodiment of the present disclosure.

The neural network processor 3700 of FIG. 37 may be implemented as one component of the neural network processor 2300 of FIG. 26.

Referring to FIG. 37, the neural network processor 3700 may include a crossbar array 3710, a plurality of first neurons 3720, and a plurality of second neurons 3730. The crossbar array 3710 may be called a "synapse array." Each of the plurality of first neurons 3720 may be called a 'pre-synaptic neuron,' and each of the plurality of second neurons 3730 may be called a 'post-synaptic neuron.'

The crossbar array 3710 may include a plurality of synapses 3711, and the plurality of synapses 3711 may be coupled to the plurality of first neurons 3720 through a plurality of row lines RL, and may be coupled to the plurality of second neurons 3730 through a plurality of column lines CL and a plurality of select lines SL.

The crossbar array 3710 may store, in the plurality of synapses 3711, weights included in each of layers constituting a neural network system, and may perform an operation based on the weights and input data.

Figure 38:
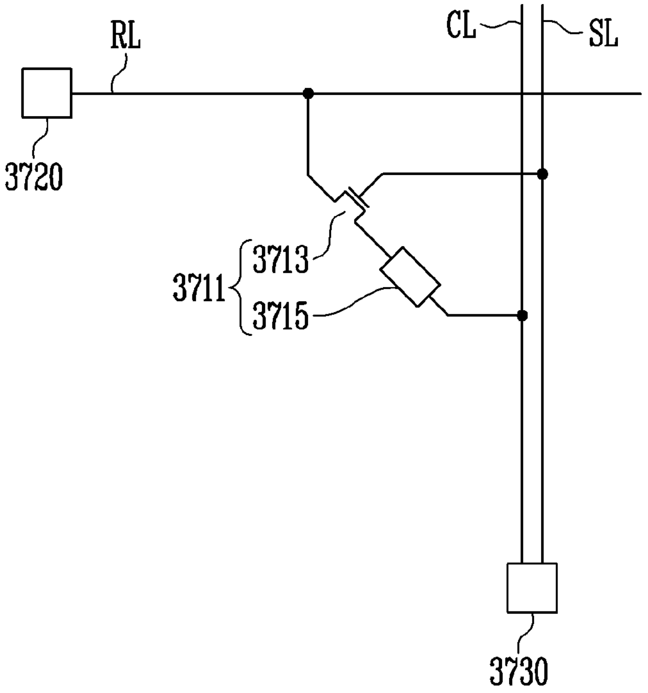
FIG. 38 illustrates one of a plurality of synapses included in a synapse array of FIG. 37 according to an embodiment of the present disclosure.

FIG. 38 illustrates one of the plurality of synapses included in the synapse array of FIG. 37 according to embodiments of the present disclosure.

Referring to FIG. 38, the first neuron 3720 is coupled to the synapse 3711 through a row line RL, and the second neuron 3730 is coupled to the synapse 3711 through a column line CL and a select line SL.

The synapse 3711 may include a switching transistor 3713 and a memristor 3715 coupled in series to each other. The switching transistor 3713 may include a 3-terminal selector such as a MOS transistor or a 2-terminal selector such as a diode. A gate electrode of the switching transistor 3713 may be electrically connected to the second neuron 3730 through the select line SL, a drain electrode of the switching transistor 3713 may be electrically connected to the first neuron 3720 through the row line RL, and a source electrode of the switching transistor 3713 may be electrically connected to a first terminal of the memristor 3715. A second terminal of the memristor 3715 may be electrically connected to the second neuron 3730 through the column line CL.

Referring to FIGS. 37 and 38, a row signal may be provided from the first neuron 3720 to the synapse 3711 through the row line RL. When the switching transistor 3713 of the synapse 3711 is turned on, the row signal may be provided to the memristor 3715. The row signal may be used to train the memristor 3715 in various modes, so that a resistance state of the memristor 3715 may be adjusted. The row signal may be converted into a current value depending on the resistance state of the memristor 3715 in a read mode. That is, the resistance state of the memristor 3715 may be changed in response to the row signal, or the current value depending on the resistance state of the memristor 3715 may be output to the column line CL in response to the row signal. That is, a weight of the synapse 3711 may be output to the column line CL.

Figure 39:
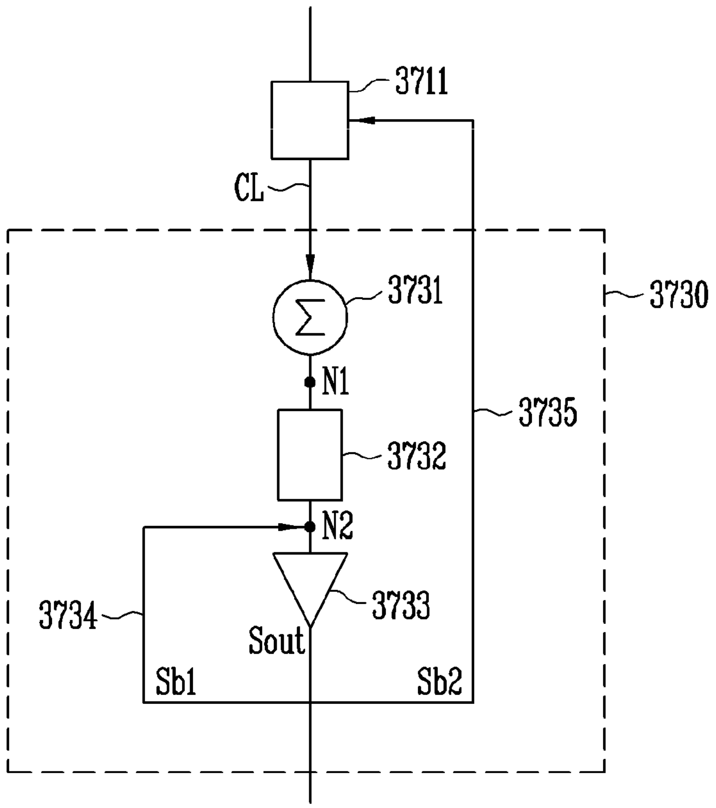
FIG. 39 illustrates a second neuron of FIG. 37 according to an embodiment of the present disclosure.

FIG. 39 illustrates the second neuron of FIG. 37 according to embodiments of the present disclosure.

Referring to FIG. 39, the second neuron 3730 may include a summation circuit 3731, a variable resistive element (resistor) 3732, and a comparator 3733, which are connected in series to each other.

An output terminal of the synapse 3711 may be coupled to an input terminal of the summation circuit 3731 through the column line CL, an output terminal of the summation circuit 3731 may be coupled to a first electrode of the variable resistive element 3732 through a first node N1, and a second electrode of the variable resistive element 3732 may be coupled to an input terminal of the comparator 3733 through a second node N2. The second neuron 3730 may further include a first feedback line 3734, which electrically connects an output terminal of the comparator 3733 to the variable resistive element 3732, and a second feedback line 3735, which electrically connects the output terminal of the comparator 3733 to the synapse 3711. The first feedback line 3734 may be electrically connected to the second node N2, and the second feedback line 3735 may be connected to the select line SL. Alternatively, the second feedback line 3735 may be a portion of the select line SL.

The summation circuit 3731 may sum up weights of a plurality of synapses 3711 coupled to the same column line CL and provide a result of the summation to the variable resistive element 3732.

A resistance value or conductivity of the variable resistive element 3732 may be changed by an output of the summation circuit 3731 and/or an output of the comparator 3733. For example, the resistance value of the variable resistive element 3732 may be reduced by the output of the summation circuit 3731 (set operation), and may be increased by the output of the comparator 3733 (reset operation). For example, when a synapse current obtained by the summation of the summation circuit 3731 is low, the variable resistive element 3732 may have a high resistance level. Therefore, a low-level current and a low-level synapse weight may be provided to the comparator 3733. On the other hand, when the synapse current output from the summation circuit 3731 is high, the variable resistive element 3732 may have a low resistance level. Therefore, a high-level current and a high-level synapse weight may be provided to the comparator 3733.

The comparator 3733 may output an electrical signal when the output of the variable resistive element 3732 is higher than a reference voltage. That is, firing may be performed on the comparator 3733. The fired comparator 3733 may output an output signal Sout. Part of the output signal Sout may be divided into a first feedback signal Sb1 and a second feedback signal Sb2.

The first feedback signal Sb1 divided from the output signal Sout of the comparator 3733 may be provided to the variable resistive element 3732 and used to initialize the variable resistive element 3732. The output terminal of the comparator 3733 may be electrically connected to the gate electrode of the switching transistor 3713 of the synapse 3711 of FIG. 37 through the second feedback line 3735 and/or the selection line SL. That is, the second feedback signal Sb2 divided from the output signal Sout of the comparator 3733 may be provided to the gate electrode of the switching transistor 3713. Therefore, the second feedback signal Sb2 may be provided to the gate electrode of the switching transistor 3713 and used to set/reset the memristor 3715. For example, the second feedback signal Sb2 may be used to perform a spike-timing-dependent-plasticity (STDP) operation for changing the weight of the synapse 3711.

In accordance with the embodiments of the present disclosure, there are provided an electronic device and a method of operating the electronic device, which can reduce errors occurring in a quantization operation by adjusting an input range of an analog-to-digital converter (ADC) depending on input data.

Further, in accordance with the embodiments of the present disclosure, the accuracy of neural network operations may be improved and implementation costs for an analog-to-digital converter (ADC) may be reduced by adjusting the input range of the ADC depending on the input data.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

What is claimed is:

1. An electronic device, comprising:

a crossbar array including:

a plurality of first memory cells respectively storing a plurality of conductance values;

a plurality of second memory cells each storing a respective maximum conductance value determined among a subset of the plurality of conductance values, the subset corresponding to the respective second memory cell;

a plurality of row lines coupled to the plurality of first memory cells and the plurality of second memory cells and supplying a plurality of input voltages to the plurality of first memory cells and the plurality of second memory cells;

a plurality of first column lines coupled to the plurality of first memory cells and configured to respectively output a plurality of output currents generated using the plurality of input voltages and the plurality of conductance values; and a second column line coupled to the plurality of second memory cells and configured to output a maximum output current generated using the plurality of input voltages and the respective maximum conductance value stored in each of the plurality of second memory cells; and a plurality of analog-to-digital converters respectively coupled to the plurality of first column lines, each of the plurality of analog-to-digital converters receiving a reference voltage and an analog signal voltage corresponding to each of the plurality of output currents and configured to generate a digital signal corresponding to the analog signal voltage based on the reference voltage, the reference voltage being generated from the maximum output current, wherein each of the plurality of analog-to-digital converters is configured to determine a plurality of comparison voltages based on a plurality of values calculated from the reference voltage according to a resolution set in the plurality of analog-to-digital converters and output the digital signal based on a result of comparing the analog signal voltage with the plurality of comparison voltages.

2. The electronic device according to claim 1, wherein:

the plurality of first column lines are configured to output the plurality of output currents by performing a multiply-accumulate operation on the plurality of input voltages and the plurality of conductance values, and the second column line is configured to output the maximum output current by performing a multiply-accumulate operation on the plurality of input voltages and the respective maximum conductance value stored in each of the plurality of second memory cells.

3. The electronic device according to claim 1, wherein when a magnitude of an analog signal voltage input to a corresponding one of the plurality of the analog-to-digital converters is greater than a magnitude of the reference voltage, each of the plurality of analog-to-digital converters is configured to change the magnitude of the analog signal voltage input thereto to be equal to the magnitude of the reference voltage, and output a digital signal based on a result of comparing the magnitude-changed analog signal voltage with the plurality of comparison voltages.

4. The electronic device according to claim 1, further comprising:

a plurality of first current-to-voltage converters, each configured to receive an output current from a corresponding one of the plurality of first column lines and convert the output current into an analog signal voltage; and a second current-to-voltage converter configured to receive the maximum output current from the second column line and convert the maximum output current into the reference voltage.

5. The electronic device according to claim 4, further comprising:

a plurality of voltage buffers respectively coupled to the plurality of first current-to-voltage converters, and configured to receive analog signal voltages from the plurality of first current-to-voltage converters, buffer the analog signal voltages to cancel noise contained in the analog signal voltages, and output buffered analog signal voltages.

6. The electronic device according to claim 5, wherein each of the plurality of voltage buffers is configured to receive the reference voltage, determine a maximum value of an output voltage to be equal to a magnitude of the reference voltage, and output a buffered analog signal voltage to the plurality of analog-to-digital converters.

7. The electronic device according to claim 6, wherein each of the plurality of voltage buffers is configured to, when a magnitude of a corresponding analog signal voltage is greater than the magnitude of the reference voltage, output the buffered analog signal voltage having a magnitude identical to the magnitude of the reference voltage.

8. The electronic device according to claim 1, further comprising:

a digital signal processor configured to output a digital operation signal based on a digital signal, output from one of the plurality of analog-to-digital converters, and the reference voltage.

9. The electronic device according to claim 8, wherein the digital signal processor is configured to output the digital operation signal as a result of a multiply operation on the digital signal and a digital reference signal corresponding to the reference voltage.

10. The electronic device according to claim 8, wherein:

the digital signal processor is configured to output a plurality of digital operation signals based on a plurality of digital signals and a plurality of reference voltages, the plurality of digital signals being output from the plurality of analog-to-digital converters to which the plurality of reference voltages are applied, respectively, and each of the plurality of reference voltages is generated based on a multiply-accumulate operation performed on a plurality of input voltages and the respective maximum conductance value stored in each of the plurality of second memory cells, the plurality of input voltages corresponding to each of a plurality of input data that are input at different time points.

11. The electronic device according to claim 10, wherein the electronic device is configured to perform a digital signal processing operation using the plurality of digital operation signals.

12. The electronic device according to claim 1, wherein the respective maximum conductance value stored in each of the plurality of second memory cells corresponds to the largest one among conductance values included in the subset corresponding to the respective second memory cell.

13. The electronic device according to claim 1, wherein a maximum conductance value stored in a second memory cell of the plurality of second memory cells corresponds to the largest one of conductance values stored in a subset of the plurality of first memory cells coupled to a row line to which the second memory cell is coupled.

14. An electronic device, comprising:

a crossbar array including:

a plurality of first memory cells respectively storing a plurality of conductance values;

a plurality of second memory cells each storing a maximum conductance value determined among a subset of the plurality of conductance values, the subset corresponding to the respective second memory cell;

a plurality of row lines coupled to the plurality of first memory cells and the plurality of second memory cells and supplying a plurality of input voltages to the plurality of first memory cells and the plurality of second memory cells;

a plurality of first column lines coupled to the plurality of first memory cells and configured to respectively output a plurality of output currents generated using the plurality of input voltages and the plurality of conductance values; and a second column line coupled to the plurality of second memory cells and configured to output a maximum output current generated using the plurality of input voltages and the maximum conductance value stored in each of the plurality of second memory cells; and a plurality of analog-to-digital converters respectively coupled to the plurality of first column lines, each of the plurality of analog-to-digital converters receiving a reference voltage and an analog signal voltage corresponding to each of the plurality of output currents and configured to convert the analog signal voltage into a digital signal corresponding to the analog signal voltage by applying a gain corresponding to the reference voltage to the analog signal voltage, the reference voltage being generated from the maximum output current, wherein each of the plurality of analog-to-digital converters is configured to determine a plurality of comparison voltages based on a plurality of values calculated from the reference voltage according to a resolution set in the plurality of analog-to-digital converters and output the digital signal based on a result of comparing the analog signal voltage to which the gain is applied with the plurality of comparison voltages.

15. The electronic device according to claim 14, wherein when a magnitude of an analog signal voltage input to a corresponding one of the plurality of analog-to-digital converters is greater than a magnitude of the reference voltage, the plurality of analog-to-digital converters are configured to control the gain such that the magnitude of the analog signal voltage to which the gain is applied is less than or equal to the magnitude of the reference voltage.

16. The electronic device according to claim 14, further comprising:

a plurality of first current-to-voltage converters, each configured to receive an output current from a corresponding one of the plurality of first column lines and convert the output current into the analog signal voltage; and a second current-to-voltage converter configured to receive the maximum output current from the second column line and convert the maximum output current into the reference voltage.

17. The electronic device according to claim 14, further comprising:

a digital signal processor configured to perform a multiply operation on a digital signal, output from one of the plurality of analog-to-digital converters, and a digital reference signal corresponding to the reference voltage.

18. A method of operating an electronic device, the electronic device comprising a crossbar array including a plurality of row lines, a plurality of first column lines, a second column line, and a plurality of first memory cells coupled to the plurality of row lines and the plurality of first column lines, and a plurality of second memory cells coupled to the plurality of row lines and the second column line, the method comprising:

receiving a plurality of input voltages through the plurality of row lines;

generating a maximum output current based on a maximum conductance value, stored in each of the plurality of second memory cells, and the plurality of input voltages, the maximum conductance value corresponding to the largest one of a plurality of conductance values stored in a subset of the plurality of first memory cells, the subset corresponding to the respective second memory cell;

converting the maximum output current into a reference voltage;

determining, based on the reference voltage, a maximum value of an input range of an analog signal voltage, which is input to each of a plurality of analog-to-digital converters respectively coupled to the plurality of first column lines, such that a maximum magnitude of the analog signal voltage is mapped to the reference voltage;

generating a plurality of output currents based on the plurality of input voltages and the plurality of conductance values; and converting a plurality of analog signal voltages into a plurality of digital signals through the plurality of analog-to-digital converters, the plurality of analog signal voltages being generated from the plurality of output currents, wherein converting the plurality of analog signal voltages into the plurality of digital signals comprises:

determining a plurality of comparison voltages based on a plurality of values calculated from the reference voltage according to a resolution set in the plurality of analog-to-digital converters; and converting the plurality of analog signal voltages into the plurality of digital signals based on results of comparing each of the plurality of analog signal voltages with the plurality of comparison voltages.

19. The method according to claim 18, wherein the determining a maximum value of an input range of an analog signal voltage comprises buffering the analog signal voltage and providing a buffered analog signal voltage to each of the plurality of analog-to-digital converters.

20. The method according to claim 19, wherein the determining a maximum value of an input range of an analog signal voltage comprises:

determining the reference voltage to be the maximum value of the input range of the analog signal voltage.

21. The method according to claim 18, wherein the determining a maximum value of an input range of an analog signal voltage further comprises:

applying a gain corresponding to the reference voltage to the analog signal voltage.

22. The method according to claim 18, further comprising:

performing a multiply operation on each of the plurality of digital signals and a digital reference signal corresponding to the reference voltage.

* * * * *